(12) United States Patent
Ichikawa et al.

(10) Patent No.: US 8,546,059 B2
(45) Date of Patent: Oct. 1, 2013

(54) PHOTORESIST COMPOSITION

(75) Inventors: Koji Ichikawa, Toyonaka (JP);
Takayuki Miyagawa, Toyonaka (JP);
Mitsuhiro Hata, Delmar, NY (US)

(73) Assignee: Sumitomo Chemical Company, Limited, Tokyo (JP)

( * ) Notice: Subject to any disclaimer, the term of this patent is extended or adjusted under 35 U.S.C. 154(b) by 178 days.

(21) Appl. No.: 12/953,606

(22) Filed: Nov. 24, 2010

(65) Prior Publication Data

US 2011/0123926 A1 May 26, 2011

(30) Foreign Application Priority Data

Nov. 26, 2009 (JP) ................................ 2009-269036
Jan. 27, 2010 (JP) ................................ 2010-015145

(51) Int. Cl.
*G03F 7/039* (2006.01)
*G03F 7/20* (2006.01)
*G03F 7/30* (2006.01)
*G03F 7/38* (2006.01)

(52) U.S. Cl.
USPC ........ 430/270.1; 430/925; 430/921; 430/326; 430/311; 430/330

(58) Field of Classification Search
None
See application file for complete search history.

(56) References Cited

U.S. PATENT DOCUMENTS

| | | |
|---|---|---|
| 2003/0017415 A1 | 1/2003 | Kodama et al. |
| 2004/0242867 A1 | 12/2004 | Baudin et al. |
| 2006/0194982 A1 | 8/2006 | Harada et al. |
| 2007/0249484 A1* | 10/2007 | Benkhoff et al. .................. 502/5 |
| 2010/0233621 A1* | 9/2010 | Yamamoto et al. ........ 430/281.1 |

FOREIGN PATENT DOCUMENTS

JP 2009-126974 * 6/2009

OTHER PUBLICATIONS

DERWENT English abstract for JP2009-126974 (2009).*
Machine-assisted English translation of JP2009-126974 (2009).*

* cited by examiner

*Primary Examiner* — Sin J. Lee
(74) *Attorney, Agent, or Firm* — Birch, Stewart, Kolasch & Birch, LLP

(57) ABSTRACT

The present invention provides a photoresist composition comprising a resin, an acid generator and a compound represented by the formula (C1):

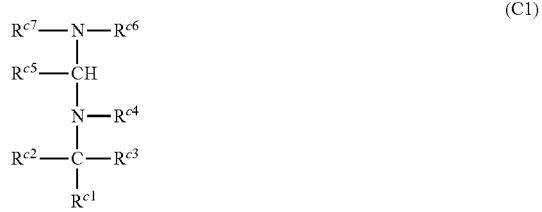

(C1)

wherein $R^{c1}$ represents an aromatic group which can have one or more substituents, $R^{c2}$ and $R^{c3}$ independently each represent a hydrogen atom, an aliphatic hydrocarbon group which can have one or more substituents or an aromatic group which can have one or more substituents, $R^{c4}$ and $R^{c6}$ independently each represent a hydrogen atom or an aliphatic hydrocarbon group which can have one or more substituents, or $R^{c4}$ and $R^{c6}$ are bonded each other to form an alkanediyl group, $R^{c5}$ represents an aliphatic hydrocarbon group which can have one or more substituents or an amino group which can have one or two substituents, $R^{c7}$ represents a hydrogen atom or an aliphatic hydrocarbon group which can have one or more substituents, or $R^{c5}$ and $R^{c7}$ are bonded each other to form an alkanediyl group.

10 Claims, No Drawings

PHOTORESIST COMPOSITION

This nonprovisional application claims priority under 35 U.S.C. §119(a) on Patent Application No. 2009-269036 filed in JAPAN on Nov. 26, 2009 and on Patent Application No. 2010-015145 filed in JAPAN on Jan. 27, 2010, the entire contents of which are hereby incorporated by reference.

FIELD OF THE INVENTION

The present invention relates to a photoresist composition.

BACKGROUND OF THE INVENTION

A photoresist composition is used for semiconductor microfabrication employing a lithography process.

A photoresist composition usually comprises an acid generator. In the photoresist composition, a performance deterioration caused by inactivation of acid which occurs due to post exposure delay can be diminished by adding a quencher.

US 2006/0194982 A1 discloses a photoresist composition comprising 2,6-diisopropylaniline as a quencher.

US 2003/0017415 A1 discloses a photoresist composition comprising 1,5-diazabicyclo[4.3.0]non-5-ene or 2,6-diisopropylaniline as a quencher.

SUMMARY OF THE INVENTION

The present invention is to provide a photoresist composition.

The present invention relates to the followings:

<1> A photoresist composition comprising a resin, an acid generator and a compound represented by the formula (C1):

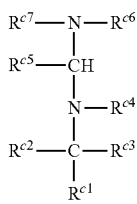
(C1)

wherein $R^{c1}$ represents an aromatic group which can have one or more substituents, $R^{c2}$ and $R^{c3}$ independently each represent a hydrogen atom, an aliphatic hydrocarbon group which can have one or more substituents or an aromatic group which can have one or more substituents, $R^{c4}$ and $R^{c6}$ independently each represent a hydrogen atom or an aliphatic hydrocarbon group which can have one or more substituents, or $R^{c4}$ and $R^{c6}$ are bonded each other to form an alkanediyl group, $R^{c5}$ represents an aliphatic hydrocarbon group which can have one or more substituents or an amino group which can have one or two substituents, $R^{c7}$ represents a hydrogen atom or an aliphatic hydrocarbon group which can have one or more substituents, or $R^{c5}$ and $R^{c7}$ are bonded each other to form an alkanediyl group;

<2> The photoresist composition according to <1>, wherein the compound (C1) is a compound represented by the formula (C1-1):

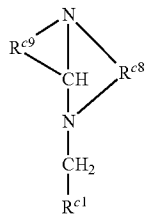
(C1-1)

wherein $R^{c1}$ is the same as defined in <1>, and $R^{c8}$ and $R^{c9}$ independently each represent a C1-C18 alkanediyl group which can have one or more substituents;

<3> The photoresist composition according to <2>, wherein the compound represented by the formula (C1-1) is a compound represented by the formula (C1-1-1) or (C1-1-2):

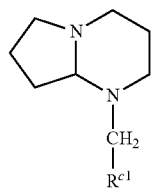
(C1-1-1)

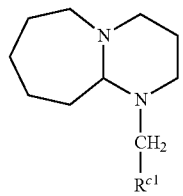
(C1-1-2)

wherein $R^{c1}$ is the same as defined in <1>;

<4> The photoresist composition according to any one of <1> to <3>, wherein the content of the compound represented by the formula (C1) in the photoresist composition is 0.01 to 5 parts by weight per 100 parts by weight of the resin;

<5> The photoresist composition according to any one of <1> to <4>, wherein the acid generator is an acid generator containing one or more fluorine atoms;

<6> The photoresist composition according to any one of <1> to <5>, wherein the acid generator is a salt represented by the formula (B1):

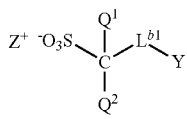
(B1)

wherein $Q^1$ and $Q^2$ each independently represent a fluorine atom or a C1-C6 perfluoroalkyl group, $L^{b1}$ represents a single bond or a C1-C17 divalent saturated hydrocarbon group in which one or more $—CH_2—$ can be replaced by $—O—$ or $—CO—$, Y represents a C1-C18 aliphatic hydrocarbon group which can have one or more substituents, or a C3-C18 saturated cyclic hydrocarbon group which can have one or more substituents, and one or more $—CH_2—$ in the aliphatic hydrocarbon group and the saturated cyclic hydrocarbon group can be replaced by $—O—$, $—CO—$ or $—SO_2—$, and $Z^+$ represents an organic cation;

<7> The photoresist composition according to <6>, wherein Z+ is a triarylsulfonium cation;

<8> The photoresist composition according to <6> or <7>, wherein Y is an adamantyl group which can have one or more substituents or an oxoadamantyl group which can have one or more substituents;

<9> The photoresist composition according to any one of <1> to <8>, wherein the content of the acid generator is 1 to 20 parts by weight per 100 parts by weight of the resin in the photoresist composition;

<10> The photoresist composition according to any one of <1> to <9>, wherein the resin becomes soluble in an alkali aqueous solution by the action of an acid;

<11> The photoresist composition according to any one of <1> to <10> which further contains 2,6-diisopropylaniline;

<12> A process for producing a photoresist pattern comprising the following steps (1) to (5):

(1) a step of applying the photoresist composition according to any one of <1> to <11> on a substrate, (2) a step of forming a photoresist film by conducting drying, (3) a step of exposing the photoresist film to radiation, (4) a step of baking the exposed photoresist film, and (5) a step of developing the baked photoresist film with an alkaline developer, thereby forming a photoresist pattern.

DESCRIPTION OF PREFERRED EMBODIMENTS

The photoresist composition of the present invention comprises a resin, an acid generator and a compound represented by the formula (C1):

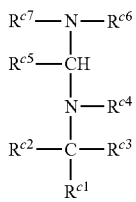

wherein $R^{c1}$ represents an aromatic group which can have one or more substituents, $R^{c2}$ and $R^{c3}$ independently each represent a hydrogen atom, an aliphatic hydrocarbon group which can have one or more substituents or an aromatic group which can have one or more substituents, $R^{c4}$ and $R^{c6}$ independently each represent a hydrogen atom or an aliphatic hydrocarbon group which can have one or more substituents, or $R^{c4}$ and $R^{c6}$ are bonded each other to form an alkanediyl group, $R^{c5}$ represents an aliphatic hydrocarbon group which can have one or more substituents or an amino group which can have one or two substituents, $R^{c7}$ represents a hydrogen atom or an aliphatic hydrocarbon group which can have one or more substituents, or $R^{c5}$ and $R^{c7}$ are bonded each other to form an alkanediyl group (hereinafter, simply referred to as Compound (C1)).

First, the resin will be illustrated.

The resin becomes soluble in an alkali aqueous solution by the action of an acid. The resin is insoluble or poorly soluble in an alkali aqueous solution, and has a structural unit derived from a monomer having an acid-labile group. The resin can be produced by polymerizing one or more monomers having an acid-labile group.

In this specification, "an acid-labile group" means a group capable of being eliminated by the action of an acid.

Examples of the acid-labile group include a group represented by the formula (1):

wherein $R^{a1}$, $R^{a2}$ and $R^{a3}$ independently each represent an aliphatic hydrocarbon group or a saturated cyclic hydrocarbon group, and $R^{a1}$ and $R^{a2}$ can be bonded each other to form a ring together with a carbon atom to which $R^{a1}$ and $R^{a2}$ are bonded.

Examples of the aliphatic hydrocarbon group include a C1-C8 alkyl group. Specific examples of the C1-C8 alkyl group include a methyl group, an ethyl group, a propyl group, an isopropyl group, a butyl group, a pentyl group, a hexyl group, a heptyl group and an octyl group. The saturated cyclic hydrocarbon group may be monocyclic or polycyclic, and preferably has 3 to 20 carbon atoms. Examples of the saturated cyclic hydrocarbon group include a monocyclic alicyclic hydrocarbon group such as a C3-C20 cycloalkyl group (e.g. a cyclopentyl group, a cyclohexyl group, a methylcyclohexyl group, a dimethylcyclohexyl group, a cycloheptyl group and a cyclooctyl group) and a polycyclic alicyclic hydrocarbon group such as a decahydronaphthyl group, an adamantyl group, a norbornyl group, a methylnorbornyl group, and the followings:

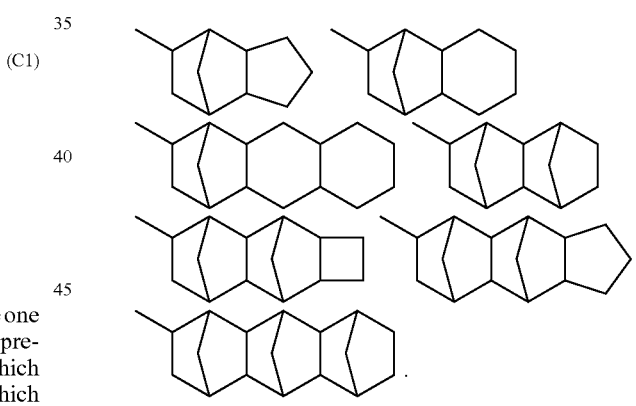

Examples of the ring formed by bonding $R^{a1}$ and $R^{a2}$ each other include the following groups and the ring preferably has 5 to 20 carbon atoms.

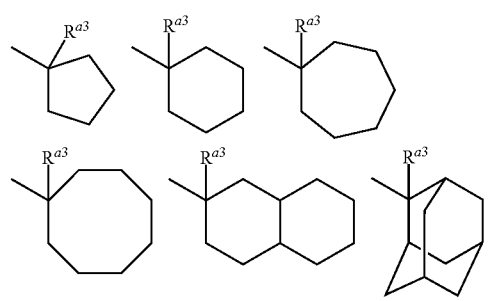

-continued

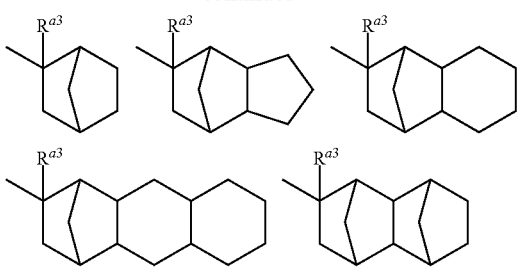
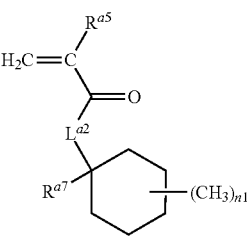
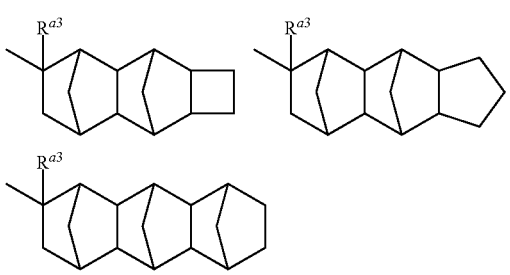

wherein $R^{a3}$ is the same as defined above.

The group represented by the formula (1) wherein $R^{a1}$, $R^{a2}$ and $R^{a3}$ independently each represent a C1-C8 alkyl group such as a tert-butyl group, the group represented by the formula (1) wherein $R^{a1}$ and $R^{a2}$ are bonded each other to form an adamantyl ring and $R^{a3}$ is a C1-C8 alkyl group such as a 2-alkyl-2-adamantyl group, and the group represented by the formula (1) wherein $R^{a1}$ and $R^{a2}$ are C1-C8 alkyl groups and $R^{a3}$ is an adamantyl group such as a 1-(1-adamantyl)-1-alkylalkoxycarbonyl group are preferable.

The monomer having an acid-labile group is preferably an acrylate monomer having an acid-labile group in its side chain or a methacryalte monomer having an acid-labile group in its side chain. In this specification, "(meth)acrylate monomer" means a monomer having a structure represented by $CH_2=CH—CO—$ or $CH_2=C(CH_3)—CO—$, and "acrylate monomer" means a monomer having a structure represented by $CH_2=CH—CO—$, and "methacrylate monomer" means a monomer having a structure represented by $CH_2=C(CH_3)—CO—$.

Preferable examples of the monomer having an acid-labile group include (meth)acrylate monomers having C5-C20 saturated cyclic hydrocarbon group. As (meth)acrylate monomers having C5-C20 saturated cyclic hydrocarbon group, preferred are monomers represented by the formulae (a1-1) and (a1-2):

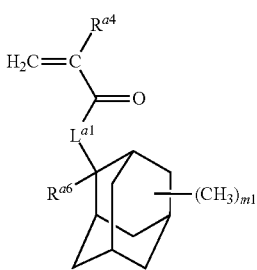

(a1-2)

wherein $R^{a4}$ and $R^{as}$ each independently represents a hydrogen atom or a methyl group, $R^{a6}$ and $R^{a7}$ each independently represents a C1-C8 aliphatic hydrocarbon group or a C3-C10 saturated cyclic hydrocarbon group, $L^{a1}$ and $L^{a2}$ each independently represents *—O— or *—O—$(CH_2)_{k1}$—CO—O— in which * represents a binding position to —CO—, and k1 represents an integer of 1 to 7, m1 represents an integer of 0 to 14 and n1 represents an integer of 0 to 10.

The aliphatic hydrocarbon group preferably has 1 to 6 carbon atoms, and the saturated cyclic hydrocarbon group preferably has 3 to 8 carbon atoms and more preferably 3 to 6 carbon atoms.

Examples of the aliphatic hydrocarbon group include a C1-C8 alkyl group such as a methyl group, an ethyl group, a propyl group, an isopropyl group, a butyl group, a tert-butyl group, a 2,2-dimethylethyl group, a 1-methylpropyl group, a 2,2-dimethylpropyl group, a 1-ethylpropyl group, a 1-methylbutyl group, a 2-methylbutyl group, a 3-methylbutyl group, a 1-propylbutyl group, a pentyl group, a 1-methylpentyl group, a hexyl group, a 1,4-dimethylhexyl group, a heptyl group, a 1-methylheptyl group and an octyl group. Examples of the saturated cyclic hydrocarbon group include a cyclohexyl group, a methylcyclohexyl group, a dimethylcyclohexyl group, a cycloheptyl group, a methylcycloheptyl group, a norbornyl group and a methylnorbornyl group.

$L^{a1}$ is preferably *—O— or *—O—$(CH_2)_{f1}$—CO—O— in which * represents a binding position to —CO—, and f1 represents an integer of 1 to 4, and is more preferably *—O— or *—O—$CH_2$—CO—O—, and is especially preferably *—O—. $L^{a2}$ is preferably *—O— or *—O—$(CH_2)_{f1}$—CO—O— in which * represents a binding position to —CO—, and f1 is the same as defined above, and is more preferably *—O— or *—O—$CH_2$—CO—O—, and is especially preferably *—O—.

In the formula (a1-1), m1 is preferably an integer of 0 to 3, and is more preferably 0 or 1. In the formula (a1-2), n1 is preferably an integer of 0 to 3, and is more preferably 0 or 1.

Particularly when the photoresist composition contains a resin derived from a monomer having a bulky structure such as a saturated cyclic hydrocarbon group, the photoresist composition having excellent resolution tends to be obtained.

Examples of the monomer represented by the formula (a1-1) include the followings.

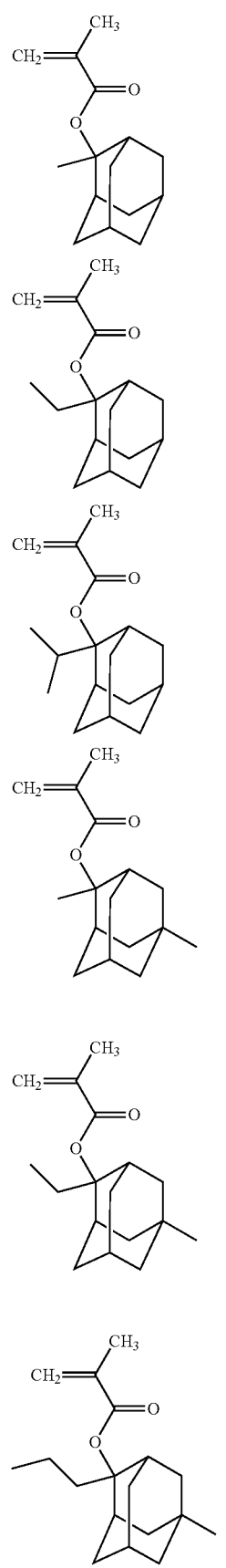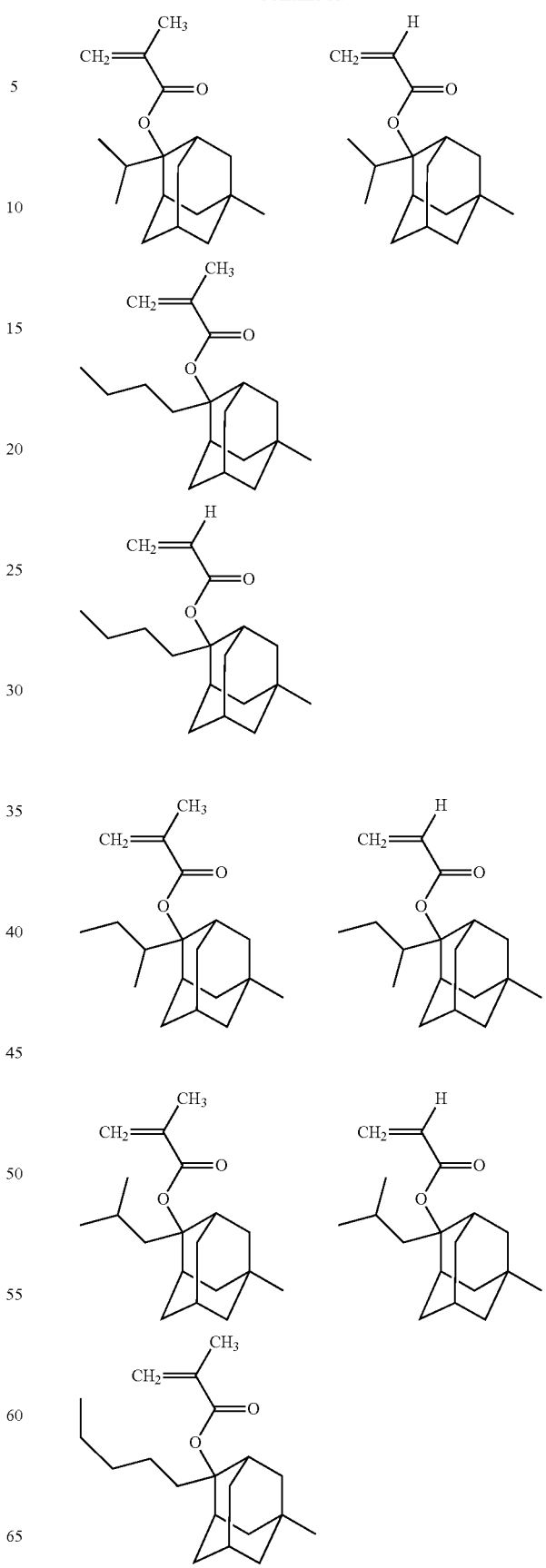

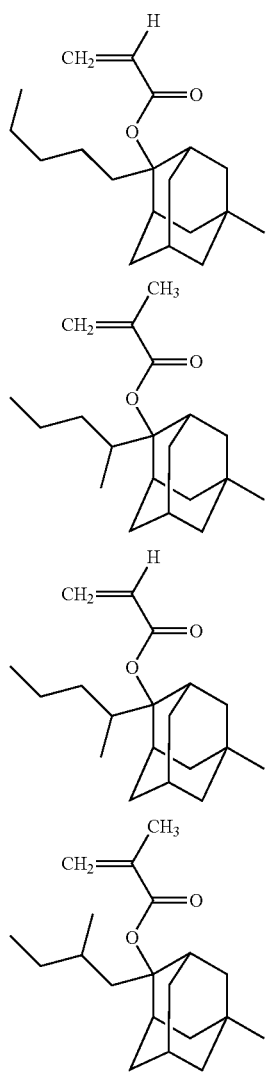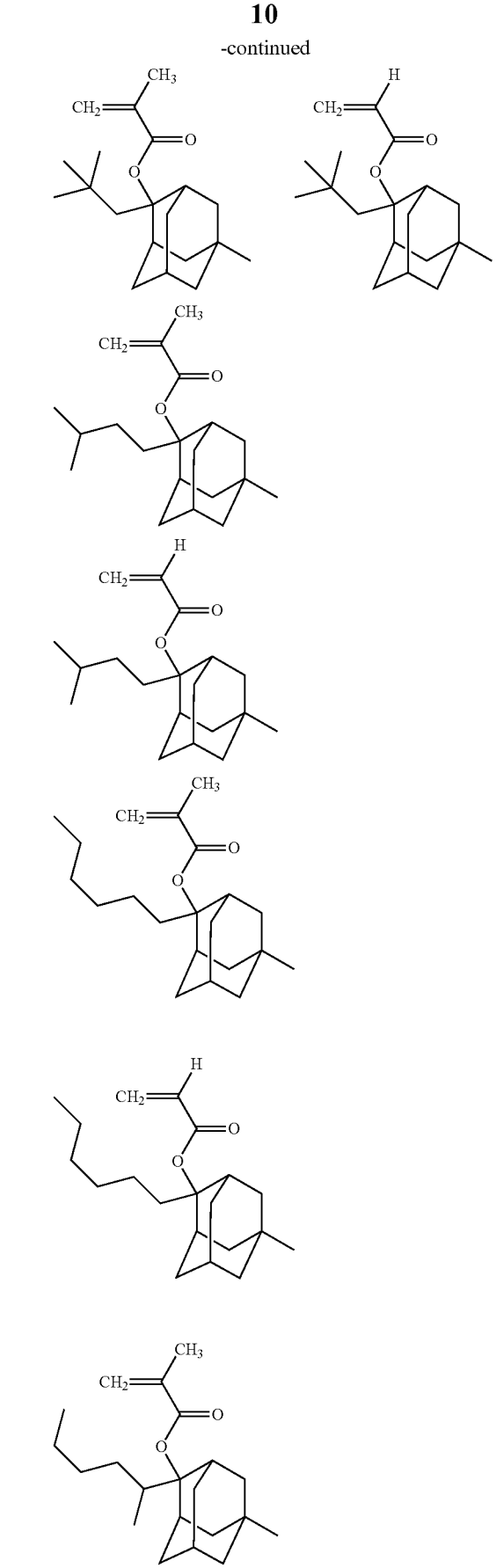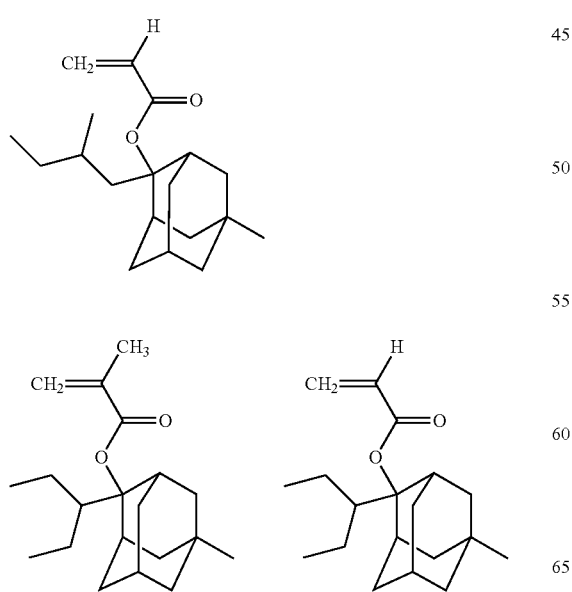

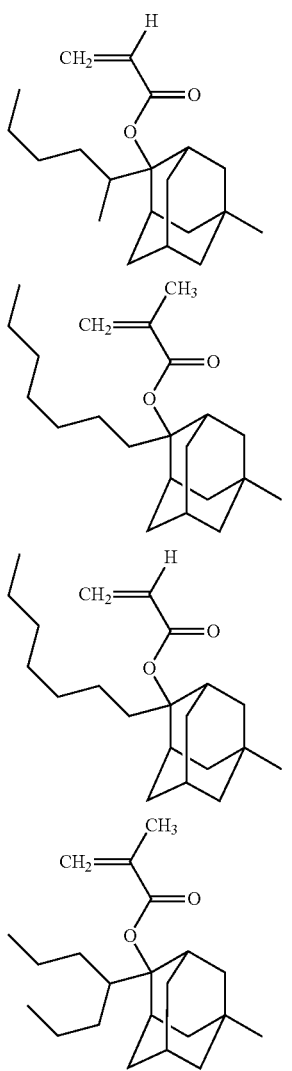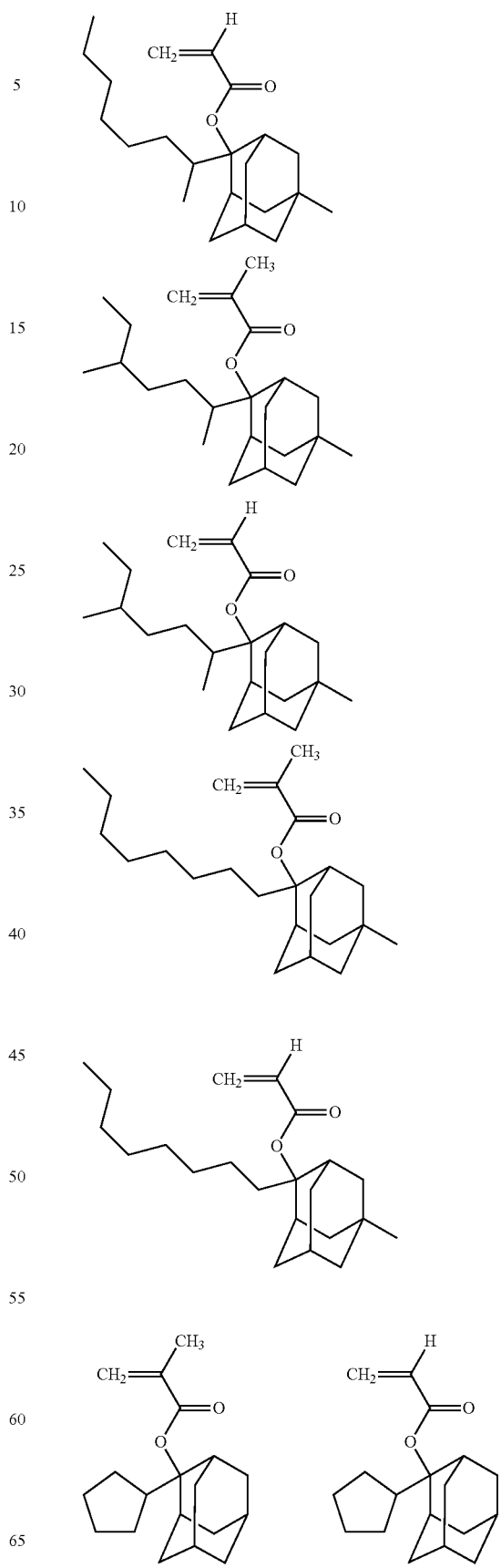

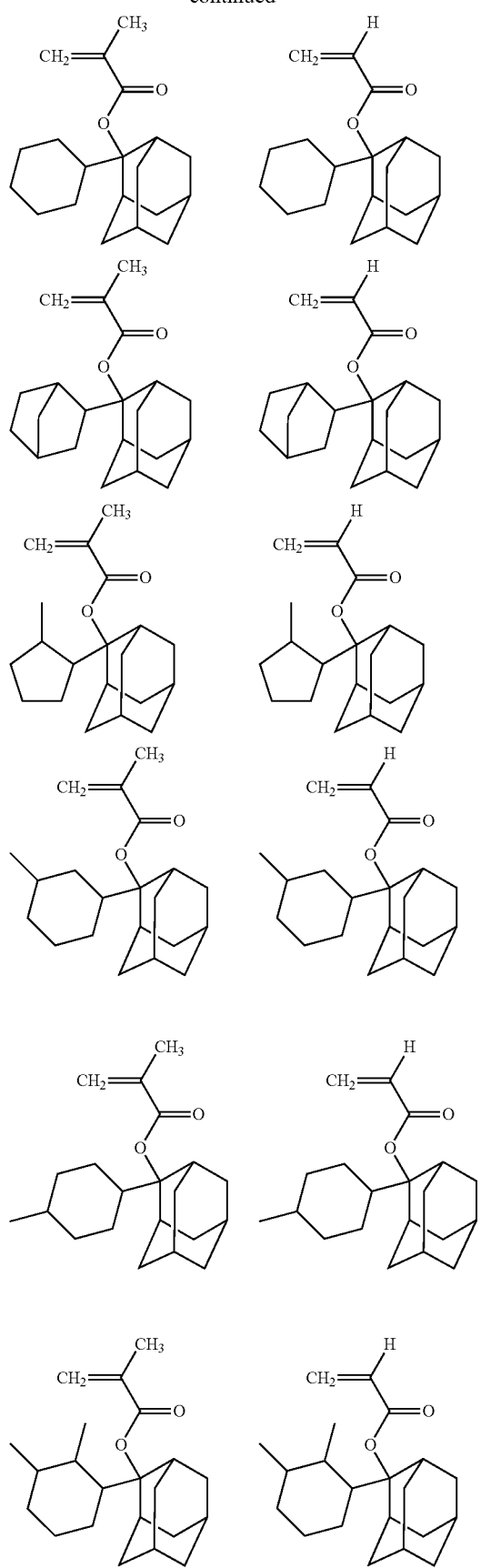
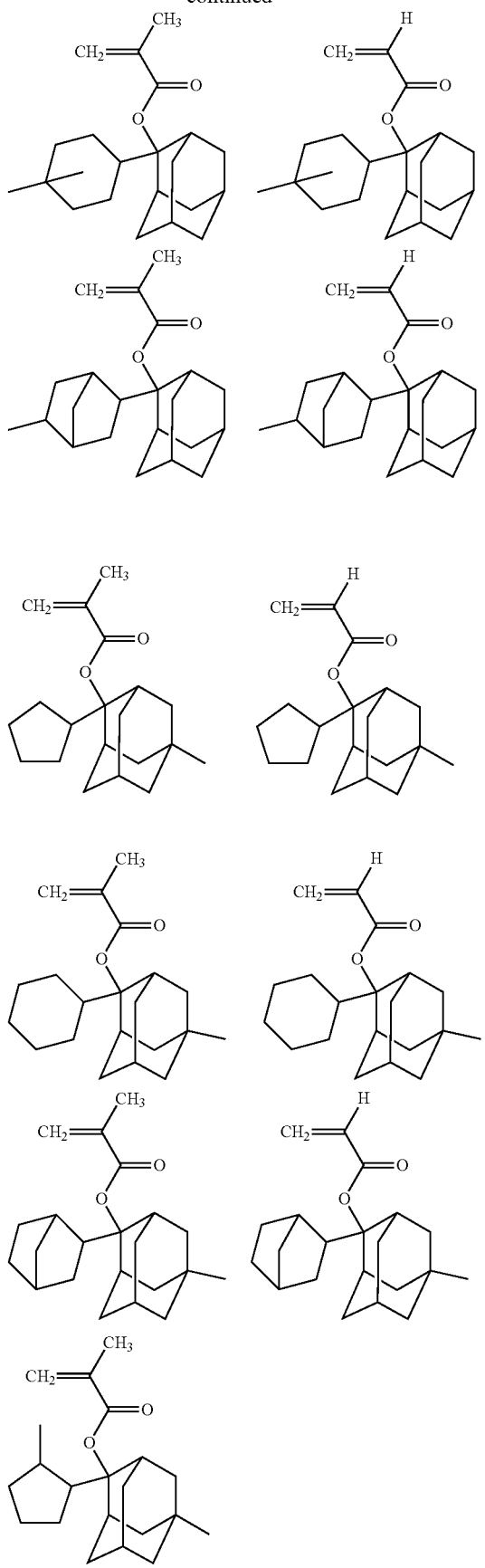

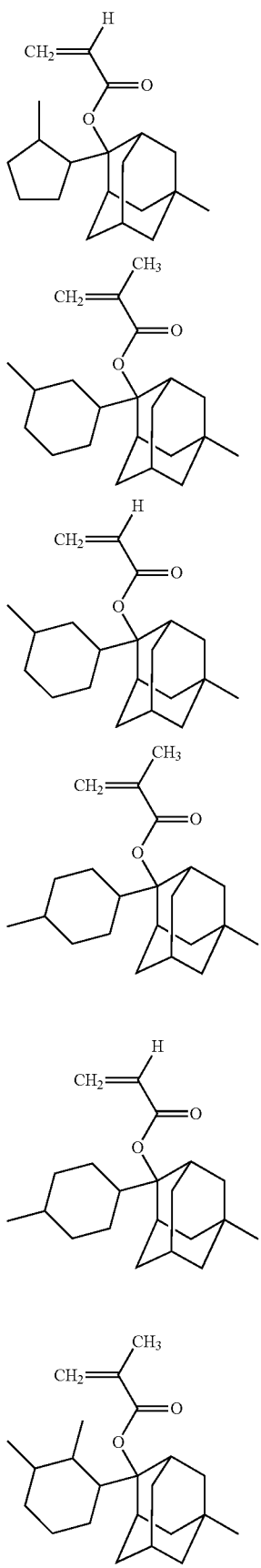
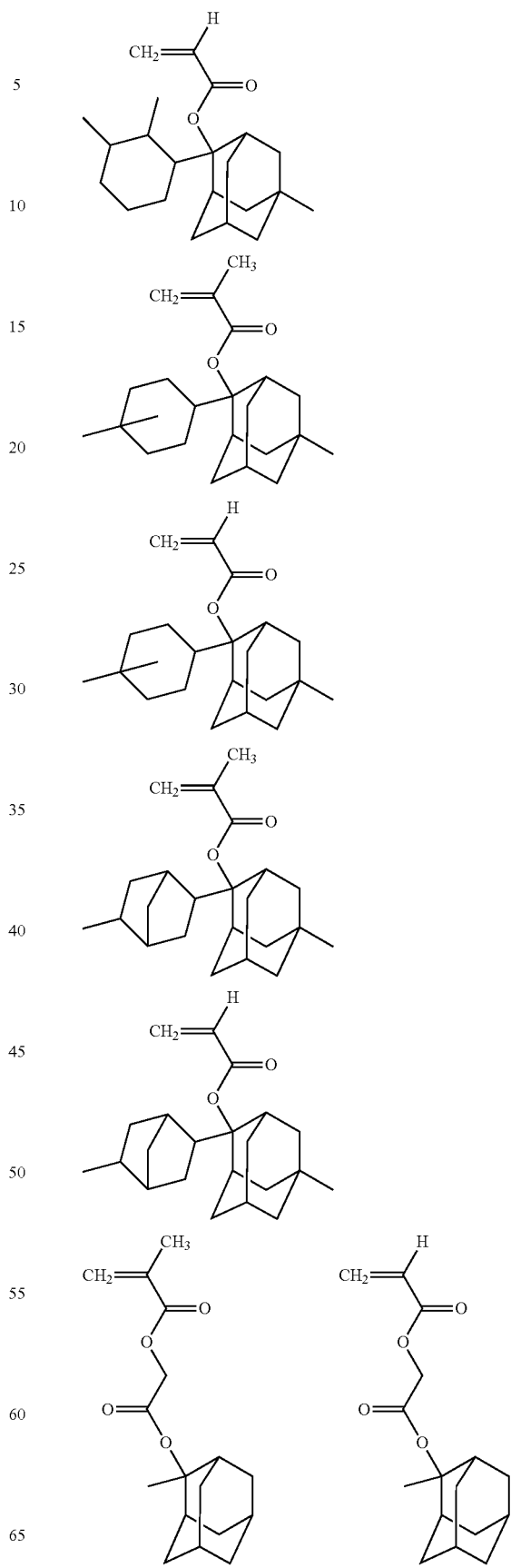

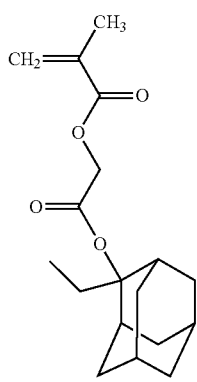 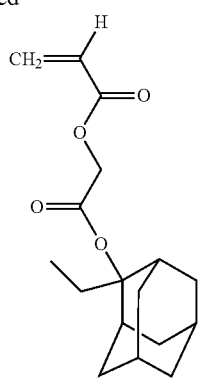 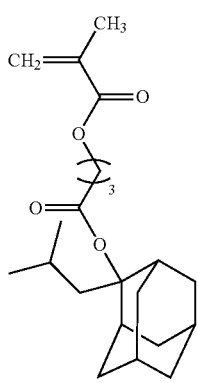 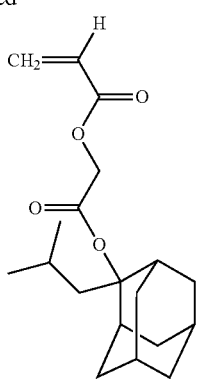
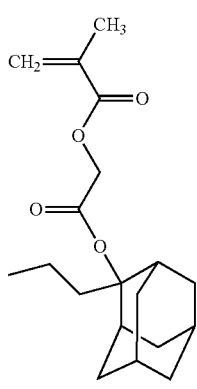 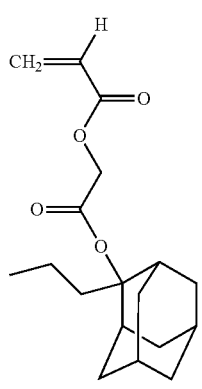 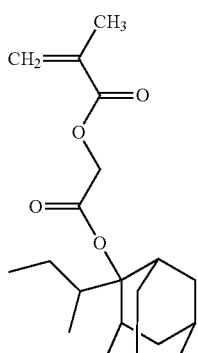 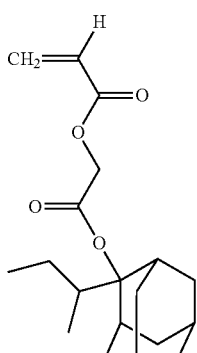
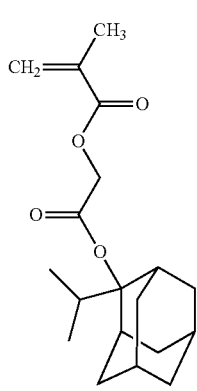 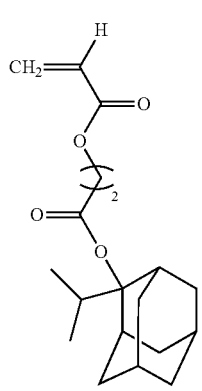 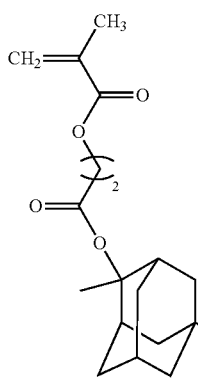 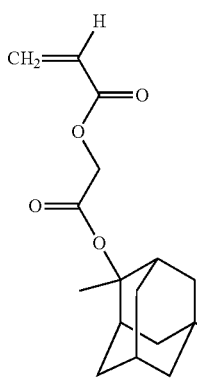
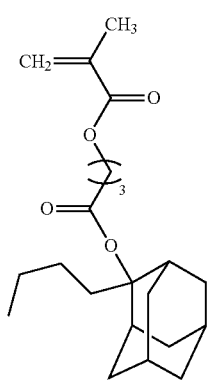 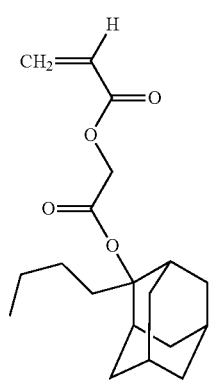 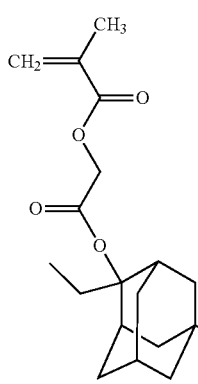 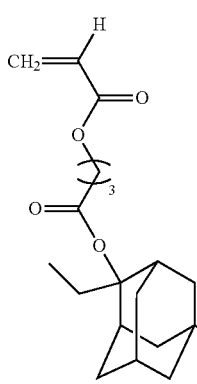

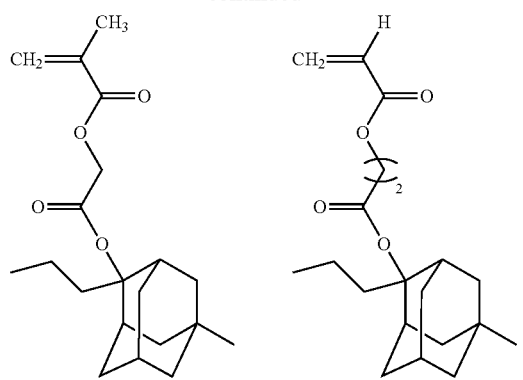
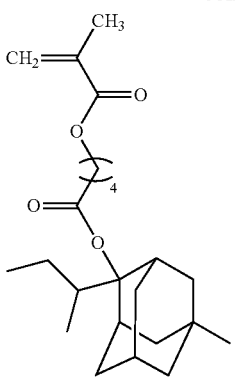
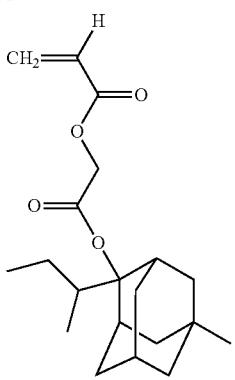
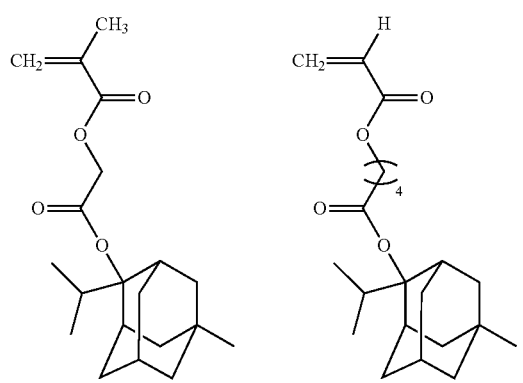
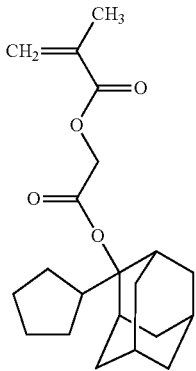
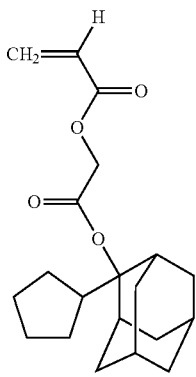
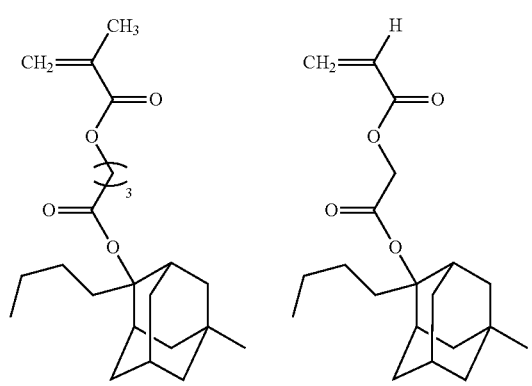
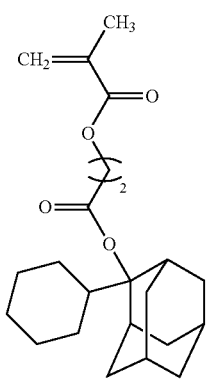
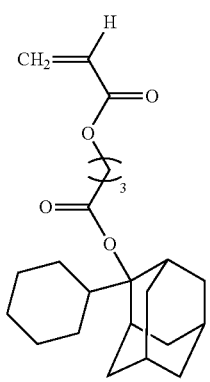
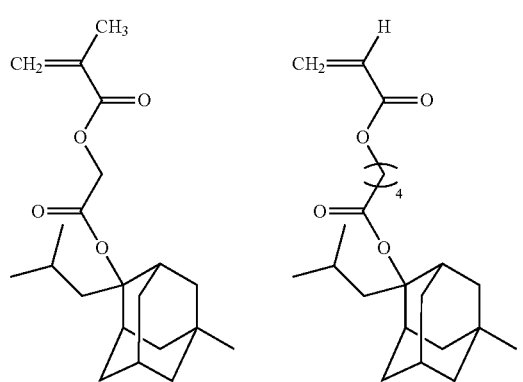
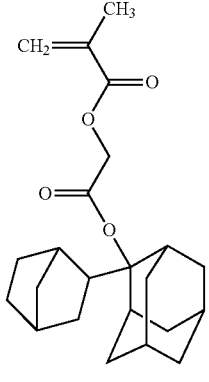
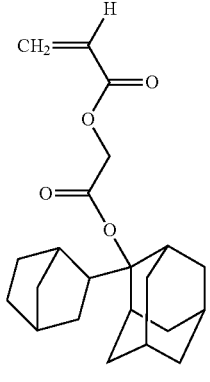

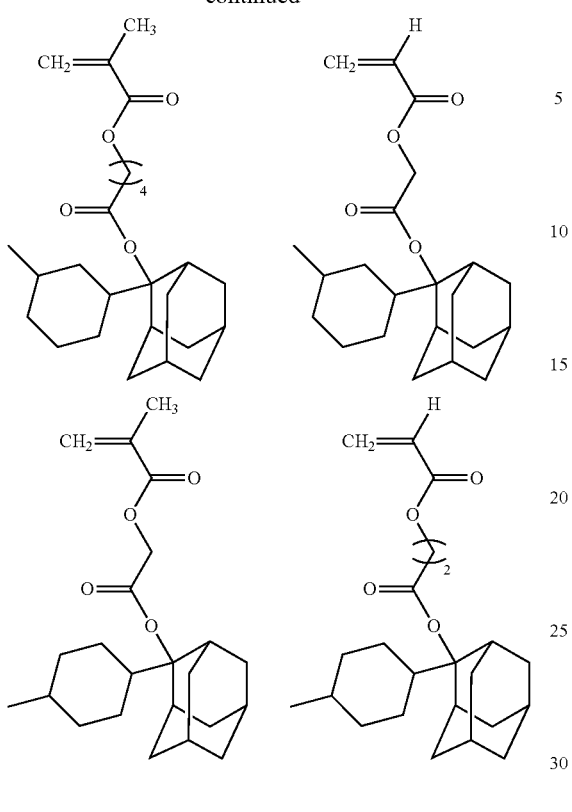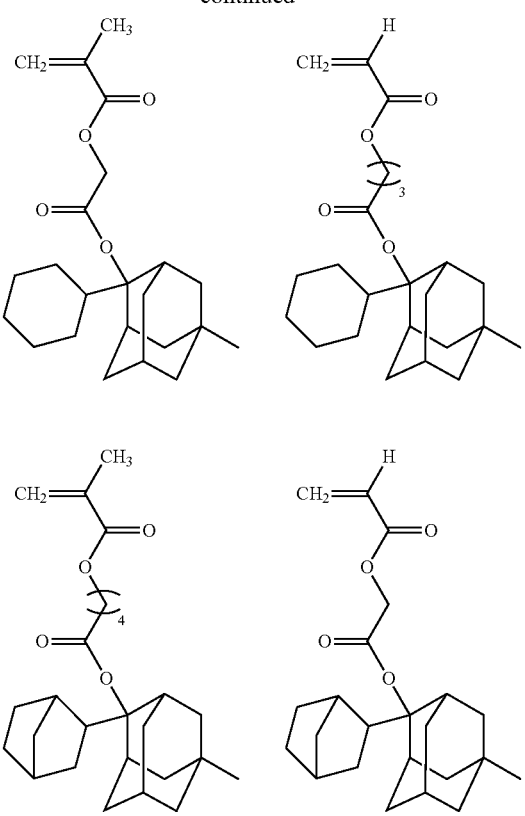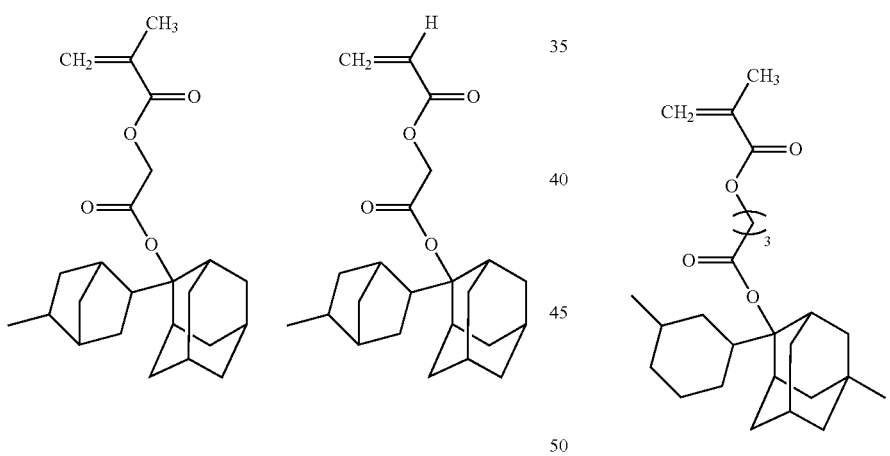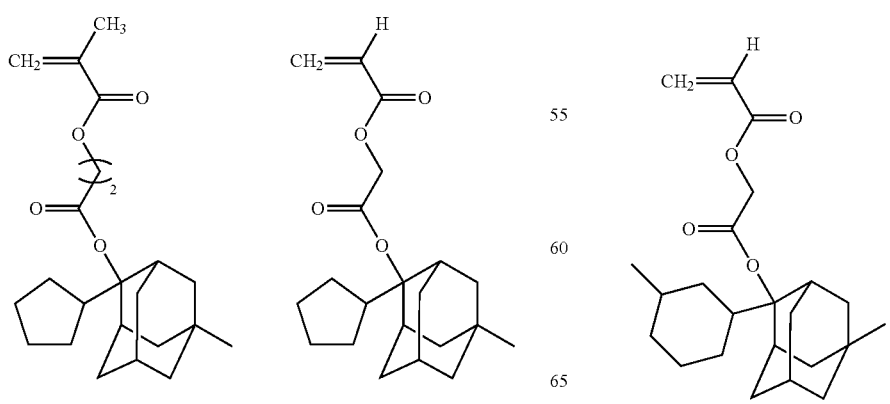

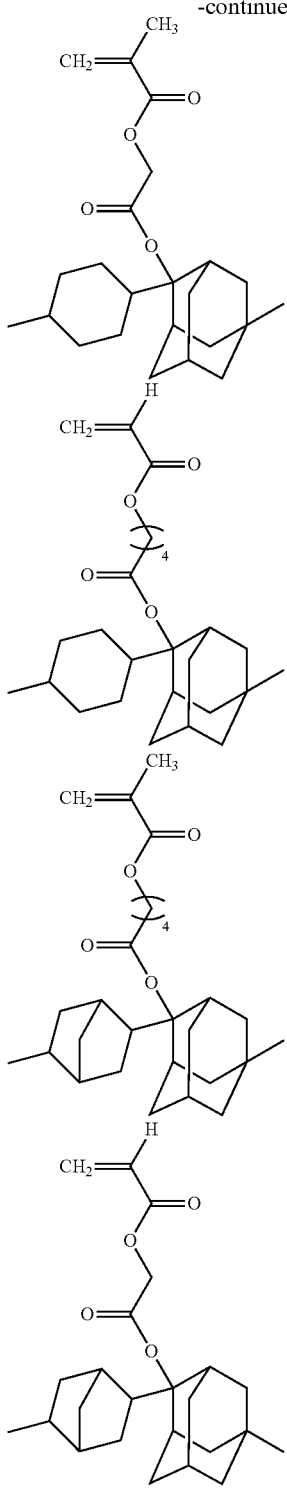

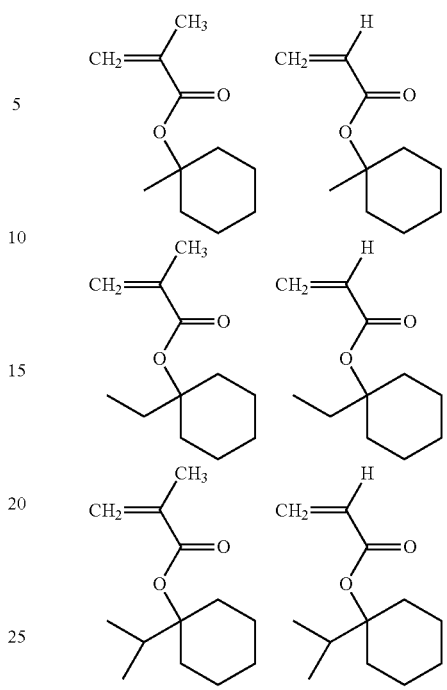

Among them, preferred are 2-methyl-2-adamantyl acrylate, 2-methyl-2-adamantyl methacrylate, 2-ethyl-2-adamantyl acrylate, 2-ethyl-2-adamantyl methacrylate, 2-isopropyl-2-adamantyl acrylate and 2-isopropyl-2-adamantyl methacrylate, and more preferred are 2-methyl-2-adamantyl methacrylate, 2-ethyl-2-adamantyl methacrylate, and 2-isopropyl-2-adamantyl methacrylate.

Examples of the monomer represented by the formula (a1-2) include the followings.

Among them, preferred are 1-ethyl-1-cyclohexyl acrylate and 1-ethyl-1-cyclohexyl methacrylate, and more preferred is 1-ethyl-1-cyclohexyl methacrylate.

The content of the structural unit derived from a monomer having an acid-labile group in the resin is usually 10 to 95% by mole, preferably 15 to 90% by mole and more preferably 20 to 85% by mole based on 100% by mole of all the structural units of the resin.

Other examples of the monomer having an acid-labile group include a monomer represented by the formula (a1-3):

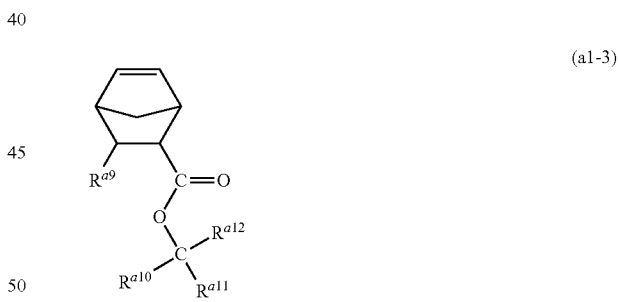

(a1-3)

wherein $R^{a9}$ represents a hydrogen atom, a C1-C3 aliphatic hydrocarbon group which can have one or more substituents, a carboxyl group, a cyano group or a —COOR$^{a13}$ group in which $R^{a13}$ represents a C1-C8 aliphatic hydrocarbon group or a C3-C8 saturated cyclic hydrocarbon group, and the C1-C8 aliphatic hydrocarbon group and the C3-C8 saturated cyclic hydrocarbon group can have one or more hydroxyl groups, and one or more —CH$_2$— in the C1-C8 aliphatic hydrocarbon group and the C3-C8 saturated cyclic hydrocarbon group can be replaced by —O— or —CO—, $R^{a10}$, $R^{a11}$ and $R^{a12}$ each independently represent a C1-C12 aliphatic hydrocarbon group or a C3-C12 saturated cyclic hydrocarbon group, and $R^{a10}$ and $R^{a11}$ can be bonded each other to form a ring together with the carbon atom to which $R^{a10}$ and $R^{a11}$ are bonded, and the C1-C12 aliphatic hydrocarbon group and the C3-C12 saturated cyclic hydrocarbon group can have one or more hydroxyl groups, and one or more —CH$_2$— in the C1-C12 aliphatic hydrocarbon group and the C3-C12 saturated cyclic hydrocarbon group can be replaced by —O— or —CO—.

Examples of the substituent include a hydroxyl group. Examples of the C1-C3 aliphatic hydrocarbon group which can have one or more substituents include a methyl group, an ethyl group, a propyl group, a hydroxymethyl group and a 2-hydroxyethyl group. Examples of $R^{a13}$ include a methyl group, an ethyl group, a propyl group, a 2-oxo-oxolan-3-yl group and a 2-oxo-oxolan-4-yl group. Examples of $R^{a10}$, $R^{a11}$ and $R^{a12}$ include a methyl group, an ethyl group, a cyclohexyl group, a methylcyclohexyl group, a hydroxycyclohexyl group, an oxocyclohexyl group and an adamantyl group, and examples of the ring formed by bonding $R^{a10}$ and $R^{a11}$ each other together with the carbon atom to which $R^{a10}$ and $R^{a11}$ are bonded include a cyclohexane ring and an adamantane ring.

Examples of the monomer represented by the formula (a1-3) include tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl) ethyl 5-norbornene-2-carboxylate and 1-(1-adamantyl)-1-methylethyl 5-norbornene-2-carboxylate.

When the resin has a structural unit derived from the monomer represented by the formula (a1-3), the photoresist composition having excellent resolution and higher dry-etching resistance tends to be obtained.

When the resin contains the structural unit derived form the monomer represented by the formula (a1-3), the content of the structural unit derived from the monomer represented by the formula (a1-3) is usually 10 to 95% by mole and preferably 15 to 90% by mole and more preferably 20 to 85% by mole based on total molar of all the structural units of the resin.

Other examples of the monomer having an acid-labile group include a monomer represented by the formula (a1-4):

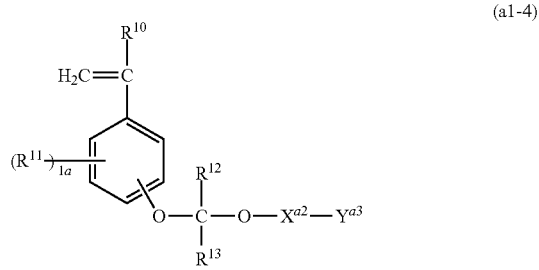

(a1-4)

wherein $R^{10}$ represents a hydrogen atom, a halogen atom, a C1-C6 alkyl group or a C1-C6 halogenated alkyl group, $R^{11}$ is independently in each occurrence a halogen atom, a hydroxyl group, a C1-C6 alkyl group, a C1-C6 alkoxy group, a C2-C4 acyl group, a C2-C4 acyloxy group, an acryloyl group or a methacryloyl group, 1a represents an integer of 0 to 4, $R^{12}$ and $R^{13}$ each independently represent a hydrogen atom or a C1-C12 hydrocarbon group, $X^{a2}$ represents a single bond or a C1-C17 divalent saturated hydrocarbon group in which one or more —CH$_2$— can be replaced by —O—, —CO—, —S—, —SO$_2$— or —N($R^c$)— wherein $R^c$ represents a hydrogen atom or a C1-C6 alkyl group, and which can have one or more substituents, and $Y^{a3}$ represents a C1-C12 aliphatic hydrocarbon group, a C3-C18 saturated cyclic hydrocarbon group or a C6-C18 aromatic hydrocarbon group, and the C1-C12 aliphatic hydrocarbon group, the C2-C18 saturated cyclic hydrocarbon group and the C6-C18 aromatic hydrocarbon group can have one or more substituents.

Examples of the halogen atom include a fluorine atom.

Examples of the C1-C6 alkyl group include a methyl group, an ethyl group, a propyl group, an isopropyl group, a butyl group, an isobutyl group, a sec-butyl group, a tert-butyl group, a pentyl group and a hexyl group, and a C1-C4 alkyl group is preferable and a C1-C2 alkyl group is more preferable and a methyl group is especially preferable.

Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group and a perfluorohexyl group.

Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferable and a C1-C2 alkoxy group is more preferable and a methoxy group is especially preferable.

Examples of the C2-C4 acyl group include an acetyl group, a propionyl group and a butyryl group, and examples of the C2-C4 acyloxy group include an acetyloxy group, a propionyloxy group and a butyryloxy group.

Examples of the C1-C12 hydrocarbon group include a C1-C12 aliphatic hydrocarbon group such as a methyl group, an ethyl group, a propyl group, an isopropyl group, a butyl group, an isobutyl group, a sec-butyl group, a tert-butyl group, a pentyl group, a hexyl group, a heptyl group, an octyl group, a 2-ethylhexyl group, a nonyl group, a decyl group, an undecyl group and a dodecyl group, and a C3-C12 saturated cyclic hydrocarbon group such as a cyclohexyl group, an adamantyl group, a 2-alkyl-2-adamantyl group, a 1-(1-adamantyl)-1-alkyl group and an isobornyl group.

Examples of the C1-C17 divalent saturated hydrocarbon group include a C1-C17 alkanediyl group such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group, and a cyclohexane-1,4-diyl group. Examples of the substituents of the C1-C17 divalent saturated hydrocarbon group include a halogen atom such as a fluorine atom, and a hydroxyl group. Examples of the substituted C1-C17 divalent saturated hydrocarbon group include the followings.

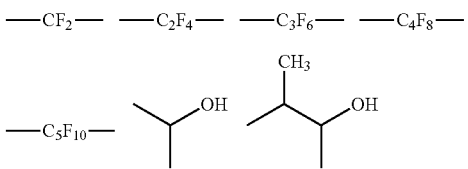

-continued

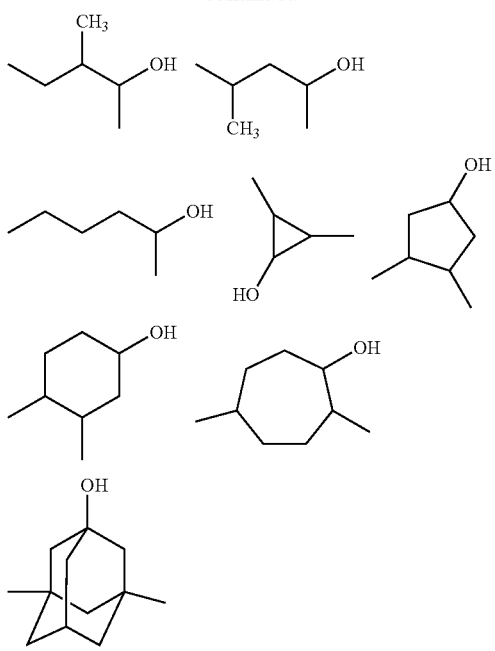

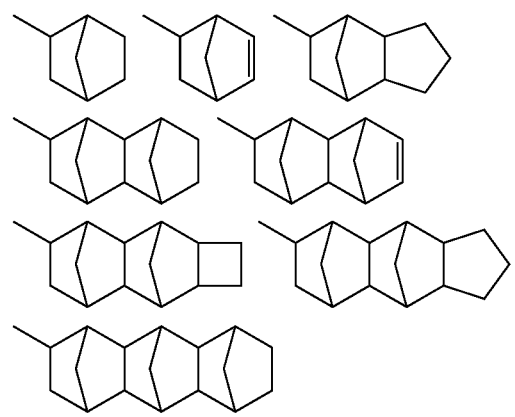

Examples of the C6-C18 aromatic hydrocarbon group include a phenyl group, a naphthyl group, an anthryl group, a p-methylphenyl group, a p-tert-butylphenyl group and a p-adamantylphenyl group.

Examples of the monomer represented by the formula (a1-4) include the followings.

Examples of the C1-C17 divalent saturated hydrocarbon group in which one or more —$CH_2$— are replaced by —O—, —CO—, —S—, —$SO_2$— or —N($R^c$)— include the followings.

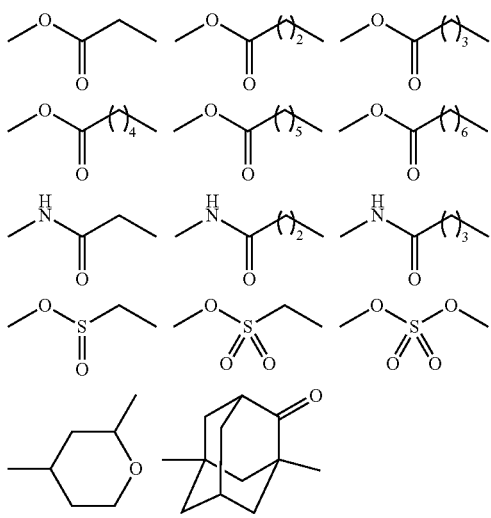

Examples of the C1-C12 aliphatic hydrocarbon group include a methyl group, an ethyl group, a propyl group, an isopropyl group, a butyl group, an isobutyl group, a sec-butyl group, a tert-butyl group, a pentyl group, a hexyl group, a heptyl group, an octyl group, a 2-ethylhexyl group, a nonyl group, a decyl group, an undecyl group and a dodecyl group. Examples of the C3-C18 saturated cyclic hydrocarbon group include a cyclopropyl group, a cyclobutyl group, a cyclopentyl group, a cyclohexyl group, a cycloheptyl group, a cyclooctyl group, a cyclononyl group, a cyclodecyl group, a norbornyl group, a 1-adamantyl group, a 2-adamantyl group, an isobornyl group and the following groups.

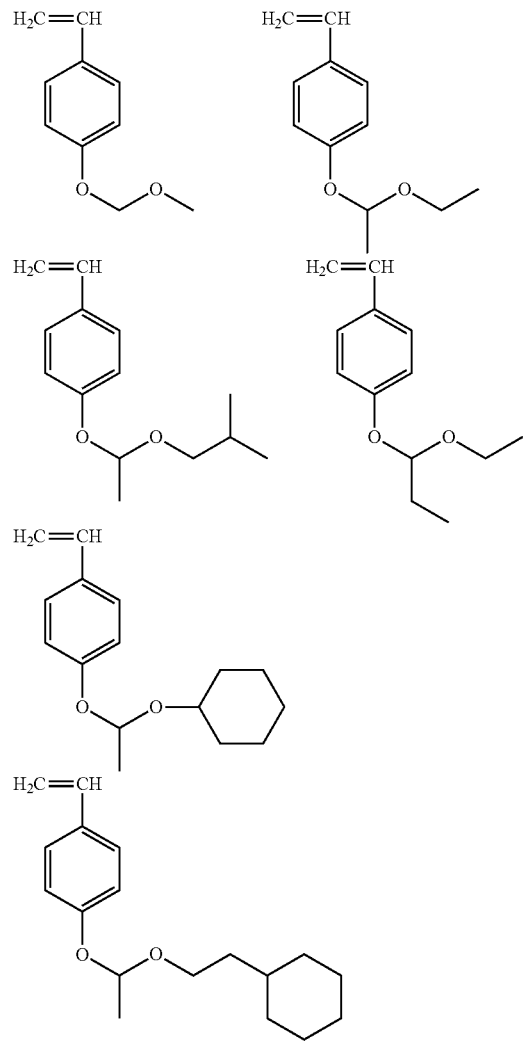

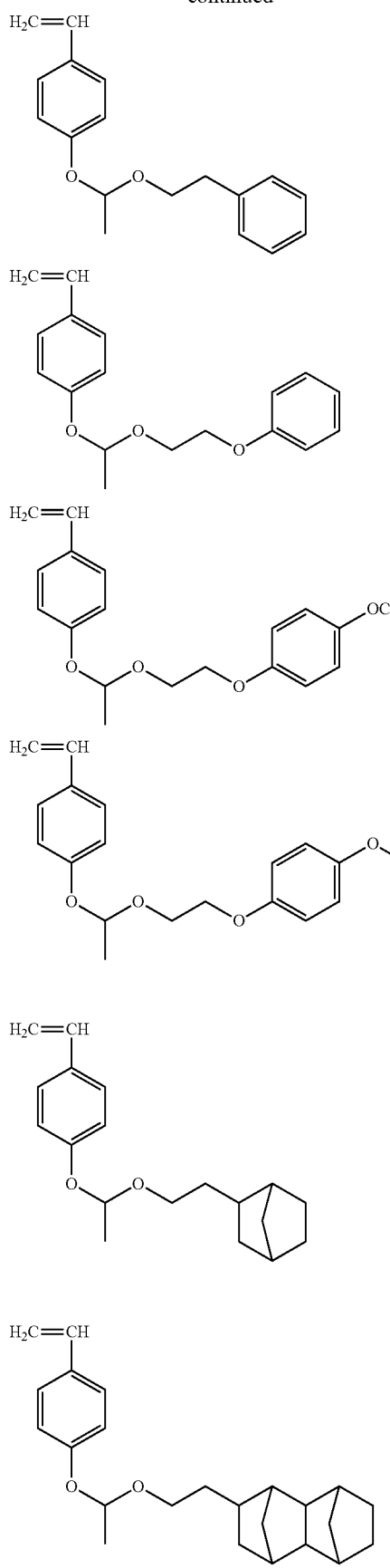
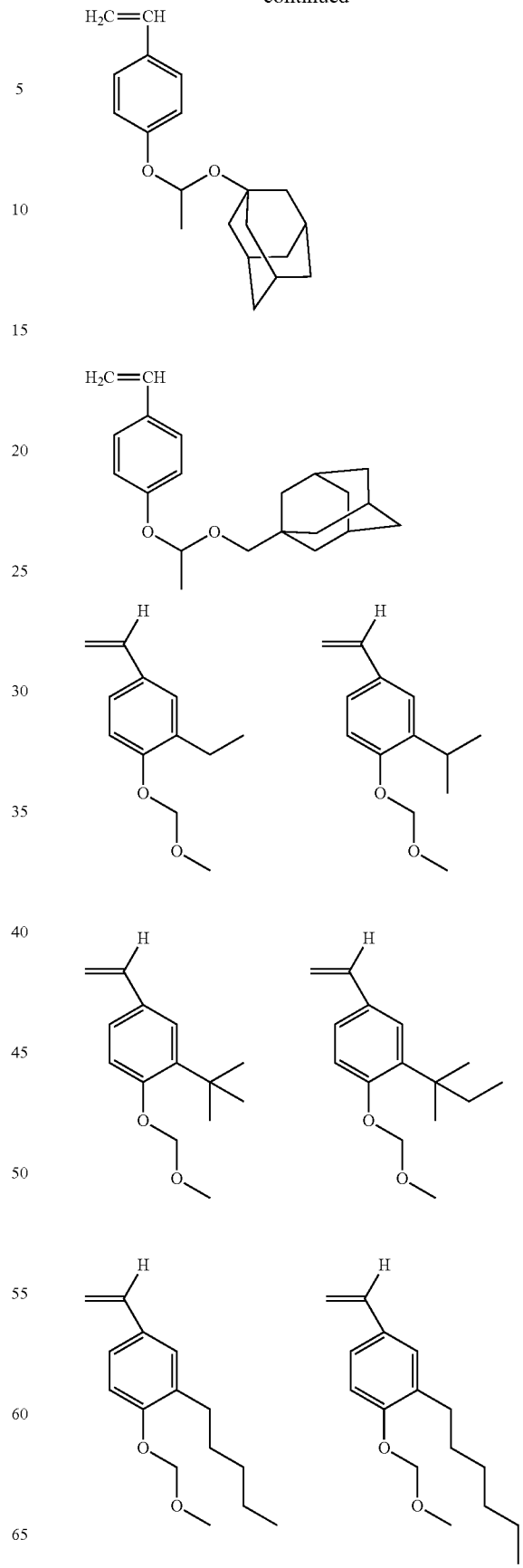

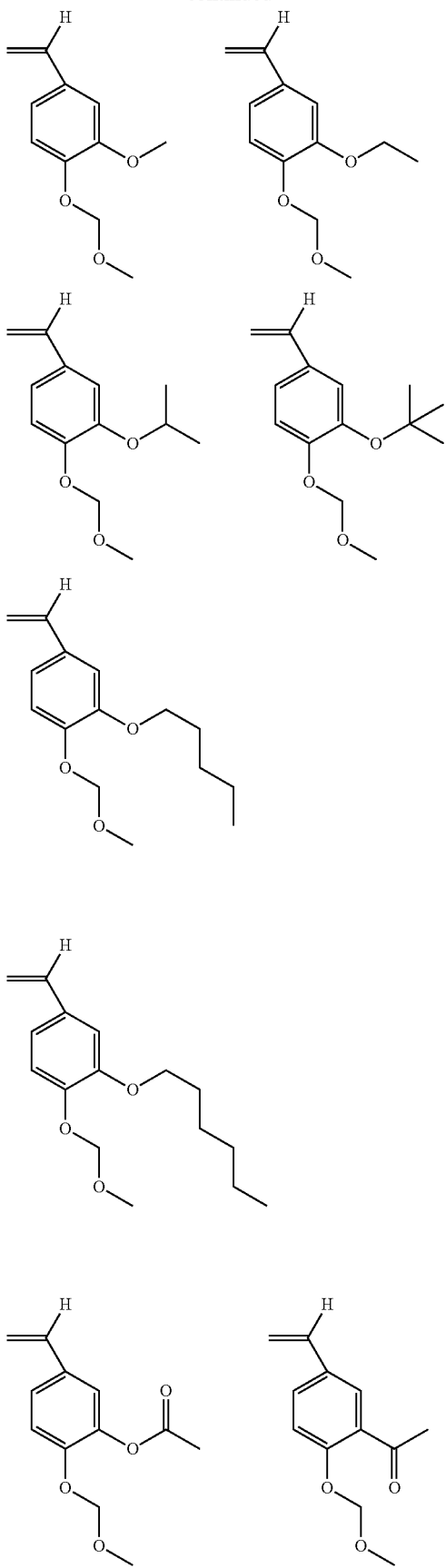

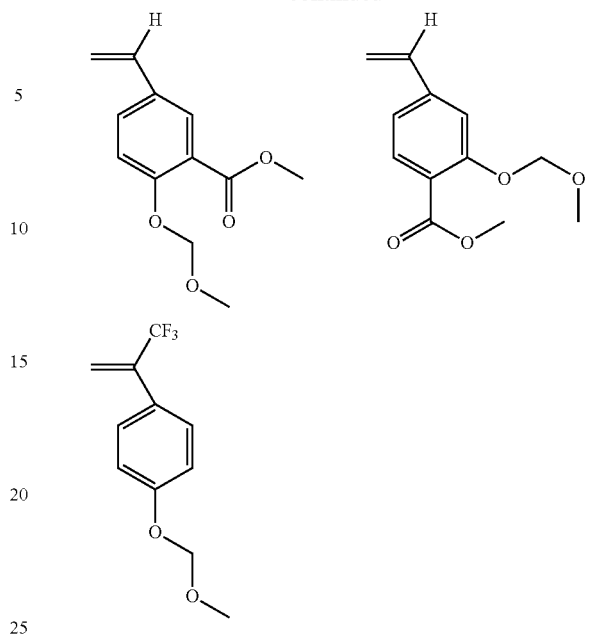

When the resin contains the structural unit derived form the monomer represented by the formula (a1-4), the content of the structural unit derived from the monomer represented by the formula (a1-4) is usually 10 to 95% by mole and preferably 15 to 90% by mole and more preferably 20 to 85% by mole based on total molar of all the structural units of the resin.

The resin can have two or more kinds of structural units derived from the monomers having an acid-labile group.

The resin preferably contains the structural unit derived from the monomer having an acid-labile group and a structural unit derived from the monomer having no acid-labile group. The resin can have two or more kinds of structural units derived from the monomers having no acid-labile group. When the resin contains the structural unit derived from the monomer having an acid-labile group and the structural unit derived from the monomer having no acid-labile group, the content of the structural unit derived from the monomer having an acid-labile group is usually 10 to 80% by mole and preferably 20 to 60% by mole based on total molar of all the structural units of the resin. The content of the structural unit derived from a monomer having an adamantyl group, especially the monomer represented by the formula (a1-1) in the structural unit derived from the monomer having no acid-labile group, is preferably 15% by mole or more from the viewpoint of dry-etching resistance of the photoresist composition.

The monomer having no acid-labile group preferably contains one or more hydroxyl groups or a lactone ring. When the resin contains the structural unit derived from the monomer having no acid-labile group and having one or more hydroxyl groups or a lactone ring, a photoresist composition having good resolution and adhesiveness of photoresist to a substrate tends to be obtained.

Examples of the monomer having no acid-labile group and having one or more hydroxyl groups include a monomer represented by the formula (a2-0):

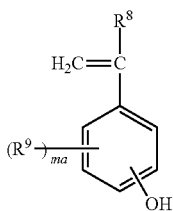

(a2-0)

wherein $R^8$ represents a hydrogen atom, a halogen atom, a C1-6 alkyl group or a C1-C6 halogenated alkyl group, $R^9$ is independently in each occurrence a halogen atom, a hydroxyl group, a C1-C6 alkyl group, a C1-C6 alkoxy group, a C2-C4 acyl group, a C2-C4 acyloxy group, an acryloyl group or a methacryloyl group, ma represents an integer of 0 to 4, and a monomer represented by the formula (a2-1):

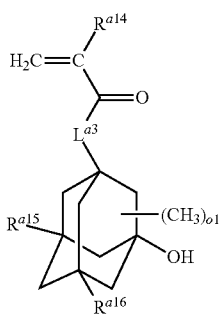

(a2-1)

wherein $R^{a14}$ represents a hydrogen atom or a methyl group, $R^{a15}$ and $R^{a16}$ each independently represent a hydrogen atom, a methyl group or a hydroxyl group, $L^{a3}$ represents *—O— or *—O—$(CH_2)_{k2}$—CO—O— in which * represents a binding position to —CO—, and k2 represents an integer of 1 to 7, and o1 represents an integer of 0 to 10.

When KrF excimer laser (wavelength: 248 nm) lithography system, or a high energy laser such as electron beam and extreme ultraviolet is used as an exposure system, the resin containing the structural unit derived from the monomer represented by the formula (a2-0) is preferable, and when ArF excimer laser (wavelength: 193 nm) is used as an exposure system, the resin containing the structural unit derived from the monomer represented by the formula (a2-1) is preferable.

In the formula (a2-0), examples of the halogen atom include a fluorine atom, examples of the C1-C6 alkyl group include a methyl group, an ethyl group, a propyl group, an isopropyl group, a butyl group, an isobutyl group, a sec-butyl group, a tert-butyl group, a pentyl group and a hexyl group, and a C1-C4 alkyl group is preferable and a C1-C2 alkyl group is more preferable and a methyl group is especially preferable. Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group and a perfluorohexyl group. Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferable and a C1-C2 alkoxy group is more preferable and a methoxy group is especially preferable. Examples of the C2-C4 acyl group include an acetyl group, a propionyl group and a butyryl group, and examples of the C2-C4 acyloxy group include an acetyloxy group, a propionyloxy group and a butyryloxy group. In the formula (a2-0), ma is preferably 0, 1 or 2, and is more preferably 0 or 1, and especially preferably 0.

The resin containing the structural unit derived from the monomer represented by the formula (a2-0) and the structural unit derived from the compound having an acid generator can be produced, for example, by polymerizing the compound having an acid generator and a monomer obtained by protecting a hydroxyl group of the monomer represented by the formula (a2-0) with an acetyl group followed by conducting deacetylation of the obtained polymer with a base.

Examples of the monomer represented by the formula (a2-0) include the followings.

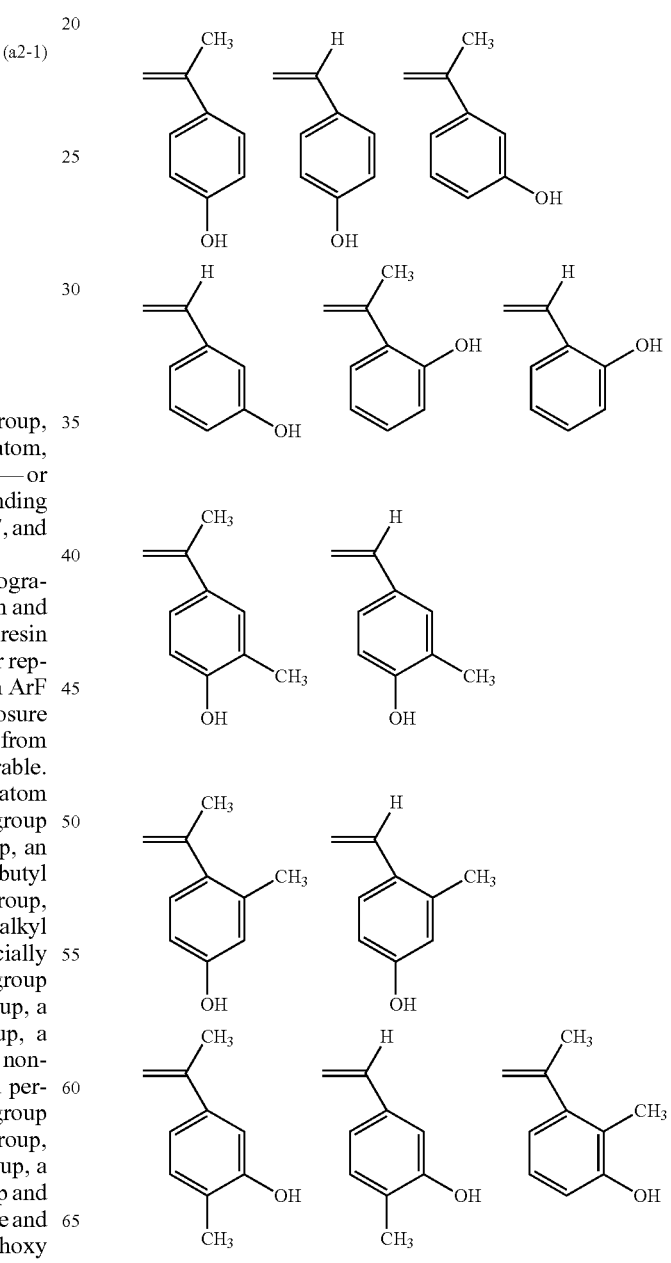

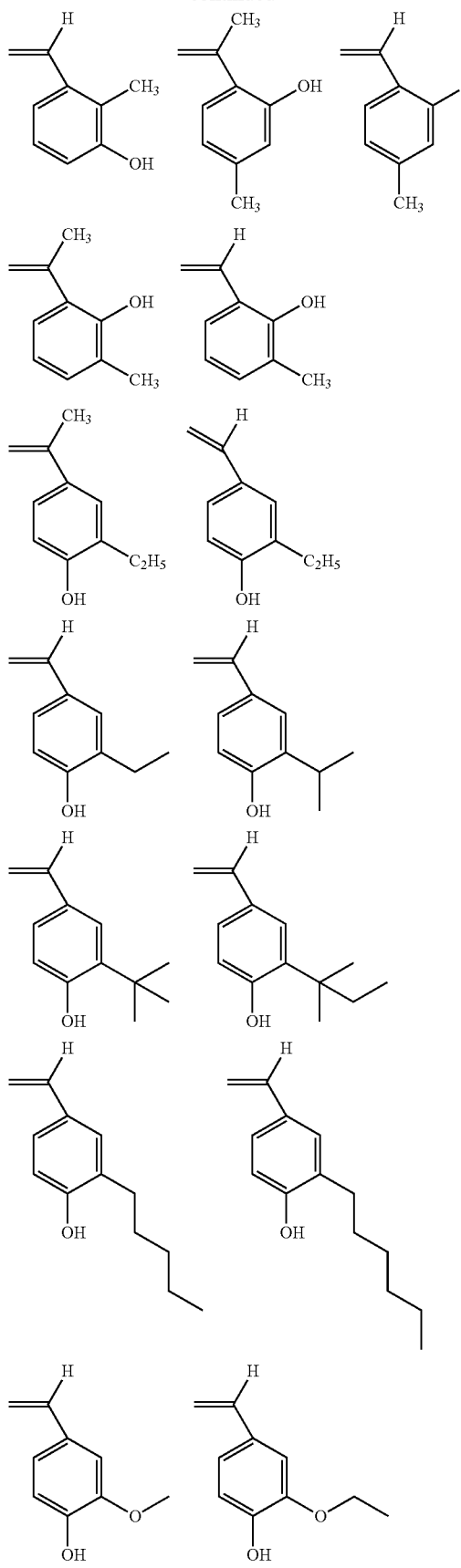
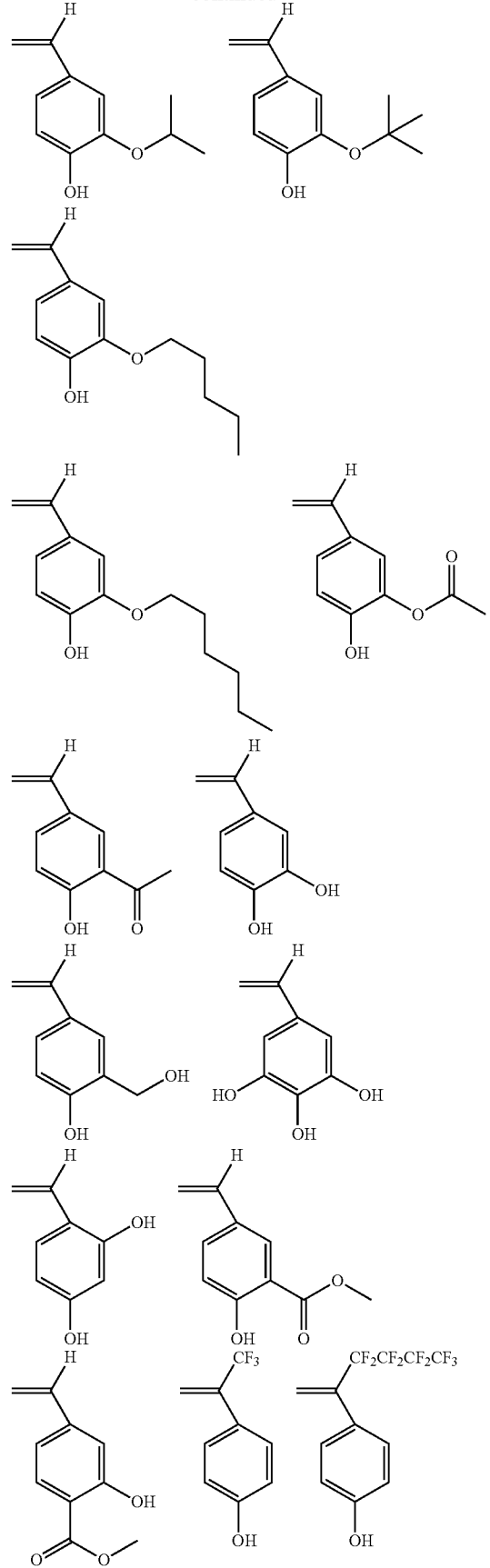

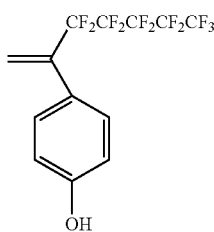

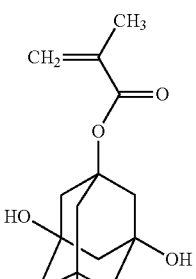 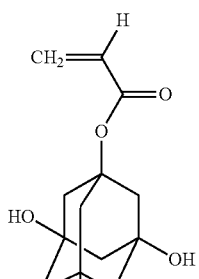

Among them, preferred are 4-hydroxystyrene and 4-hydroxy-α-methylstyrene.

When the resin contains the structural unit derived from the monomer represented by the formula (a2-0), the content of the structural unit derived from the monomer represented by the formula (a2-0) is usually 5 to 90% by mole and preferably 10 to 85% by mole and more preferably 15 to 80% by mole based on total molar of all the structural units of the resin.

In the formula (a2-1), $R^{a14}$ is preferably a methyl group, $R^{a15}$ is preferably a hydrogen atom, $R^{a16}$ is preferably a hydrogen atom or a hydroxyl group, $L^{a3}$ is preferably *—O— or *—O—$(CH_2)_{f2}$—CO—O— in which * represents a binding position to —CO—, and f2 represents an integer of 1 to 4, and is more preferably *—O—, and o1 is preferably 0, 1, 2 or 3 and is more preferably 0 or 1.

Examples of the monomer represented by the formula (a2-1) include the followings, and 3-hydroxy-1-adamantyl acrylate, 3-hydroxy-1-adamantyl methacrylate, 3,5-dihydroxy-1-adamantyl acrylate, 3,5-dihydroxy-1-adamantyl methacrylate, 1-(3,5-dihydroxy-1-adamantyloxycarbonyl)methyl acrylate and 1-(3,5-dihydroxy-1-adamantyloxycarbonyl)methyl methacrylate are preferable, and 3-hydroxy-1-adamantyl methacrylate and 3,5-dihydroxy-1-adamantyl methacrylate are more preferable.

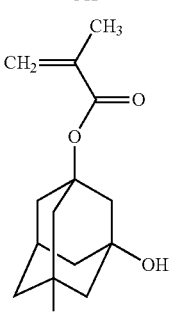 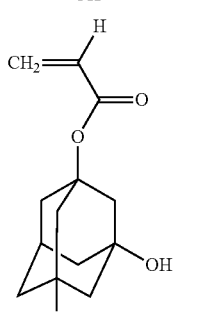

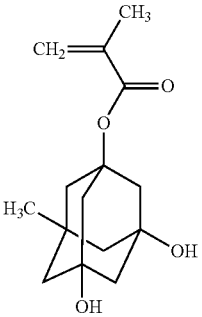 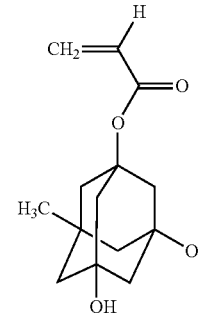

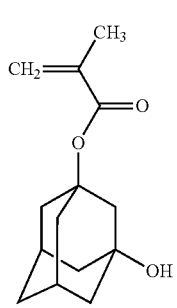 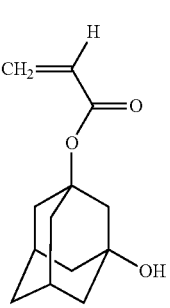 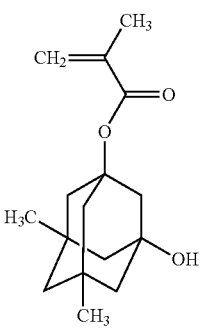 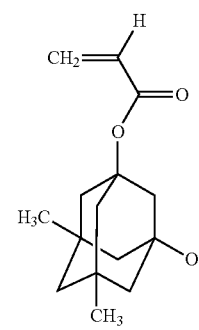

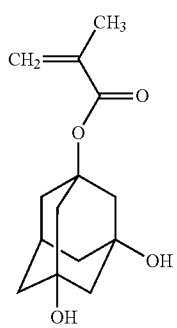 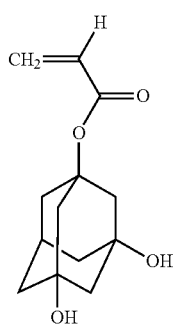 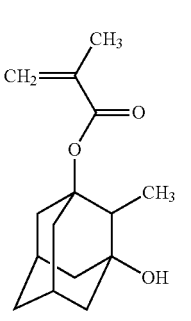 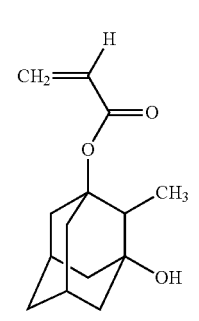

-continued
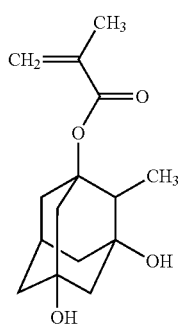
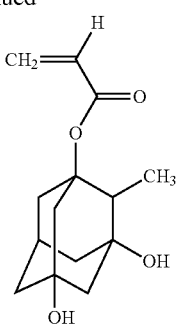
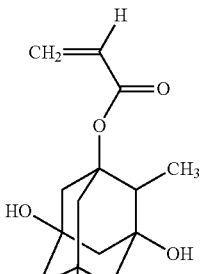
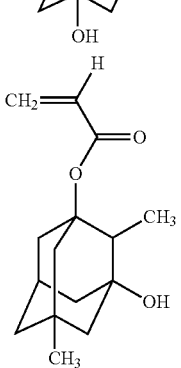
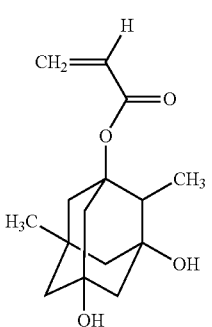
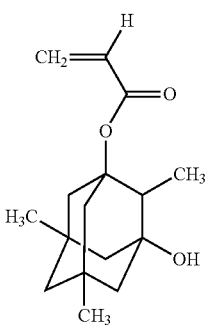
-continued
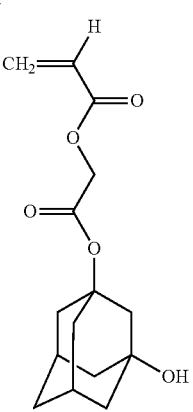
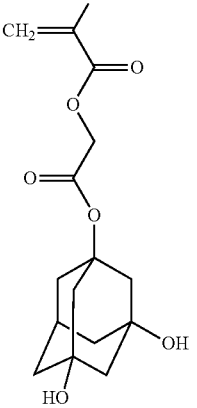
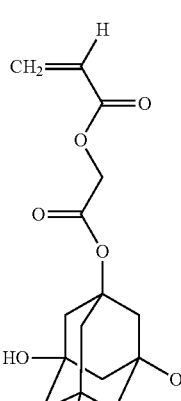
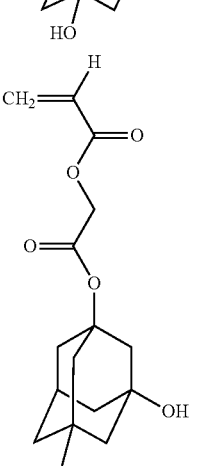

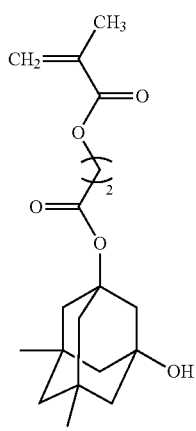 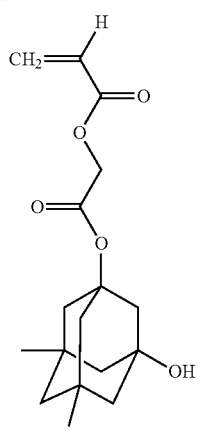 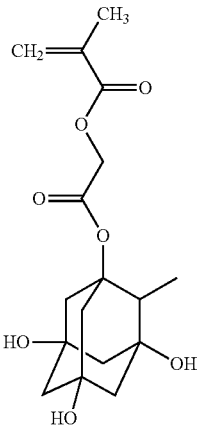 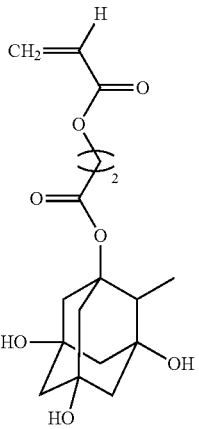

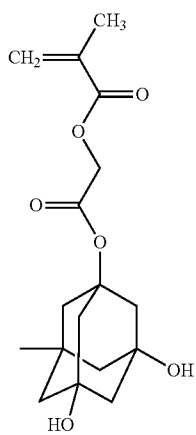 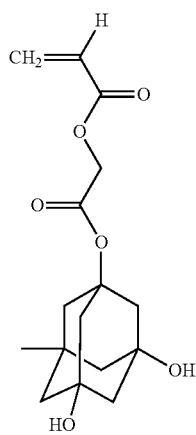

When the resin contains the structural unit derived from the monomer represented by the formula (a2-1), the content of the structural unit derived from the monomer represented by the formula (a2-1) is usually 3 to 40% by mole and preferably 5 to 35% by mole and more preferably 5 to 30% by mole based on total molar of all the structural units of the resin.

Examples of the lactone ring of the compound having no acid-labile group and having a lactone ring include a monocyclic lactone ring such as β-propiolactone ring, γ-butyrolactone ring and γ-valerolactone ring, and a condensed ring formed from a monocyclic lactone ring and the other ring. Among them, preferred are γ-butyrolactone ring and a condensed lactone ring formed from γ-butyrolactone ring and the other ring.

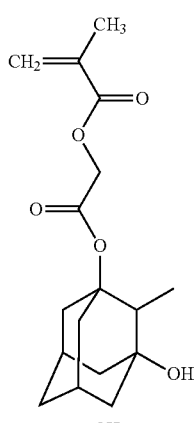 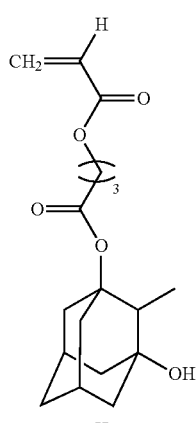

Preferable examples of the monomer having no acid-labile group and a lactone ring include the monomers represented by the formulae (a3-1), (a3-2) and (a3-3):

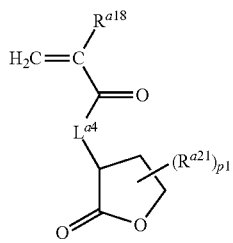 (a3-1)

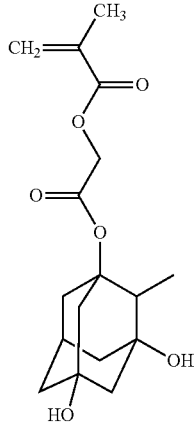 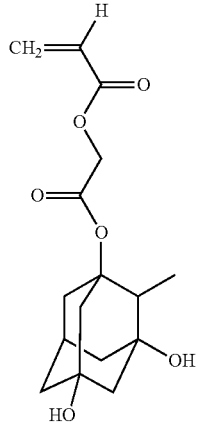

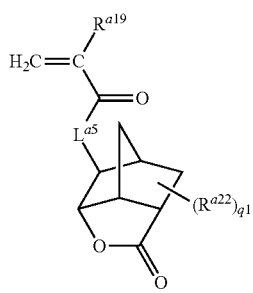 (a3-2)

-continued

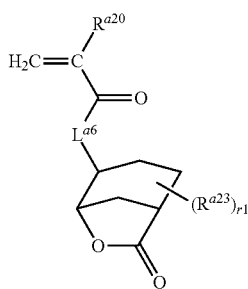

(a3-3)

wherein $L^{a4}$, $L^{a5}$ and $L^{a6}$ each independently represent *—O— or *—O—$(CH_2)_{k3}$—CO—O— in which * represents a binding position to —CO— and k3 represents an integer of 1 to 7, $R^{a18}$, $R^{a19}$ and $R^{a20}$ each independently represent a hydrogen atom or a methyl group, $R^{a21}$ represents a C1-C4 aliphatic hydrocarbon group, $R^{a22}$ and $R^{a23}$ are independently in each occurrence a carboxyl group, a cyano group or a C1-C4 aliphatic hydrocarbon group, and p1 represents an integer of 0 to 5, q1 and r1 independently each represent an integer of 0 to 3.

It is preferred that $L^{a4}$, $L^{a5}$ and $L^{a6}$ each independently represent —O— or *—O—$(CH_2)_{d1}$—CO—O— in which * represents a binding position to —CO— and d1 represents an integer of 1 to 4, and it is more preferred that $L^{a4}$, $L^{a5}$ and $L^{a6}$ are *—O—. $R^{a18}$, $R^{a19}$ and $R^{a20}$ are preferably methyl groups. $R^{a21}$ is preferably a methyl group. It is preferred that $R^{a22}$ and $R^{a23}$ are independently in each occurrence a carboxyl group, a cyano group or a methyl group. It is preferred that p1 is an integer of 0 to 2, and it is more preferred that p1 is 0 or 1. It is preferred that q1 and r1 independently each represent an integer of 0 to 2, and it is more preferred that q1 and r1 independently each represent 0 or 1.

Examples of the monomer represented by the formula (a3-1) include the followings.

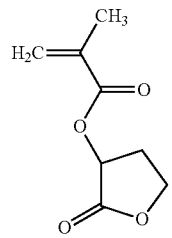

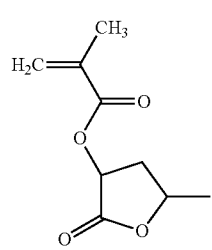

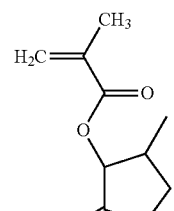
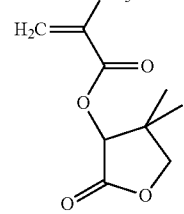
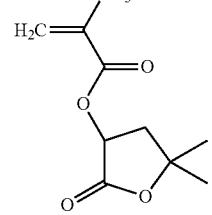
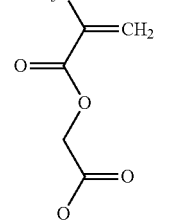
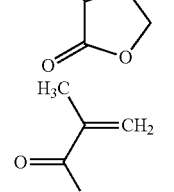
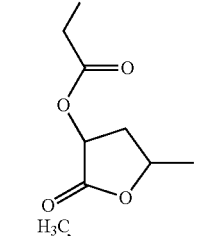
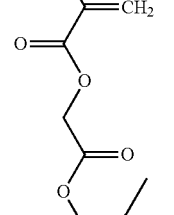
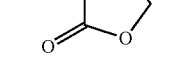

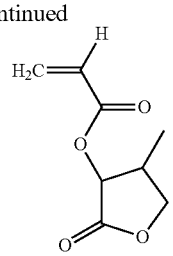
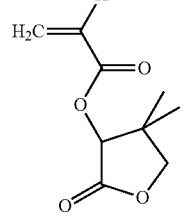
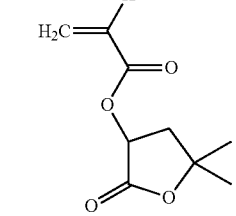
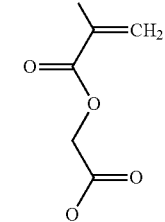
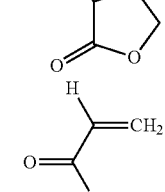
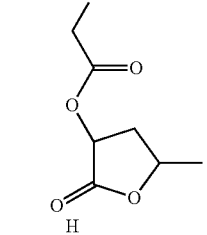
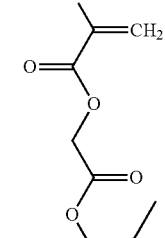
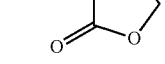

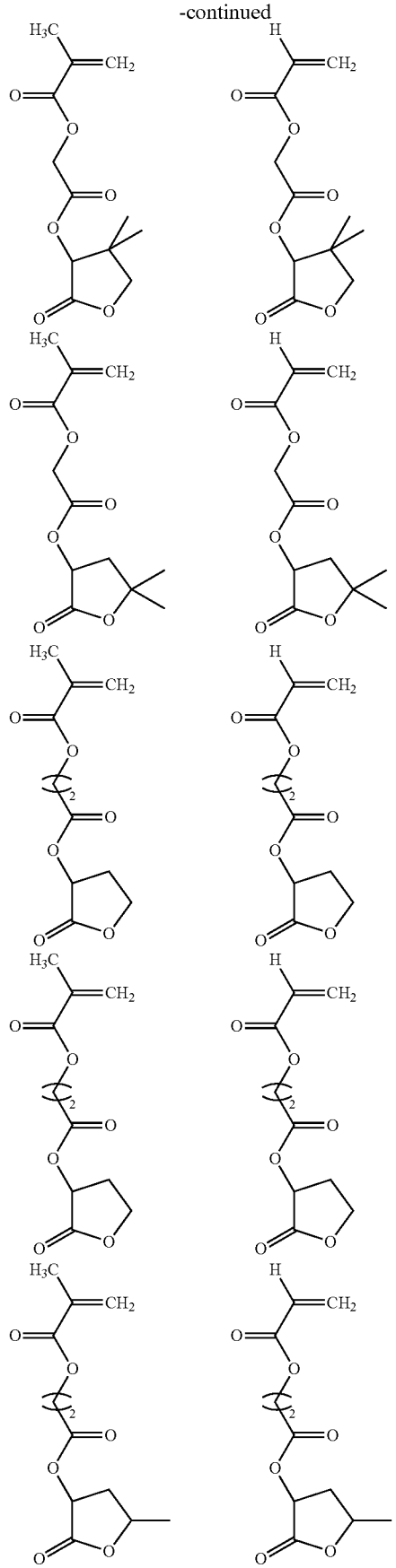
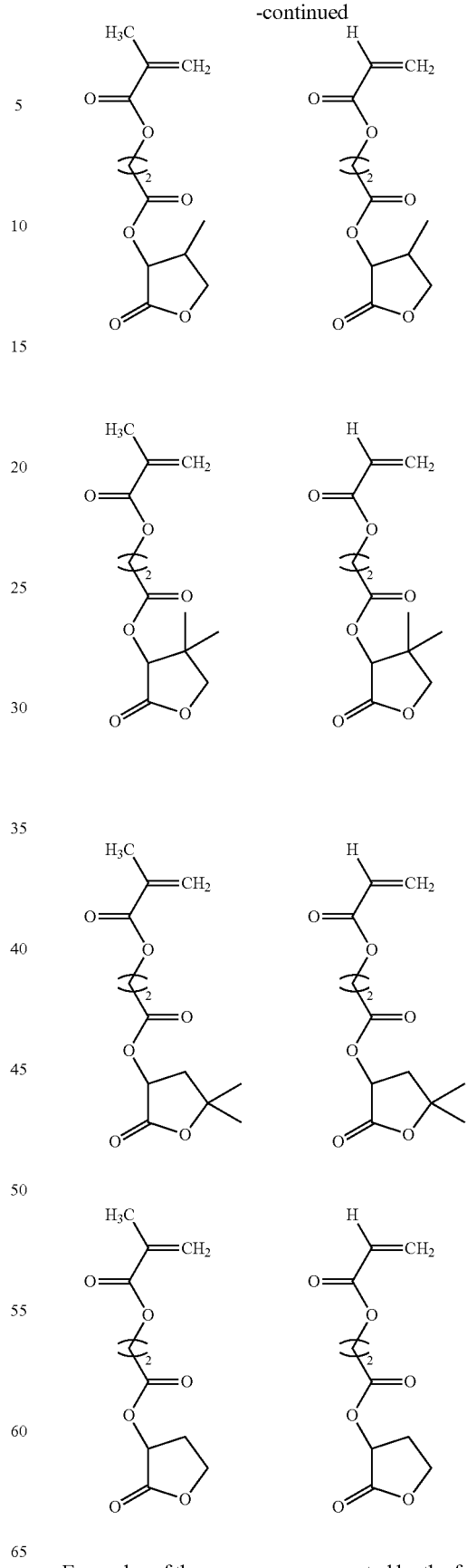
Examples of the monomer represented by the formula (a3-2) include the followings.

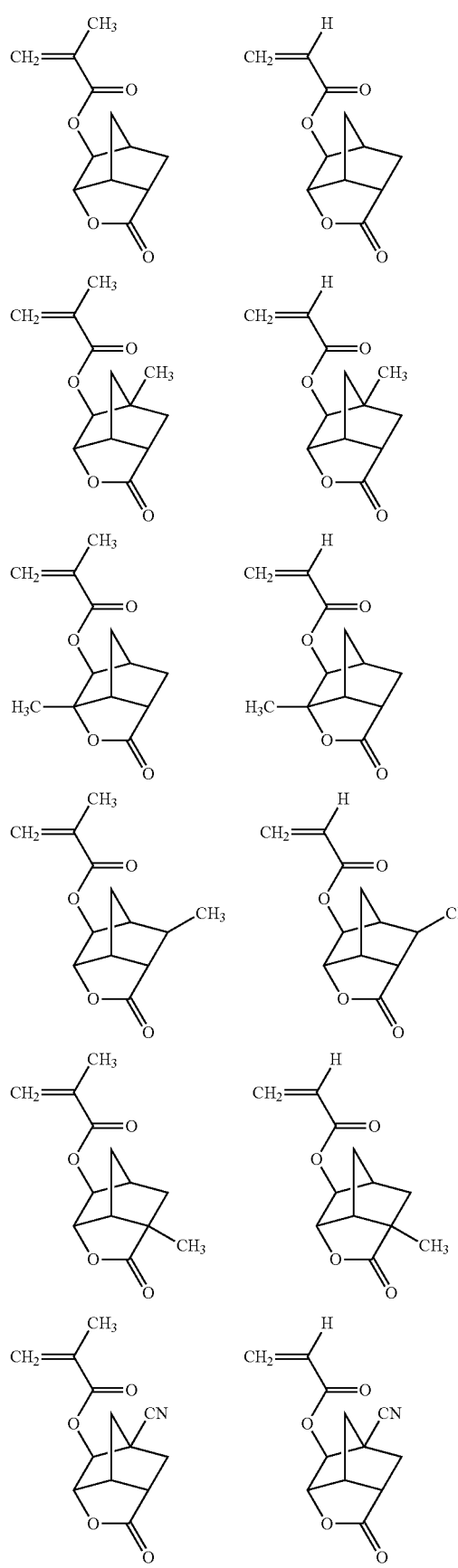
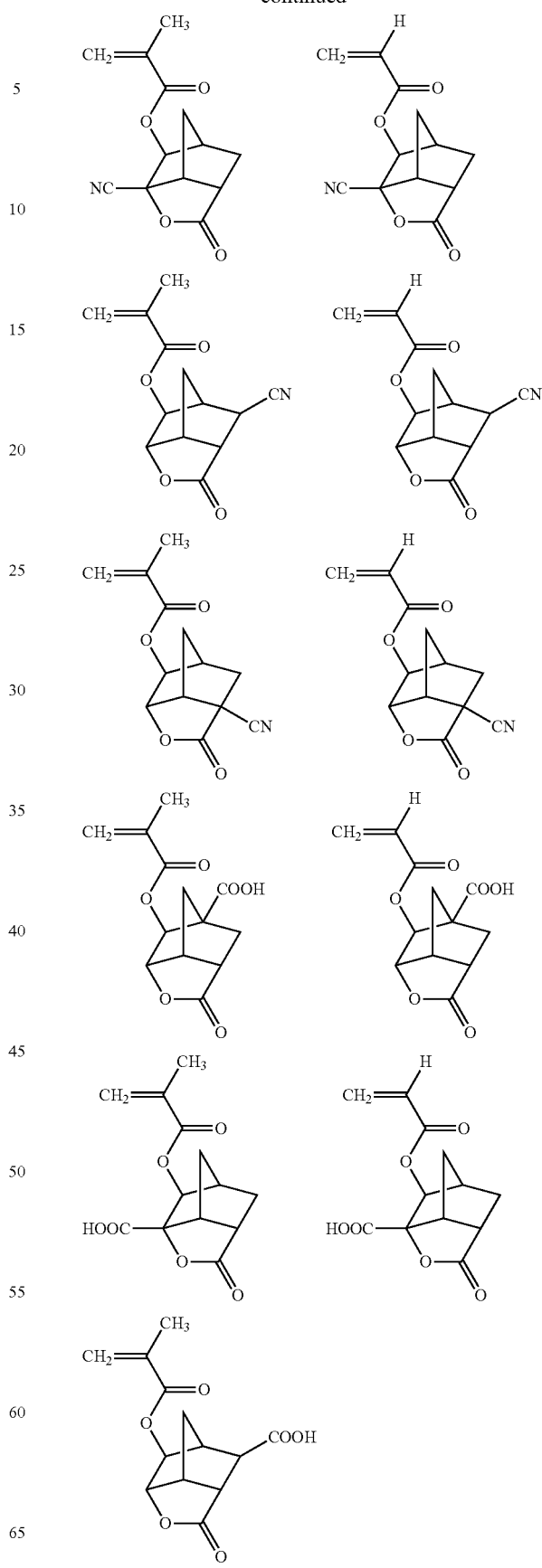

-continued
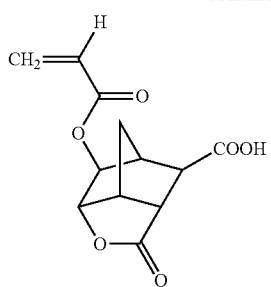
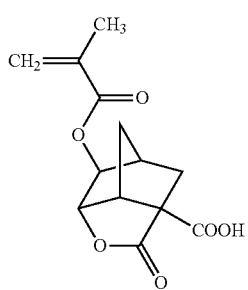
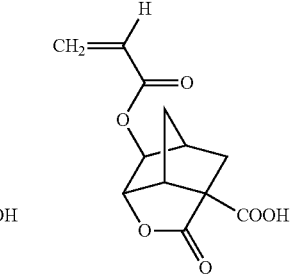
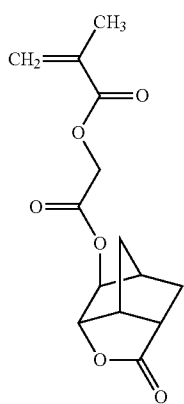
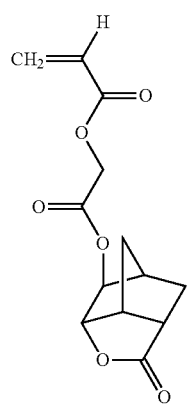
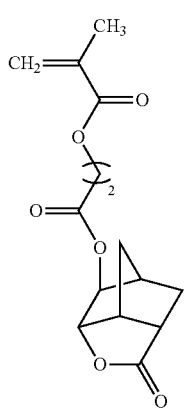
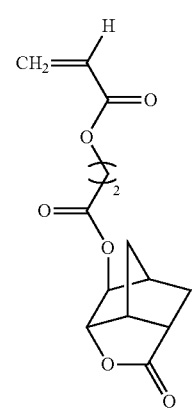
-continued
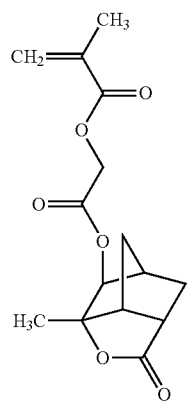
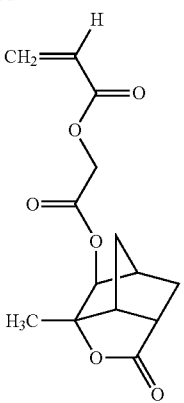
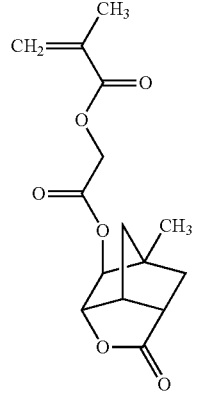
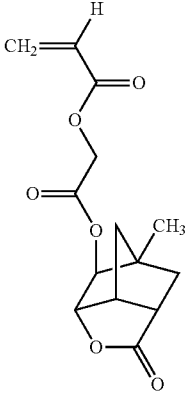
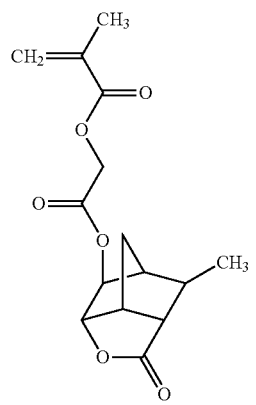
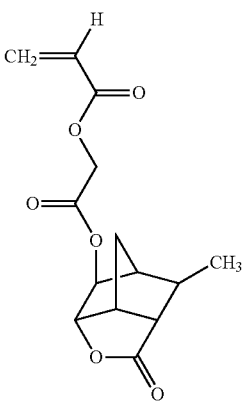
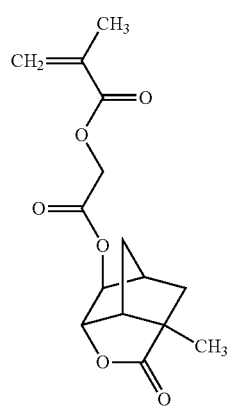
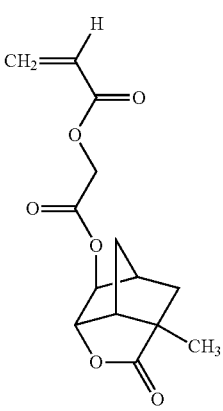

51
-continued
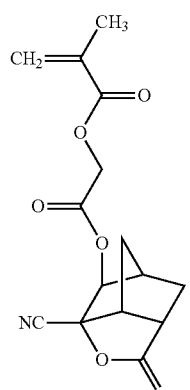 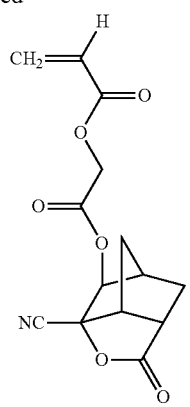
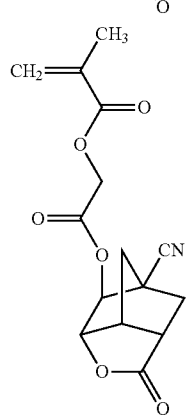 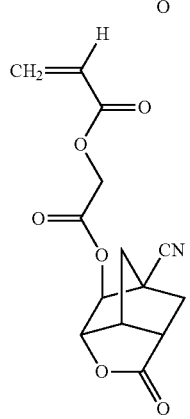
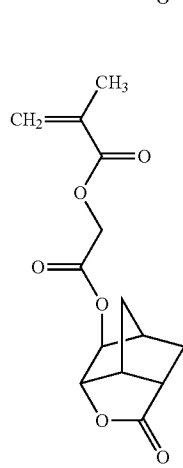 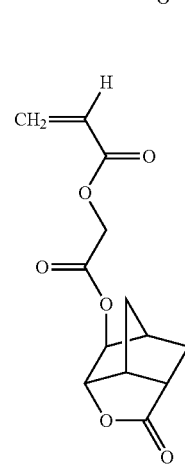
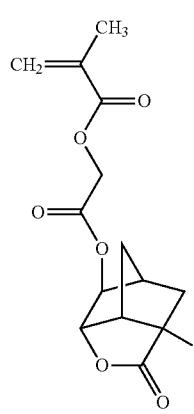 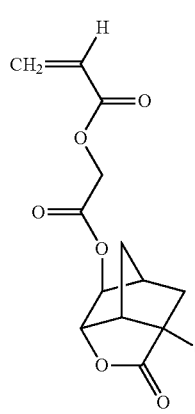
52
-continued
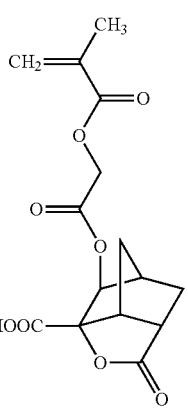
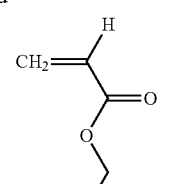
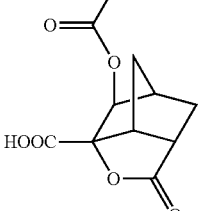
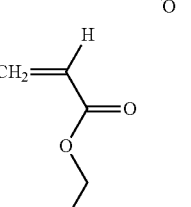
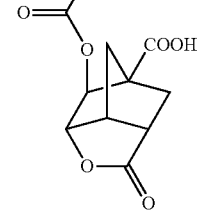

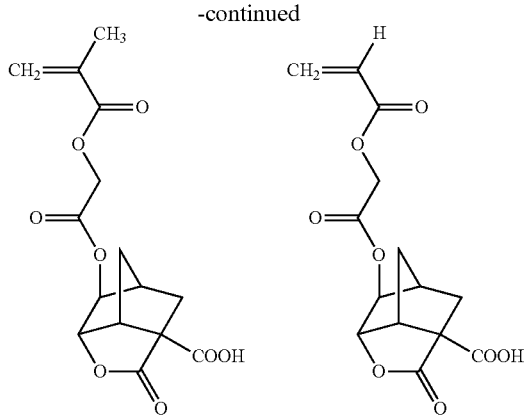
Examples of the monomer represented by the formula (a3-3) include the followings.
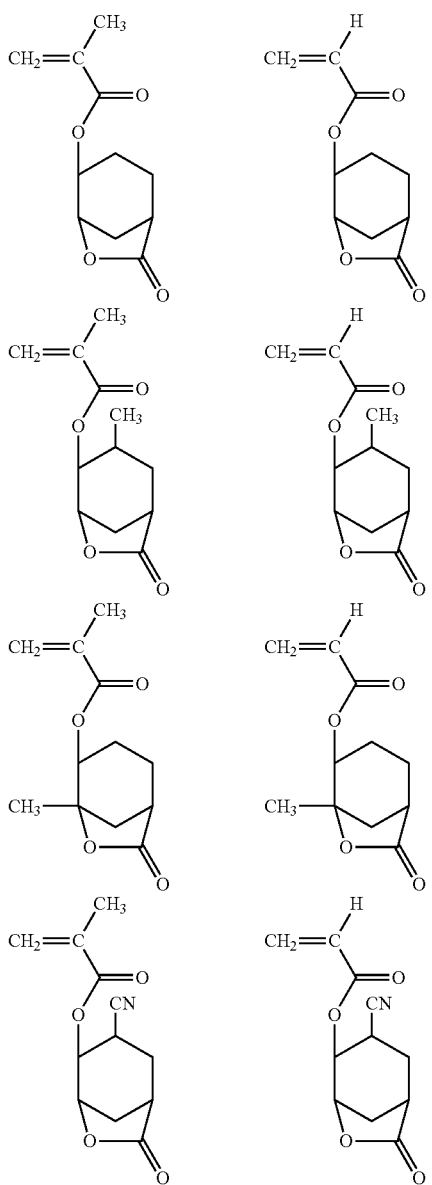
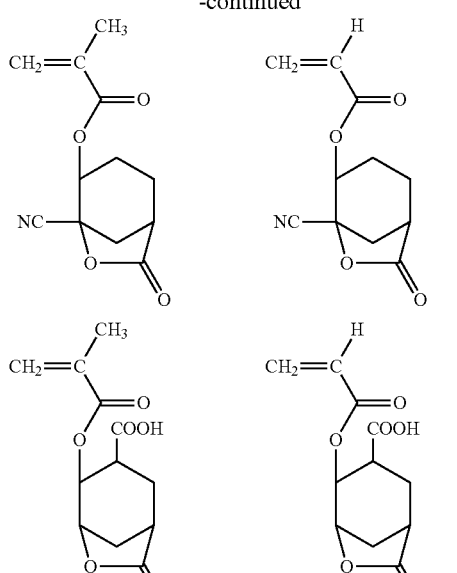
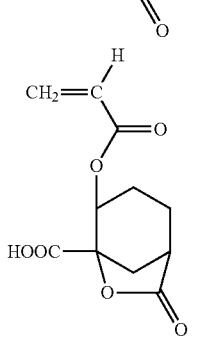
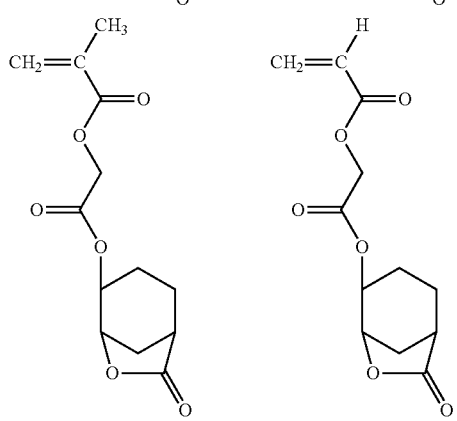
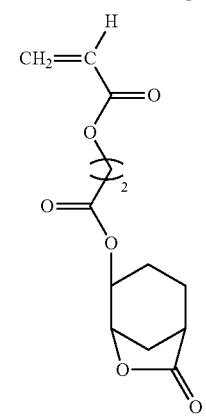

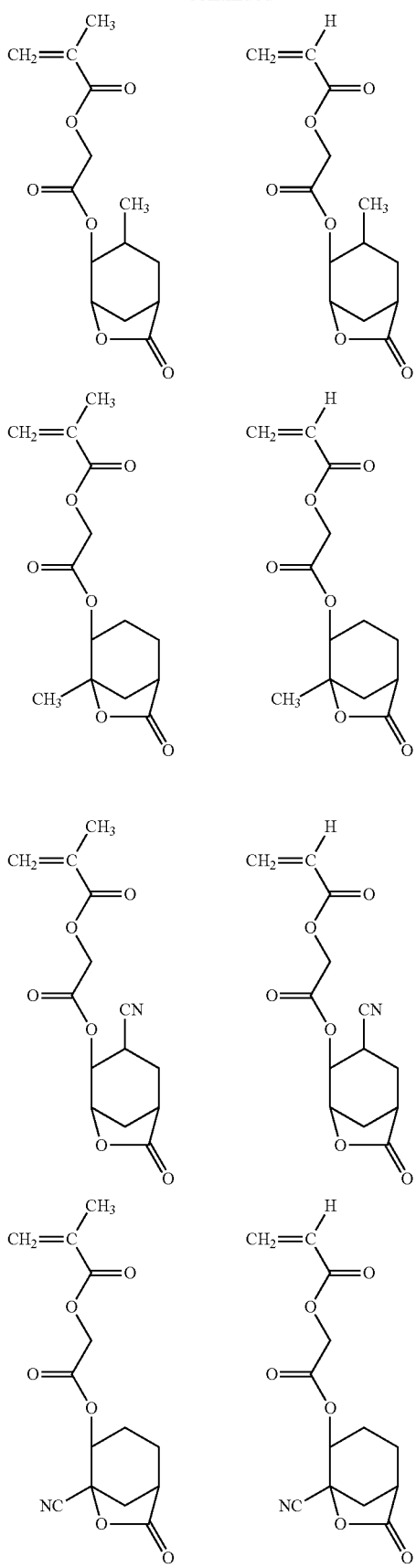
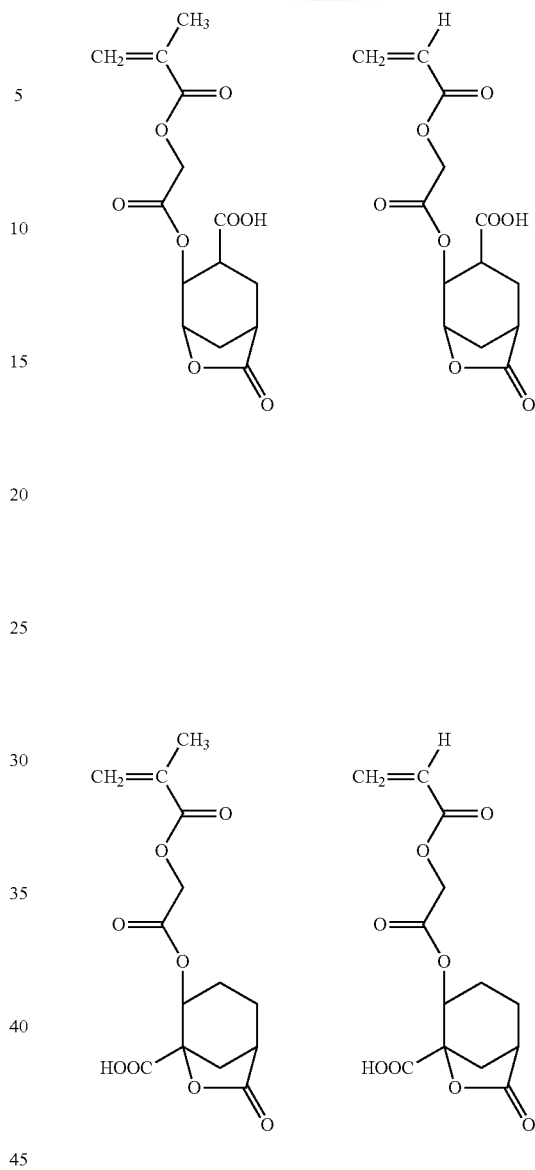

Among them, preferred are 5-oxo-4-oxatricyclo[4.2.1.0$^{3,7}$]nonan-2-yl acrylate, 5-oxo-4-oxatricyclo[4.2.1.0$^{3,7}$]nonan-2-yl methacrylate, tetrahydro-2-oxo-3-furyl acrylate, tetrahydro-2-oxo-3-furyl methacrylate, 2-(5-oxo-4-oxatricyclo[4.2.1.0$^{3,7}$]nonan-2-yloxy)-2-oxoethyl acrylate and 2-(5-oxo-4-oxatricyclo[4.2.1.0$^{3,7}$]nonan-2-yloxy)-2-oxoethyl methacrylate, and more preferred are 5-oxo-4-oxatricyclo[4.2.1.0$^{3,7}$]nonan-2-yl methacrylate, tetrahydro-2-oxo-3-furyl methacrylate and 2-(5-oxo-4-oxatricyclo[4.2.1.0$^{3,7}$]nonan-2-yloxy)-2-oxoethyl methacrylate.

When the resin contains the structural unit derived from the monomer having no acid-labile group and having a lactone ring, the content thereof is usually 5 to 50% by mole and preferably 10 to 45% by mole and more preferably 15 to 40% by mole based on total molar of all the structural units of the resin.

The resin can contain a structural unit derived from a monomer having an acid-labile group containing a lactone ring. Examples of the monomer having an acid-labile group containing a lactone ring include the followings.

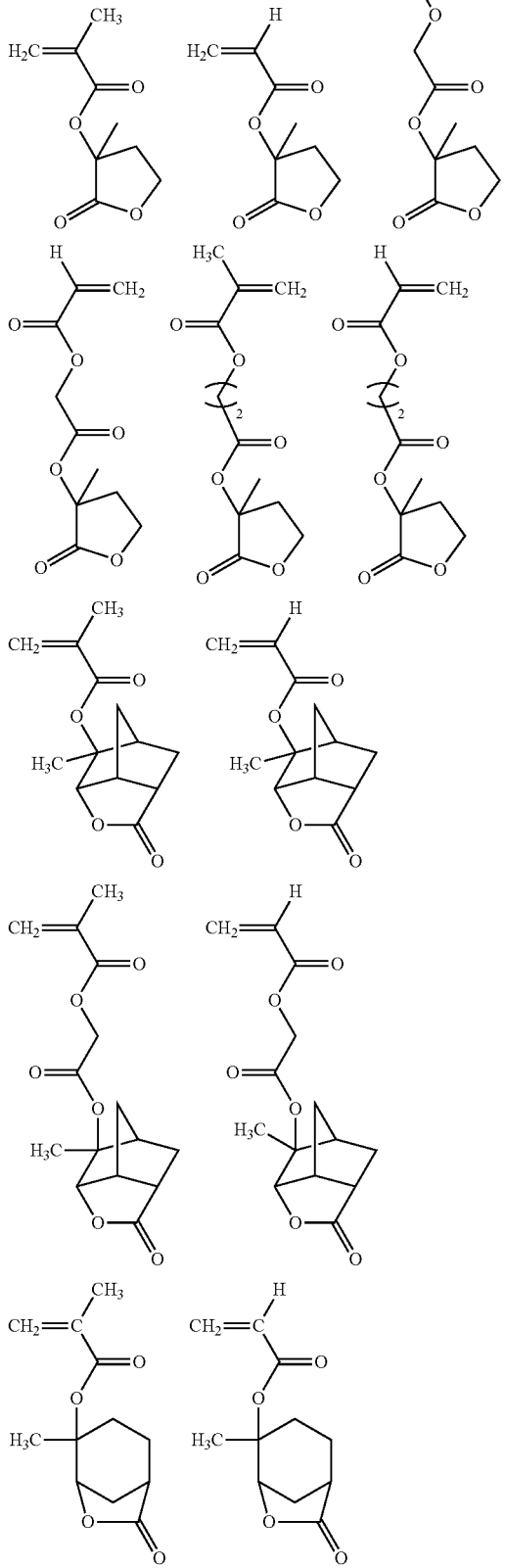
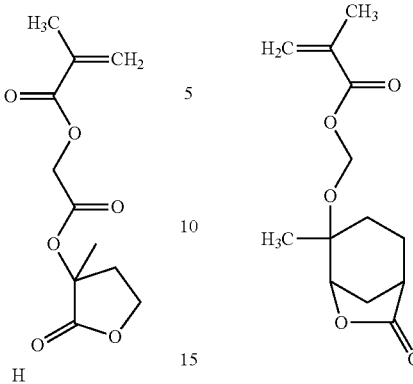
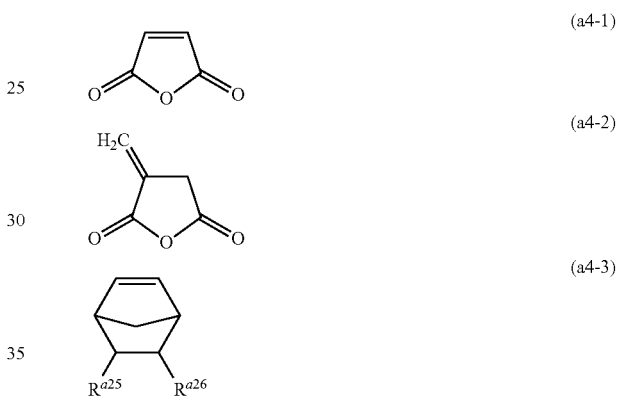

Examples of the other monomer having no acid-labile group include the monomers represented by the formulae (a4-1), (a4-2), (a4-3) and (a4-4):

(a4-1)

(a4-2)

(a4-3)

wherein $R^{a25}$ and $R^{a26}$ each independently represents a hydrogen atom, a C1-C3 aliphatic hydrocarbon group which can have one or more substituents, a carboxyl group, a cyano group or a —COOR$^{a27}$ group in which R$^{a27}$ represents a C1-C36 aliphatic hydrocarbon group or a C3-C36 saturated cyclic hydrocarbon group, and one or more —CH$_2$— in the C1-C36 aliphatic hydrocarbon group and the C3-C36 saturated cyclic hydrocarbon group can be replaced by —O— or —CO—, with the proviso that the carbon atom bonded to —O— of —COO— of R$^{a27}$ is not a tertiary carbon atom, or $R^{a25}$ and $R^{a26}$ are bonded together to form a carboxylic anhydride residue represented by —C(=O)OC(=O)—.

Examples of the substituent of the C1-C3 aliphatic hydrocarbon group include a hydroxyl group. Examples of the C1-C3 aliphatic hydrocarbon group which can have one or more substituents include a C1-C3 alkyl group such as a methyl group, an ethyl group and a propyl group, and a C1-C3 hydroxyalkyl group such a hydroxymethyl group and a 2-hydroxyethyl group. The C1-C36 aliphatic hydrocarbon group represented by R$^{a27}$ is preferably a C1-C8 aliphatic hydrocarbon group and is more preferably a C1-C6 aliphatic hydrocarbon group.

The C3-C36 saturated cyclic hydrocarbon group represented by R$^{a27}$ is preferably a C4-C36 saturated cyclic hydrocarbon group, and is more preferably C4-C12 saturated cyclic hydrocarbon group. Examples of R$^{a27}$ include a methyl group, an ethyl group, a propyl group, a 2-oxo-oxolan-3-yl group and a 2-oxo-oxolan-4-yl group.

Examples of the monomer represented by the formula (a4-3) include 2-norbornene, 2-hydroxy-5-norbornene, 5-norbornene-2-carboxylicacid, methyl 5-norbornene-2-carboxylate, 2-hydroxyethyl 5-norbornene-2-carboxylate, 5-norbornene-2-methanol and 5-norbornene-2,3-dicarboxylic anhydride.

The content of the structural unit derived from a monomer represented by the formula (a4-1), (a4-2) or (a4-3) is usually 0 to 40% by mole, preferably 3 to 30% by mole and more preferably 5 to 20% by mole based on total molar of all the structural units of the resin.

Preferable resin is a resin containing the structural units derived from the monomer having an acid-labile group, and the structural units derived from the monomer having one or more hydroxyl groups and/or the monomer having a lactone ring. The monomer having an acid-labile group is preferably the monomer represented by the formula (a1-1) or the monomer represented by the formula (a1-2), and is more preferably the monomer represented by the formula (a1-1). The monomer having one or more hydroxyl groups is preferably the monomer represented by the formula (a2-1), and the monomer having a lactone ring is preferably the monomer represented by the formula (a3-1) or (a3-2).

The resin can be produced according to known polymerization methods such as radical polymerization.

The resin usually has 2,500 or more of the weight-average molecular weight, and preferably 3,000 or more of the weight-average molecular weight. The resin usually has 50,000 or less of the weight-average molecular weight, and preferably has 30,000 or less of the weight-average molecular weight. The weight-average molecular weight can be measured with gel permeation chromatography.

The content of the resin is preferably 80% by weight or more based on 100% by weight of the solid component. In this specification, "solid component" means components other than solvent in the photoresist composition.

Next, the acid generator will be illustrated.

The photoresist composition of the present invention contains one or more acid generators, and preferably a photoacid generator.

The acid generator is a substance which is decomposed to generate an acid by applying a radiation such as a light, an electron beam or the like on the substance itself or on a photoresist composition containing the substance. The acid generated from the acid generator acts on the resin resulting in cleavage of the acid-labile group existing in the resin.

Examples of the acid generator include a nonionic acid generator, an ionic acid generator and the combination thereof. An ionic acid generator is preferable. Examples of the nonionic acid generator include an organo-halogen compound, a sulfone compound such as a disulfone, a ketosulfone and a sulfonyldiazomethane, a sulfonate compound such as a 2-nitrobenzylsulfonate, an aromatic sulfonate, an oxime sulfonate, an N-sulfonyloxyimide, a sulfonyloxyketone and DNQ 4-sulfonate. Examples of the ionic acid generator include an acid generator having an inorganic anion such as $BF_4^-$, $PF_6^-$, $AsF_6^-$ and $SbF_6^-$, and an acid generator having an organic anion such as a sulfonic acid anion and a bissulfonylimido anion, and an acid generator having a sulfonic acid anion is preferable. The acid generator containing one or more fluorine atoms is preferable. Preferable examples of the acid generator include a salt represented by the formula (B1):

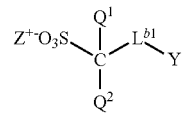
(B1)

wherein $Q^1$ and $Q^2$ each independently represent a fluorine atom or a C1-C6 perfluoroalkyl group, $L^{b1}$ represents a single bond or a C1-C17 divalent saturated hydrocarbon group in which one or more —$CH_2$— can be replaced by —O— or —CO—, Y represents a C1-C18 aliphatic hydrocarbon group which can have one or more substituents, or a C3-C18 saturated cyclic hydrocarbon group which can have one or more substituents, and one or more —$CH_2$— in the aliphatic hydrocarbon group and the saturated cyclic hydrocarbon group can be replaced by —O—, —CO— or —$SO_2$—, and $Z^+$ represents an organic cation.

Examples of the C1-C6 perfluoroalkyl group include a trifluoromethyl group, a pentafluoroethyl group, a heptafluoropropyl group, a nonafluorobutyl group, an undecafluoropentyl group and a tridecafluorohexyl group, and a trifluoromethyl group is preferable. $Q^1$ and $Q^2$ each independently preferably represent a fluorine atom or a trifluoromethyl group, and $Q^1$ and $Q^2$ are more preferably fluorine atoms.

Examples of the C1-C17 divalent saturated hydrocarbon group include a C1-C17 linear alkylene group such as a methylene group, an ethane-1,2-diyl group, a propane-1,3-diyl group, a propane-1,2-diyl group, a butane-1,4-diyl group, a butane-1,3-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group, a C1-C17 branched alkylene group such as a 1-methylpropane-1,3-diyl group, a 2-methylpropane-1,3-diyl group, a 2-methylpropane-1,2-diyl group, a 1-methylbutane-1,4-diyl group, and a 2-methylbutane-1,4-diyl group,
a divalent saturated monocyclic hydrocarbon group such as a cycloalkanediyl group such as a cyclobutane-1,3-diyl group, a cyclopentane-1,3-diyl group, a cyclohexane-1,4-diyl group, and a cyclooctane-1,5-diyl group,
a divalent saturated polycyclic hydrocarbon group such as a norbornane-1,4-diyl group, a norbornane-2,5-diyl group, an adamantane-1,5-diyl group and an adamantane-2,6-diyl group, and a group formed by combining two or more groups selected from the group consisting of the above-mentioned groups.

The C1-C17 divalent saturated hydrocarbon group can have one or more substituents, and examples of the substituent include a halogen atom, a hydroxyl group, a carboxyl group, a C6-C18 aromatic group, a C7-C21 aralkyl group such as a benzyl group, a phenethyl group, a phenylpropyl group, a trityl group, a naphthylmethyl group and a naphthylethyl group, a C2-C4 acyl group and a glycidyloxy group.

Examples of the C1-C17 saturated hydrocarbon group in which one or more —$CH_2$— are replaced by —O— or —CO— include *—CO—O—$L^{b2}$-, *—CO—O—$L^{b4}$-CO—O—$L^{b3}$-, *-$L^{b5}$-O—CO—, *-$L^{b7}$-O-$L^{b6}$-, *—CO—O-$L^{b8}$-O—, and *—CO—O-$L^{b10}$-O-$L^{b9}$-CO—O—, wherein $L^{b2}$ represents a single bond or a C1-C15 alkanediyl group, $L^{b3}$ represents a single bond or a C1-C12 alkanediyl group, $L^{b4}$ represents a single bond or a C1-C13 alkanediyl group, with proviso that total carbon number of $L^{b3}$ and $L^{b4}$ is 1 to 13, $L^{b5}$ represents a C1-C15 alkanediyl group, $L^{b6}$ represents a C1-C15 alkanediyl group, $L^{b7}$ represents a C10-C15 alkanediyl group, with proviso that total carbon number of $L^{b6}$ and $L^{b7}$ is 1 to 16, $L^{b8}$ represents a C1-C14 alkanediyl group, $L^{b9}$ represents a C1-C11 alkanediyl group, $L^{b10}$ represents a C1-C11 alkanediyl group, with proviso that total carbon number of $L^{b9}$ and $L^{b10}$ is 1 to 12, and * represents a binding position to $-C(Q^1)(Q^2)-$. Among them, preferred are *—CO—O-$L^{b2}$-, *—CO—O-$L^{b4}$-CO—O-$L^{b3}$-, *-$L^{b5}$-O—CO— and *-$L^{b7}$-O-$L^{b6}$-, and more preferred are *—CO—O-$L^{b2}$- and *—CO—O-$L^{b4}$-CO—O-$L^{b3}$-, and much more preferred is *—CO—O-$L^{b2}$-, and especially preferred is *—CO—O-$L^{b2}$- in which $L^{b2}$ is a single bond or $-CH_2-$.

Examples of *—CO—O-$L^{b2}$- include *—CO—O— and *—CO—O—$CH_2$—. Examples of *—CO—O-$L^{b4}$-CO—O-$L^{b3}$- include *—CO—O—$CH_2$—CO—O—, *—CO—O—$(CH_2)_2$—O—, *—CO—O—$(CH_2)_3$—CO—O—, *—CO—$(CH_2)_4$—CO—O—, *—CO—O—$(CH_2)_6$—CO—O—, *—CO—O—$(CH_2)_8$—CO—O—, *—CO—O—$CH_2$—CH($CH_3$)—CO—O— and *—CO—O—$CH_2$—C($CH_3$)$_2$—CO—O—. Examples of *-$L^{b5}$-O—CO— include *—$CH_2$—O—CO—, *—$(CH_2)_2$—CO—, *—$(CH_2)_3$—O—CO—, *—$(CH_2)_4$—CO—, *—$(CH_2)_6$—O—CO— and *—$(CH_2)_8$—O—CO—. Examples of *-$L^{b7}$-O-$L^{b6}$- include *—$CH_2$—O—$CH_2$—. Examples of *—CO—O-$L^{b8}$-O— include *—CO—O—$CH_2$—O—, *—CO—O—$(CH_2)_2$—O—, *—CO—O—$(CH_2)_3$—O—, *—CO—O—$(CH_2)_4$—O— and *—CO—O—$(CH_2)_6$—O—. Examples of *—CO—O-$L^{b10}$-O-$L^{b9}$-CO—O— include the followings.

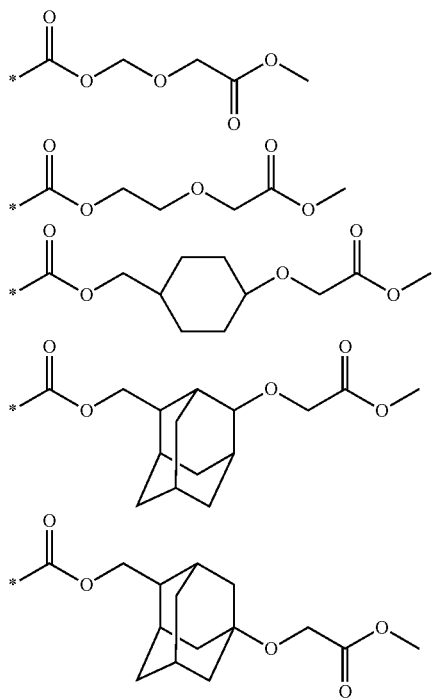

The saturated hydrocarbon group can have one or more substituents, and examples of the substituent include a halogen atom, a hydroxyl group, a carboxyl group, a C6-C18 aromatic hydrocarbon group, a C7-C21 aralkyl group such as a benzyl group, a phenethyl group, a phenylpropyl group, a trityl group, a naphthylmethyl group and a naphthyethyl group, a C2-C4 acyl group and a glycidyloxy group.

Examples of the substituent in Y include a halogen atom, a hydroxyl group, an oxo group, a glycidyloxy group, a C2-C4 acyl group, a C1-C12 alkoxy group, a C2-C7 alkoxycarbonyl group, a C1-C12 aliphatic hydrocarbon group, a C1-C12 hydroxy-containing aliphatic hydrocarbon group, a C3-C16 saturated cyclic hydrocarbon group, a C6-C18 aromatic hydrocarbon group, a C7-C21 aralkyl group and $-(CH_2)_{j2}-O-CO-R^{b1}-$ in which $R^{b1}$ represents a C1-C16 aliphatic hydrocarbon group, a C3-C16 saturated cyclic hydrocarbon group or a C6-C18 aromatic hydrocarbon group and j2 represents an integer of 0 to 4. Examples of the halogen atom include a fluorine atom, a chlorine atom, a bromine atom and an iodine atom. Examples of the acyl group include an acetyl group and a propionyl group, and examples of the alkoxy group include a methoxy group, an ethoxy group, a propoxy group, an isopropoxy group and a butoxy group. Examples of the alkoxycarbonyl group include a methoxycarbonyl group, an ethoxycarbonyl group, a propoxycarbonyl group, an isopropoxycarbonyl group and a butoxycarbonyl group. Examples of the aliphatic hydrocarbon group include the same as described above. Examples of the hydroxyl-containing aliphatic hydrocarbon group include a hydroxymethyl group. Examples of the C3-C16 saturated cyclic hydrocarbon group include the same as described above, and examples of the aromatic hydrocarbon group include a phenyl group, a naphthyl group, an anthryl group, a p-methylphenyl group, a p-tert-butylphenyl group and a p-adamantylphenyl group. Examples of the aralkyl group include a benzyl group, a phenethyl group, a phenylpropyl group, a trityl group, a naphthylmethyl group and a naphthylethyl group.

Examples of the C1-C18 aliphatic hydrocarbon group represented by Y include a methyl group, an ethyl group, a propyl group, an isopropyl group, a butyl group, an isobutyl group, a sec-butyl group, a tert-butyl group, a pentyl group, a neopentyl group, a 1-methylbutyl group, a 2-methylbutyl group, a 1,2-dimethylpropyl group, a 1-ethylpropyl group, a hexyl group, a 1-methylpentyl group, a heptyl group, an octyl group, a 2-ethylhexyl group, a nonyl group, a decyl group, an undecyl group and a dodecyl group, and a C1-C6 alkyl group is preferable. Examples of the C3-C18 saturated cyclic hydrocarbon group represented by Y include the groups represented by the formulae (Y1) to (Y26):

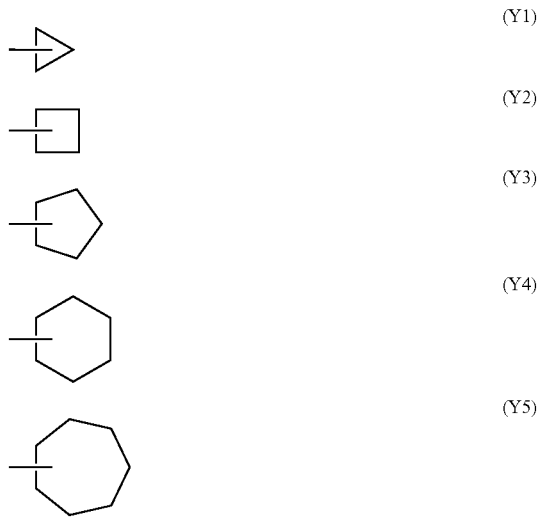

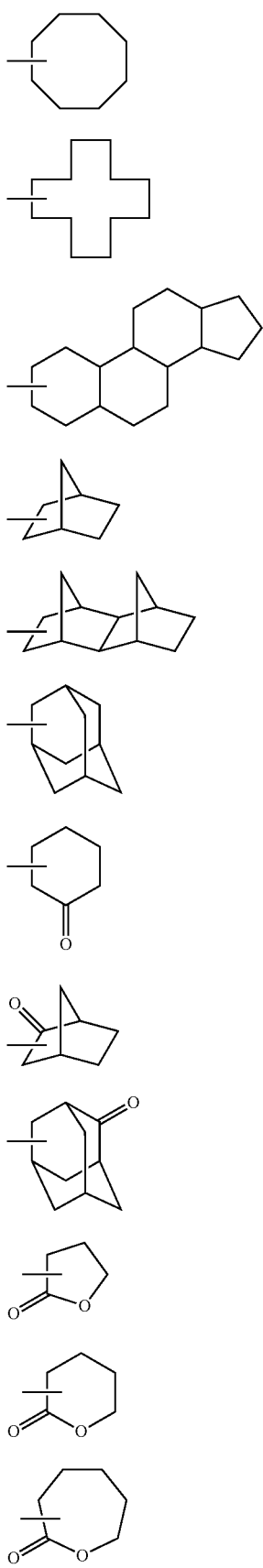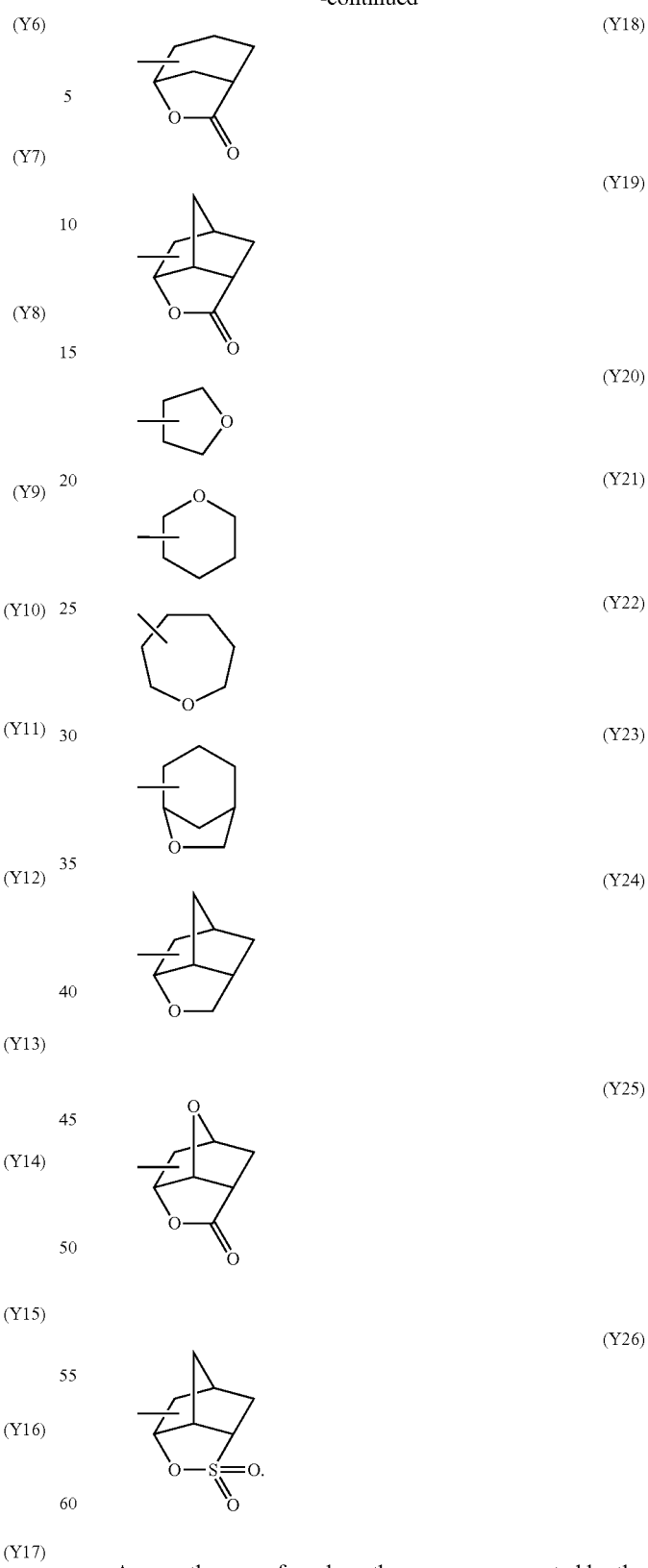
Among them, preferred are the groups represented by the formulae (Y1) to (Y19), and more preferred are the groups represented by the formulae (Y11), (Y14), (Y15) and (Y19). The groups represented by the formulae (Y11) and (Y14) are especially preferable.

Examples of Y having one or more substituents include the followings:

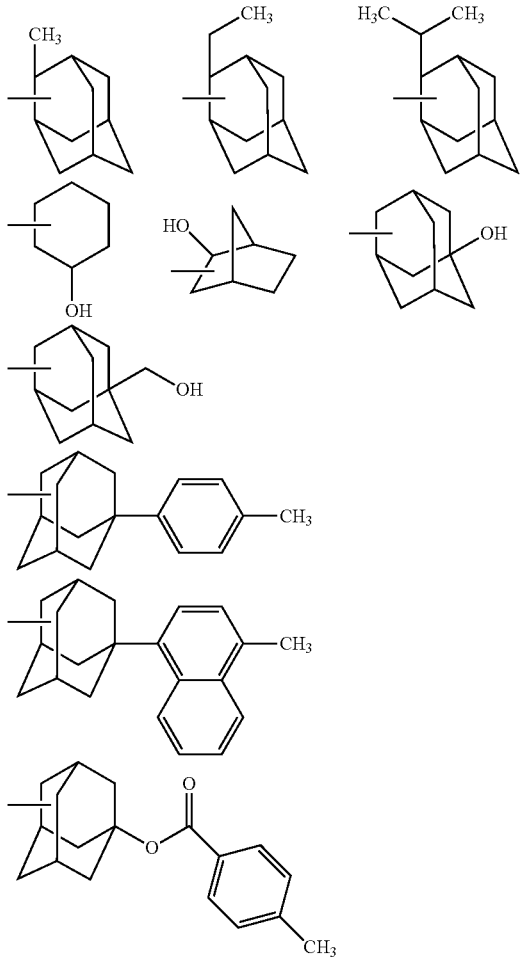

Y is preferably an adamantyl group which can have one or more substituents, and is more preferably an adamantyl group or an oxoadamantyl group.

Among the sulfonic acid anions of the acid generator represented by the formula (B1), preferred is a sulfonic acid anion having the group represented by *—CO—O—L$^{b2}$-, and more preferred are anions represented by the formulae (b1-1-1) to (b1-1-9).

(b1-1-1)

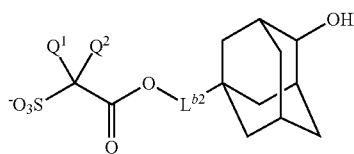

(b1-1-2)

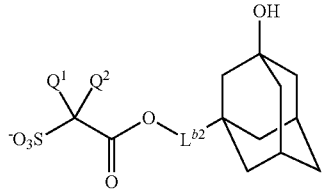

(b1-1-3)

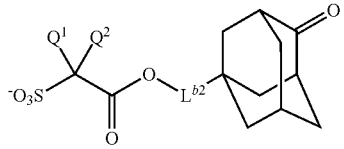

(b1-1-4)

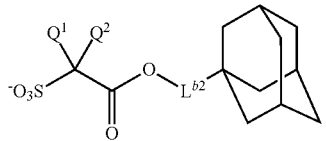

(b1-1-5)

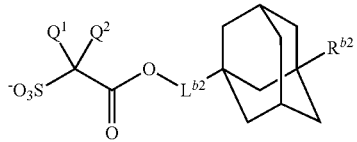

(b1-1-6)

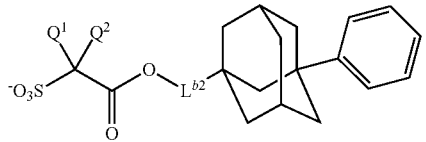

(b1-1-7)

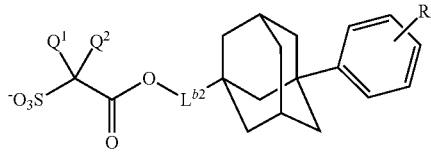

(b1-1-8)

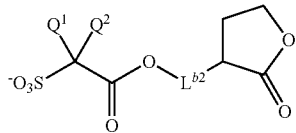

(b1-1-9)

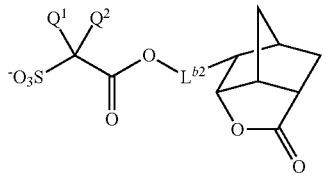

wherein $Q^1$, $Q^2$ and $L^{b2}$ are the same as defined above, and $R^{b2}$ and $R^{b3}$ each independently represent a C1-C4 aliphatic hydrocarbon group, preferably a methyl group.

Specific examples of the sulfonic acid anion include the followings.

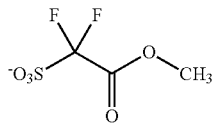

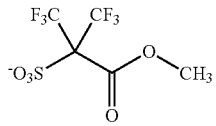

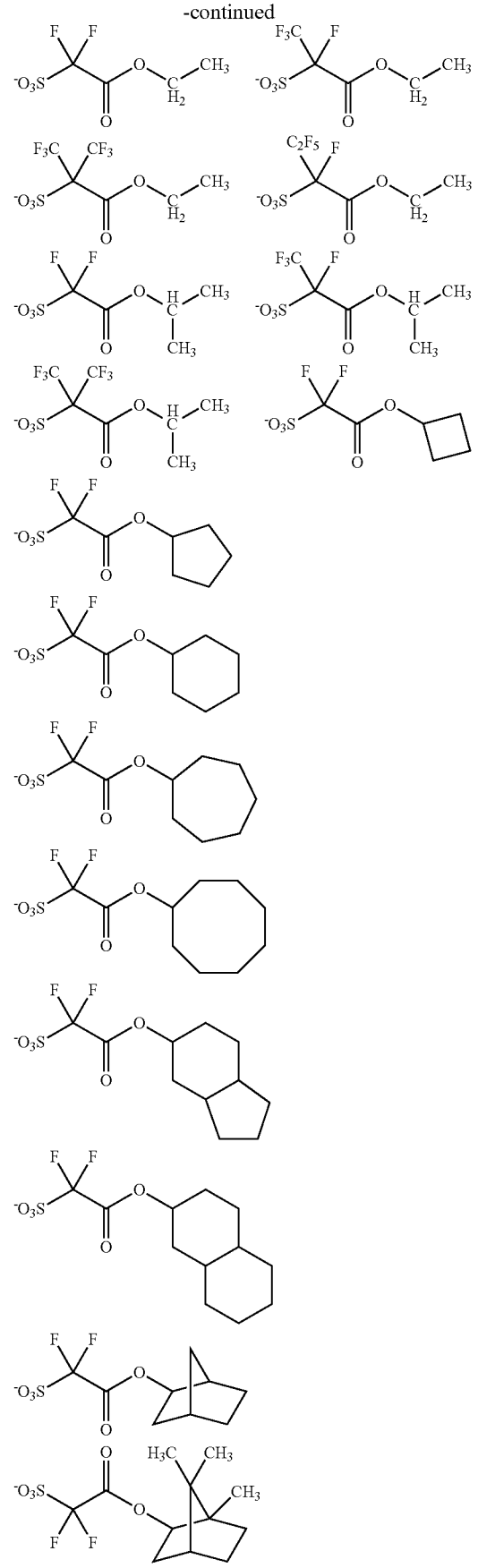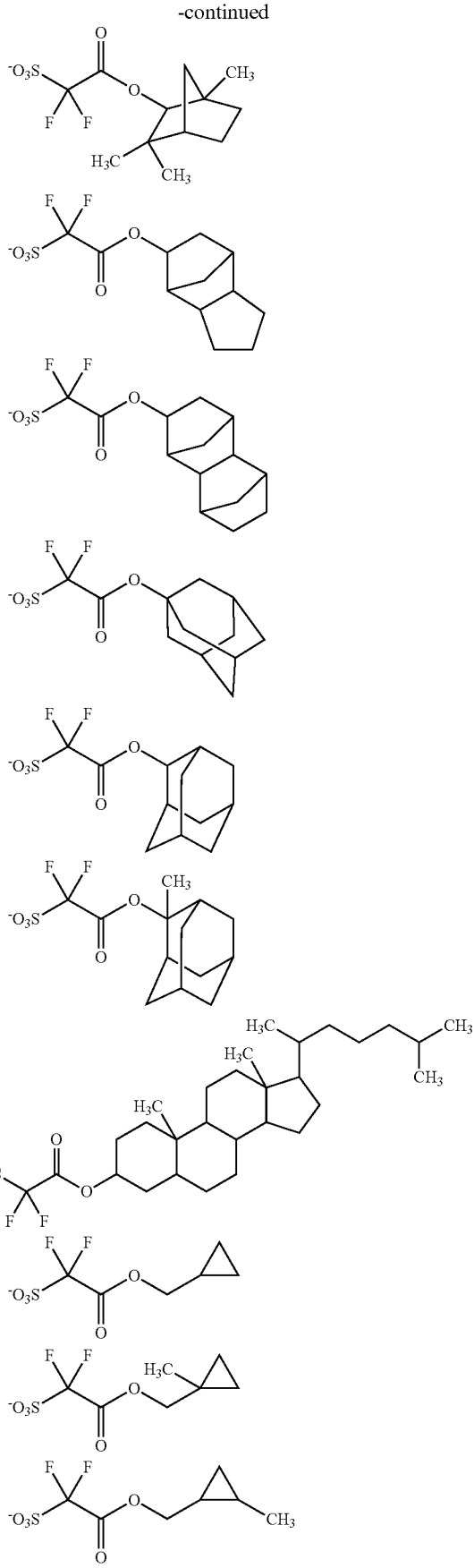

69
-continued
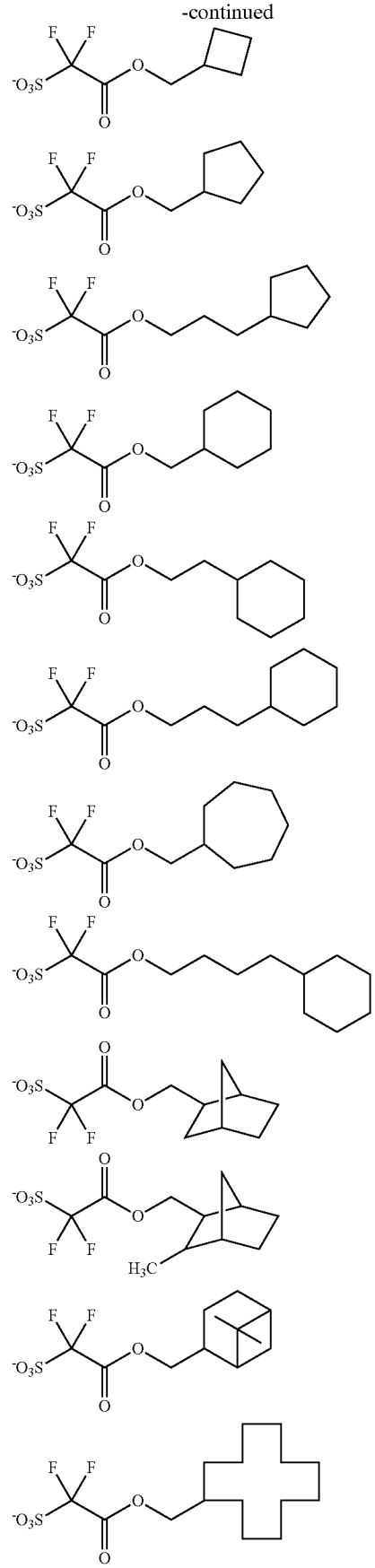
70
-continued
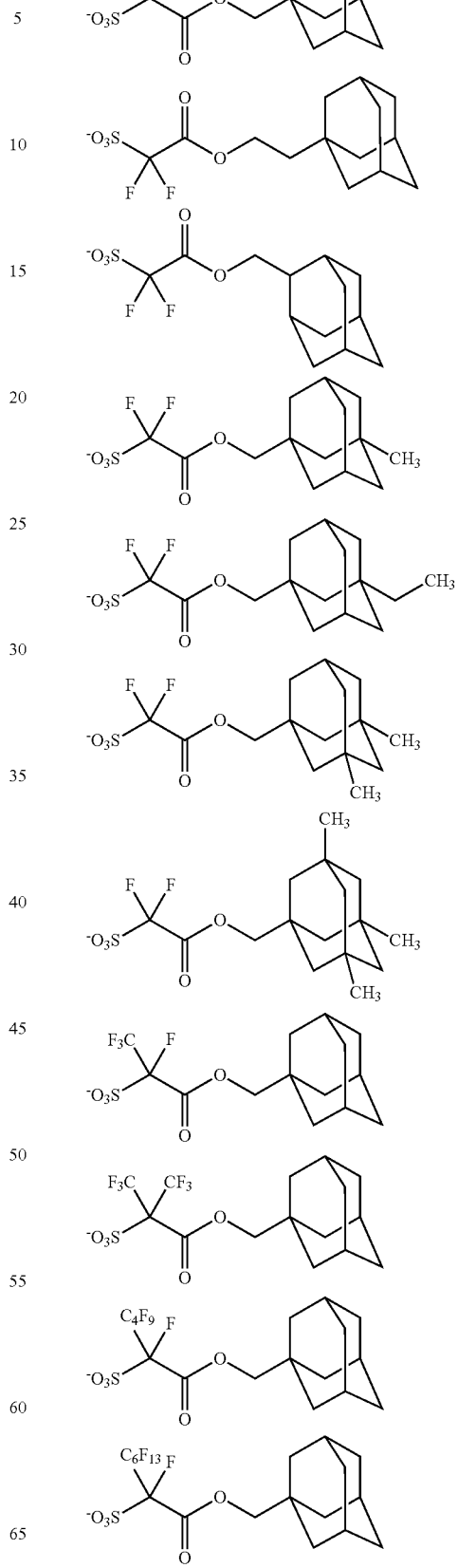

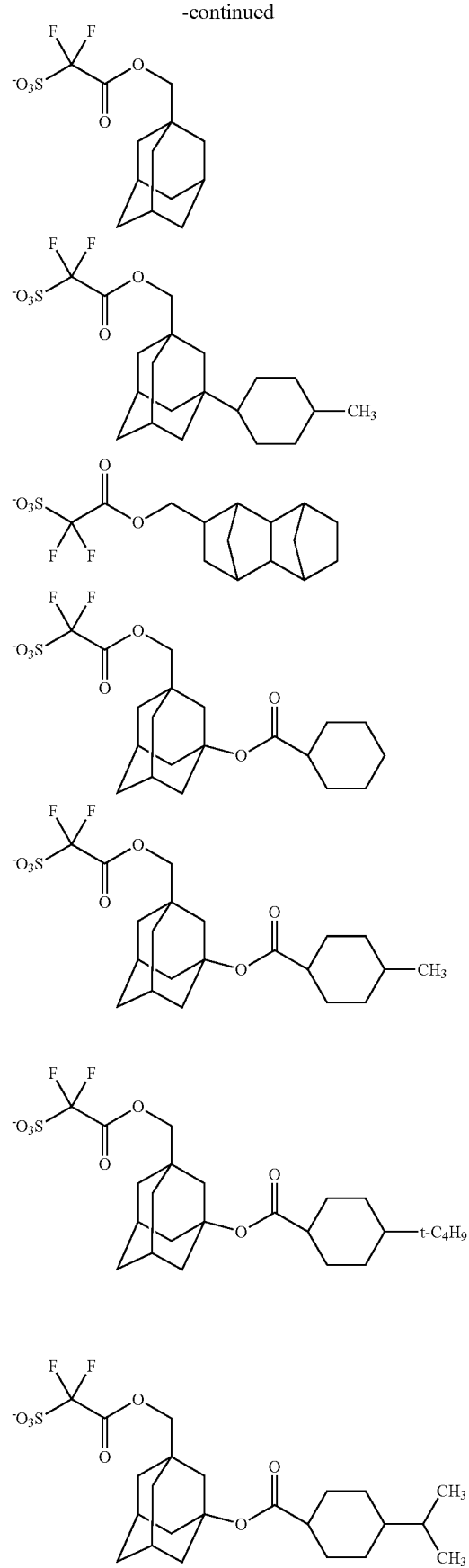
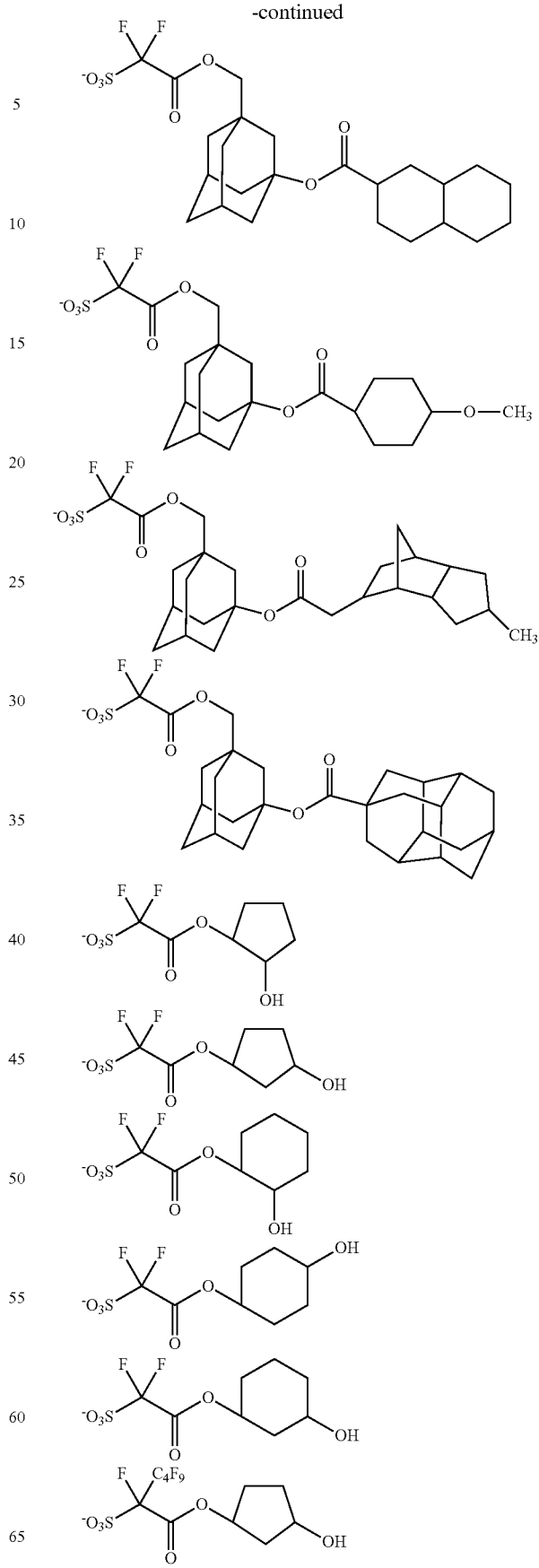

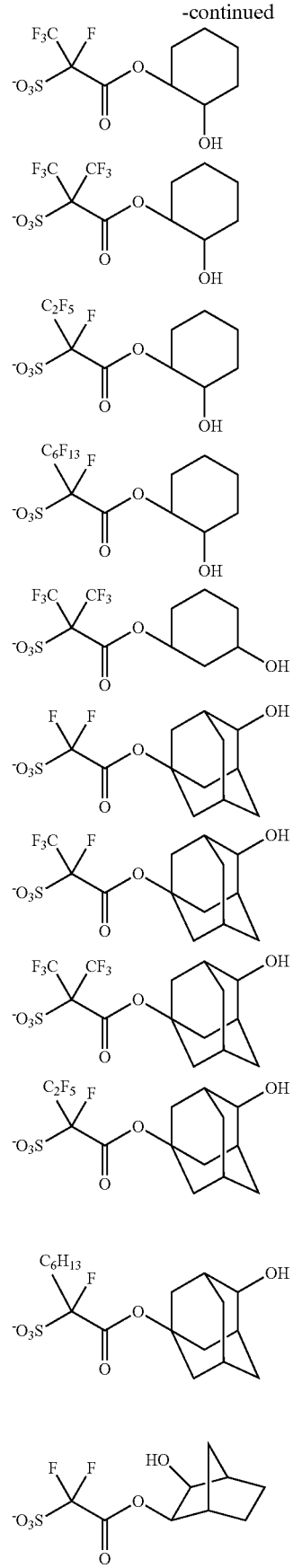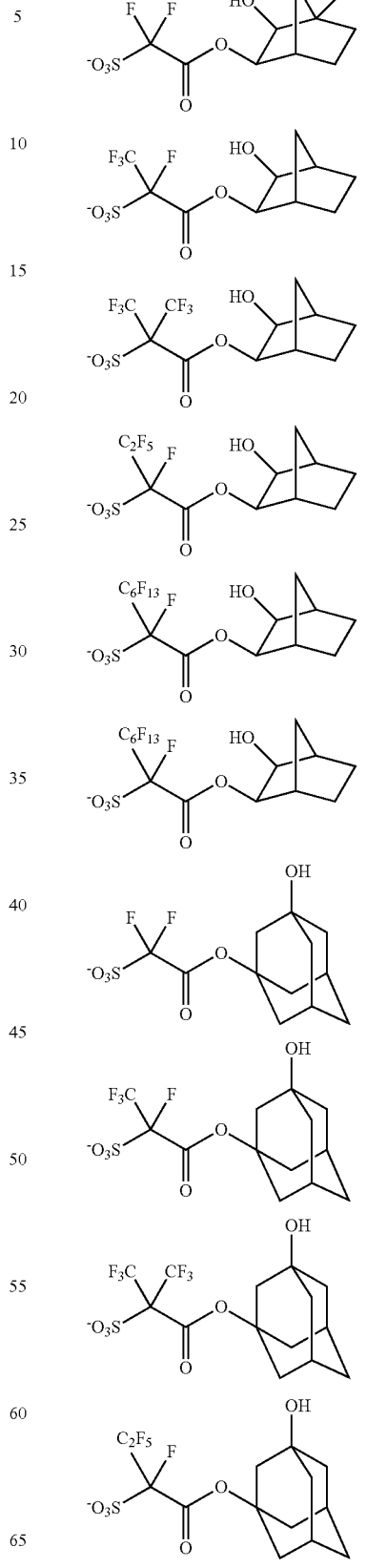

75
-continued
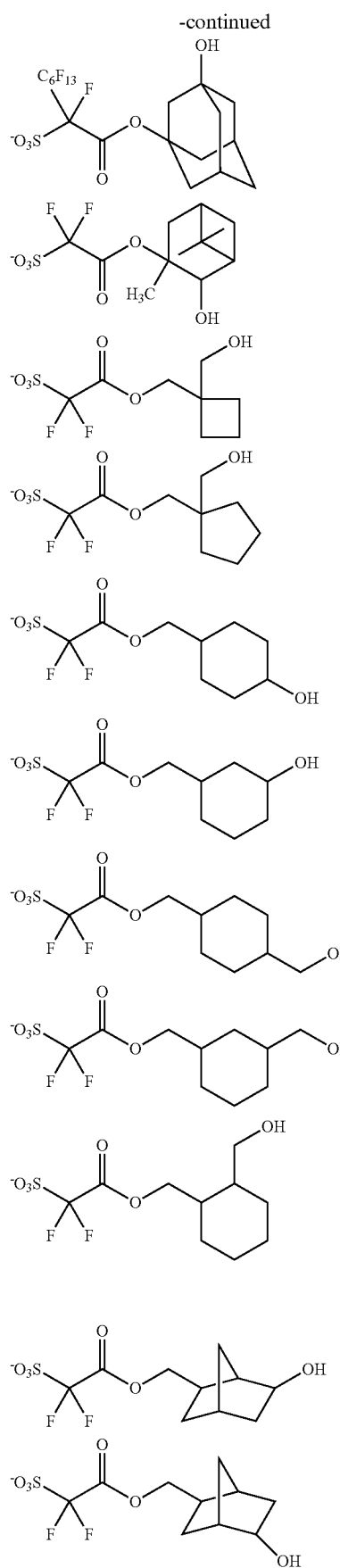
76
-continued
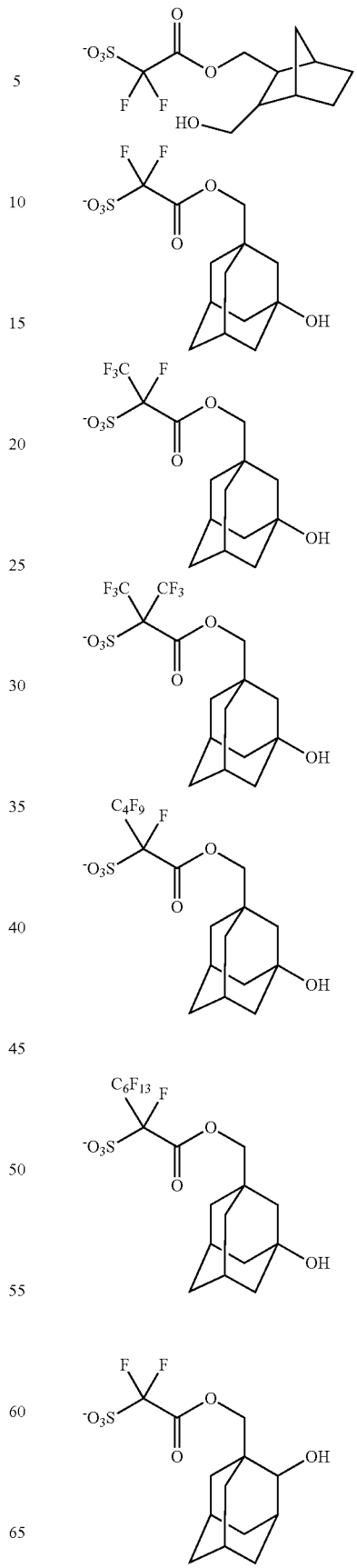

77
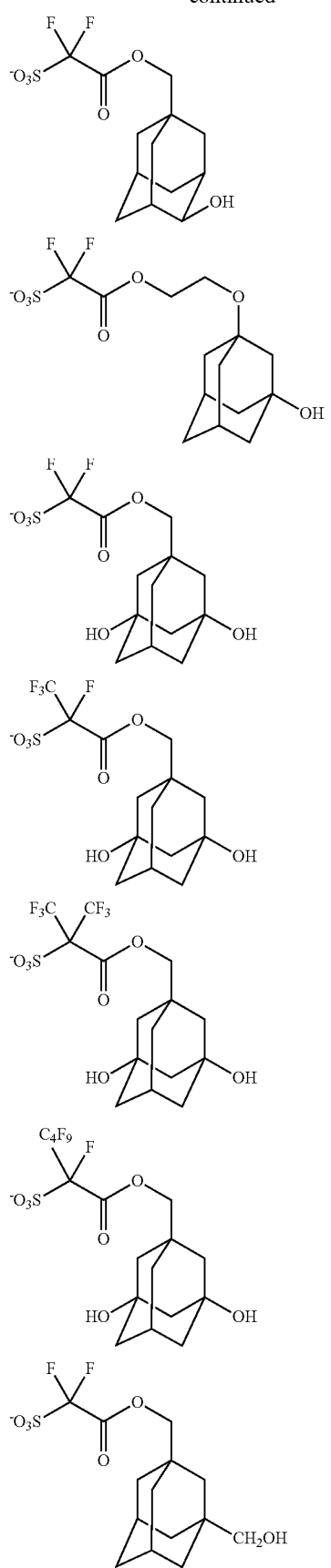
78
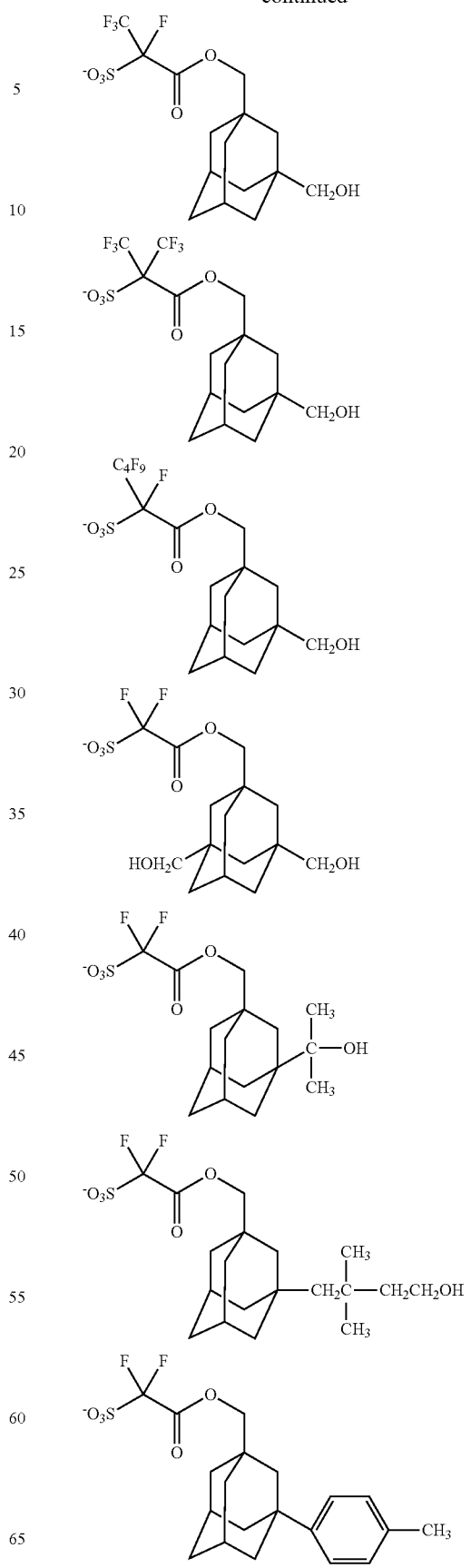

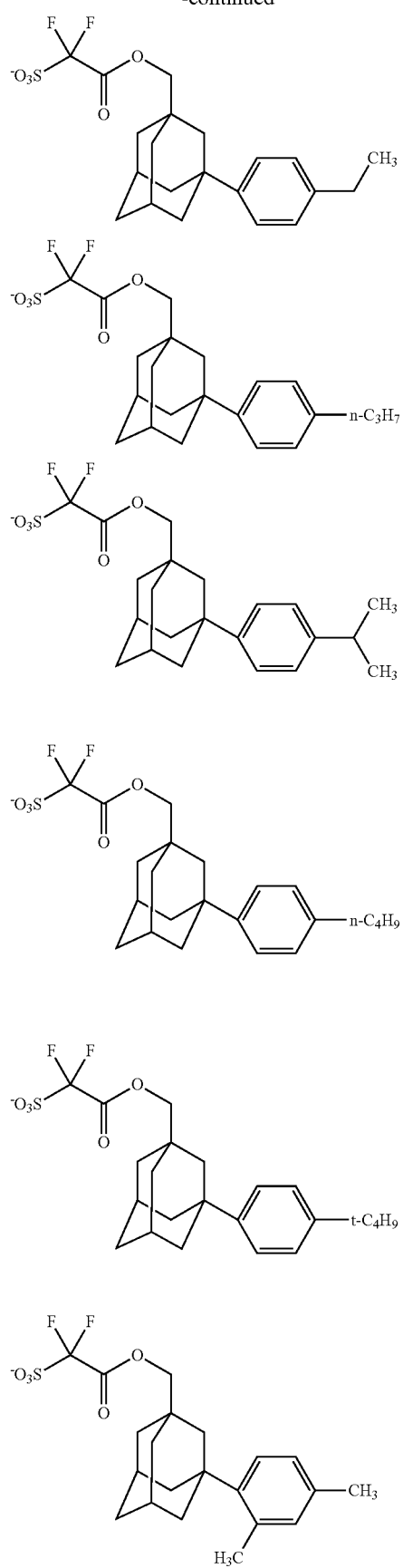
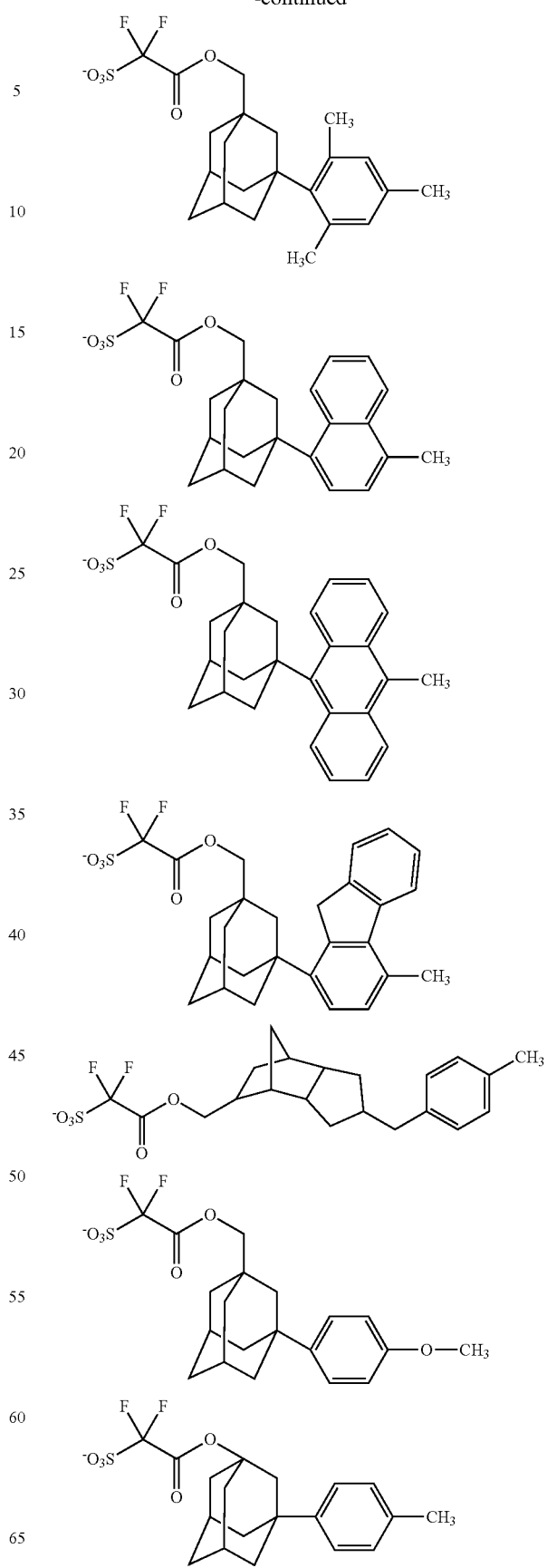

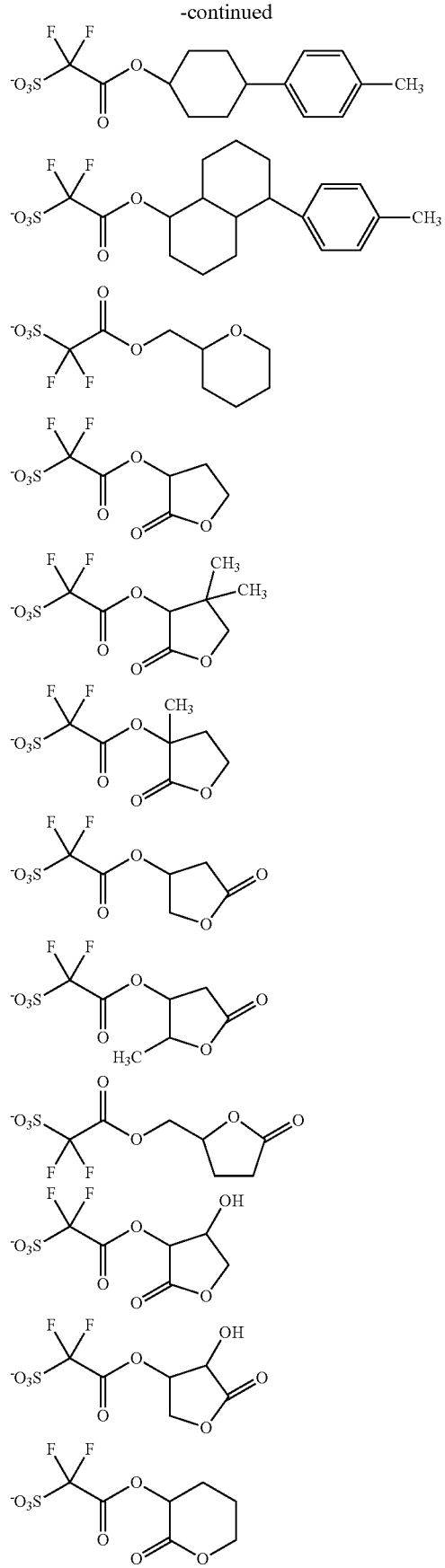
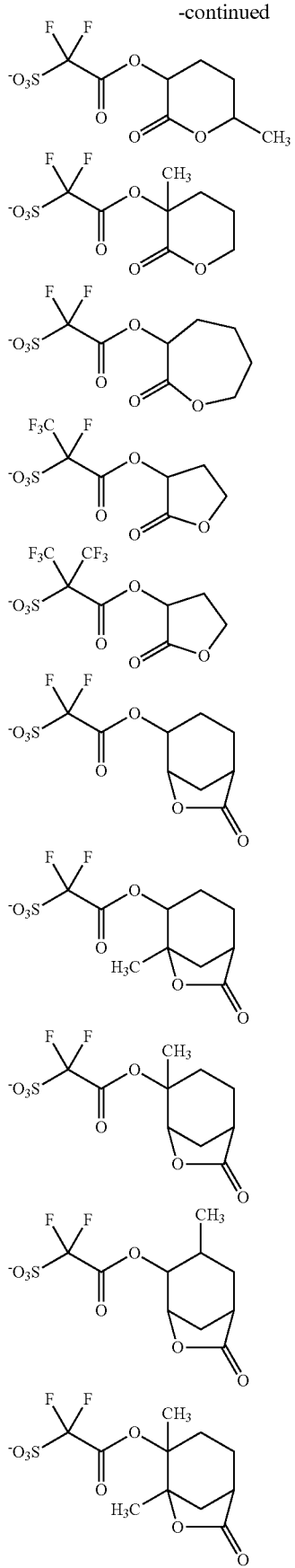

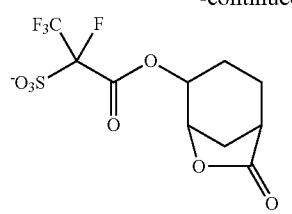
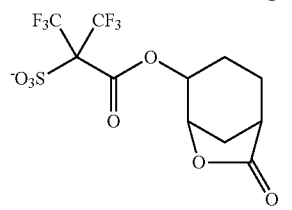
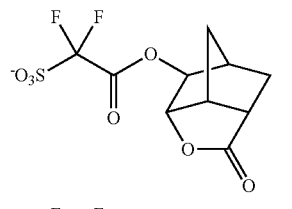
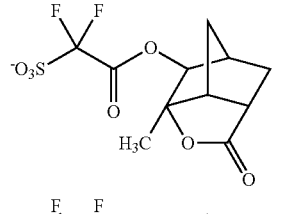
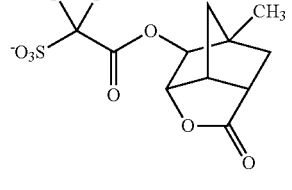
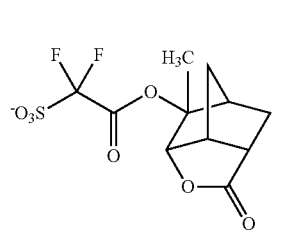
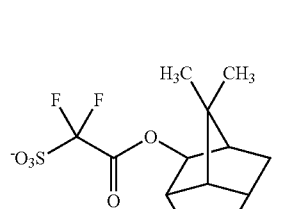
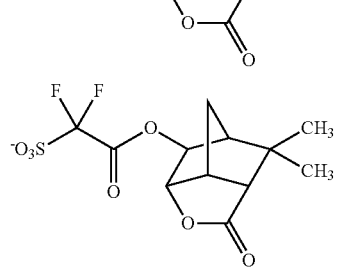
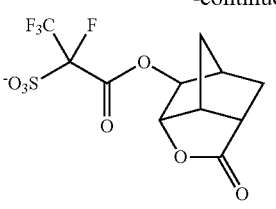
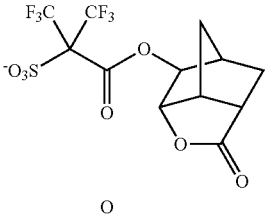
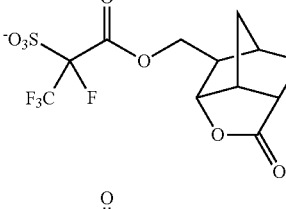
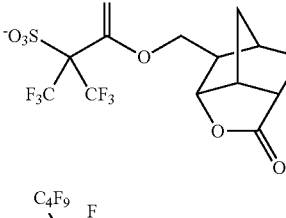
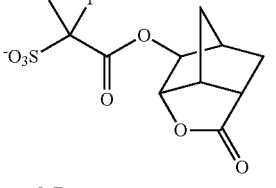
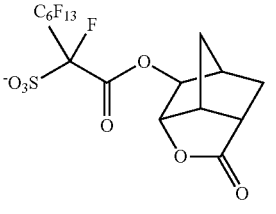
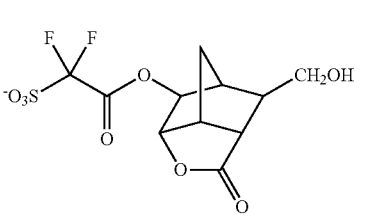
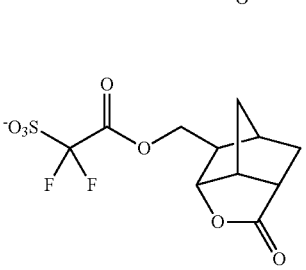

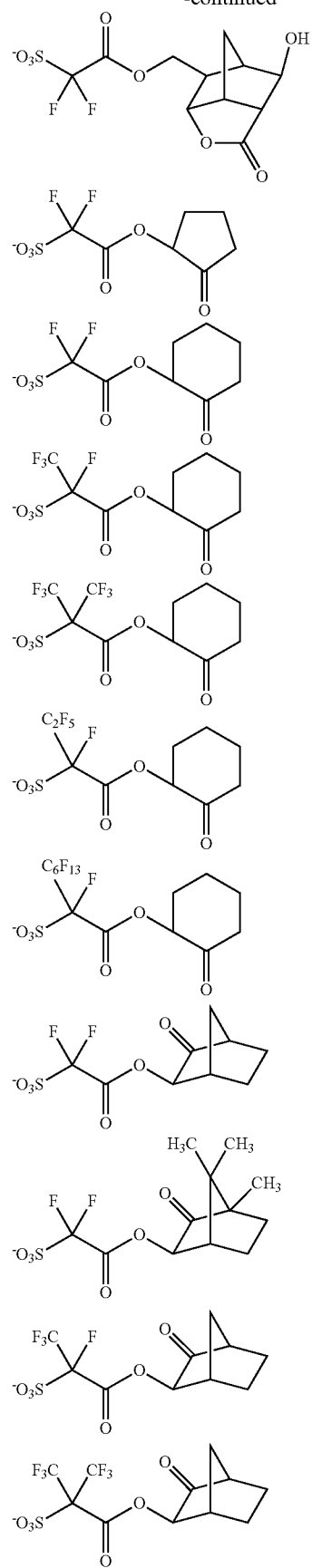
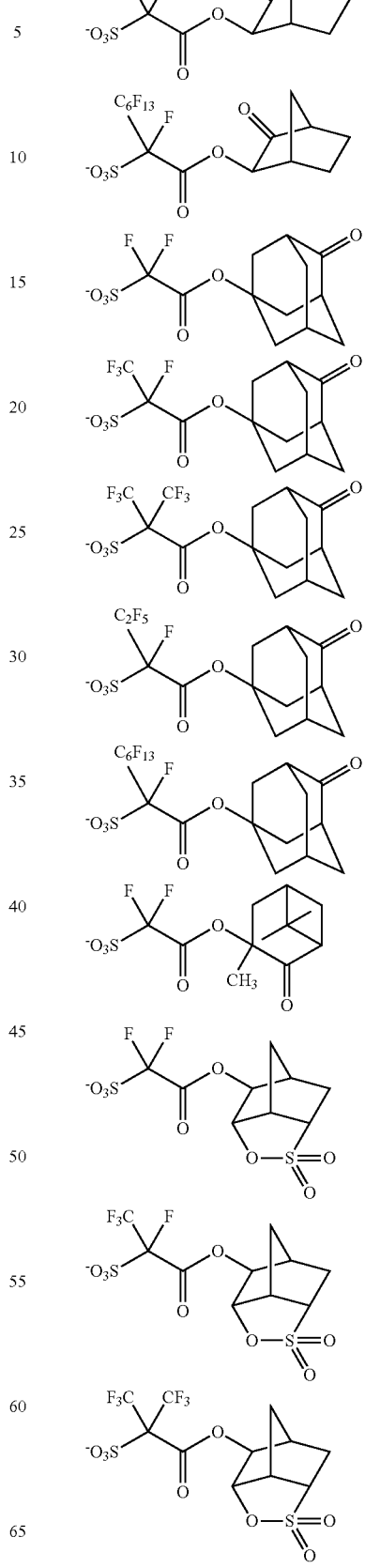

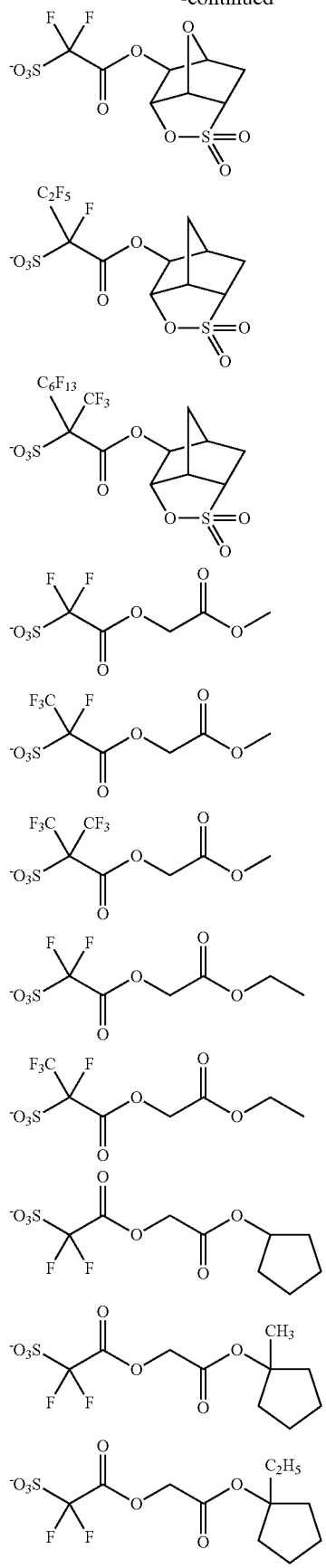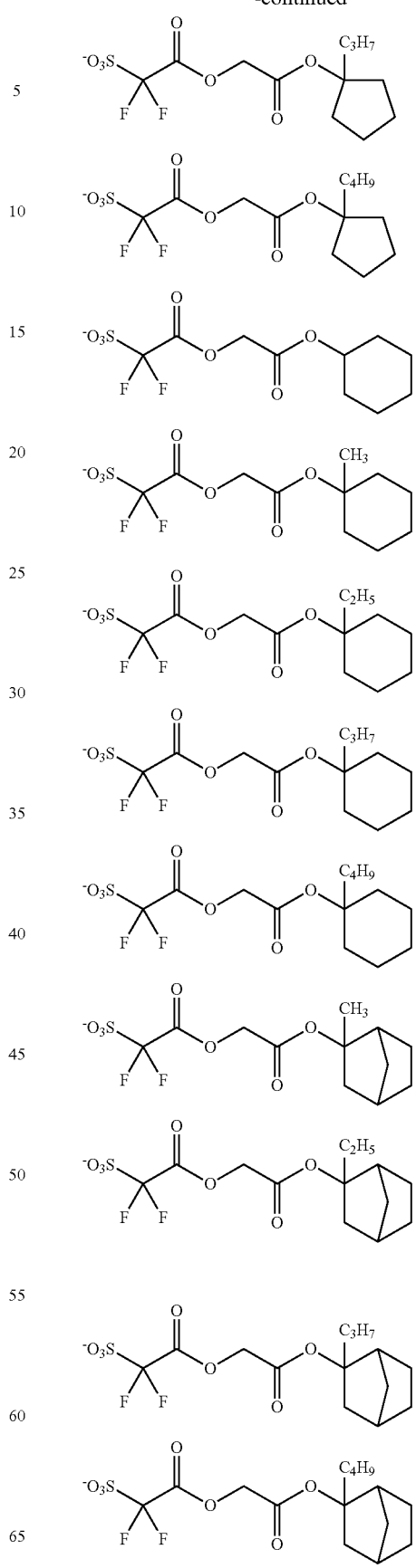

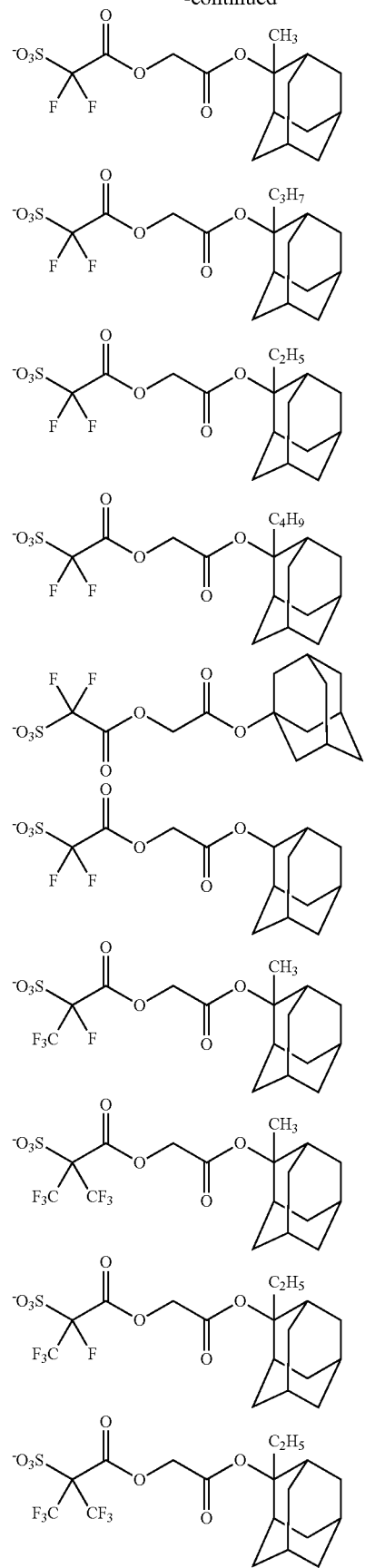
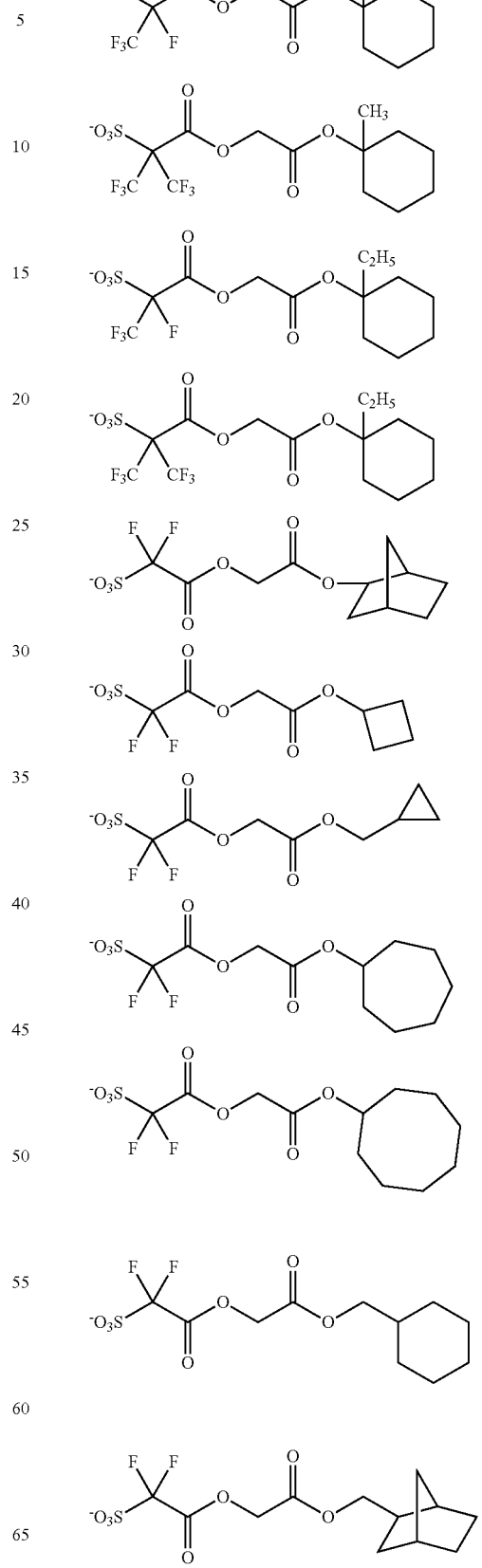

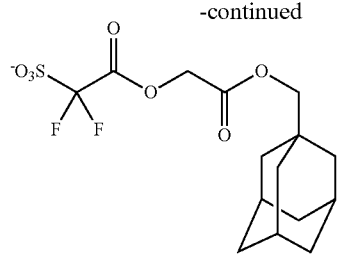
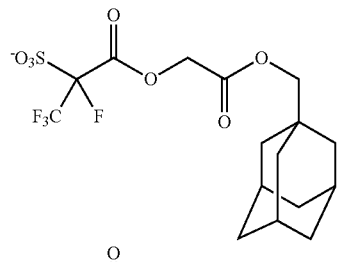
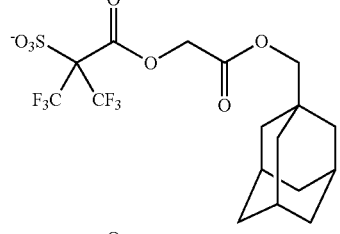
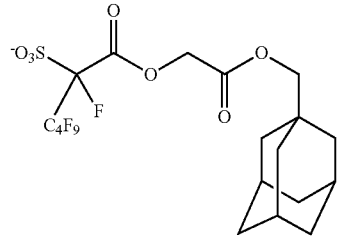
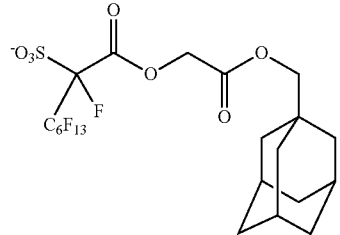
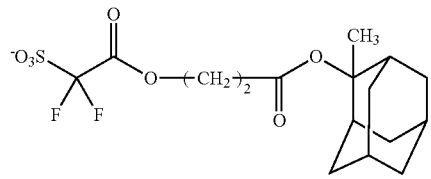
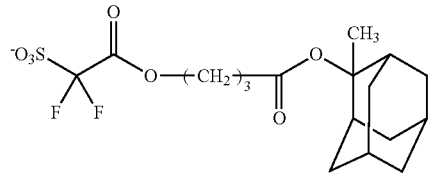
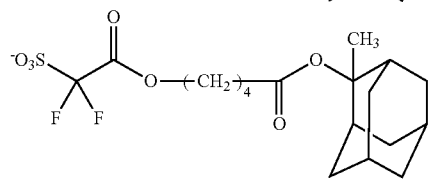
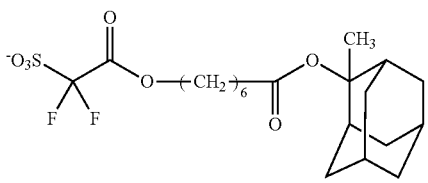
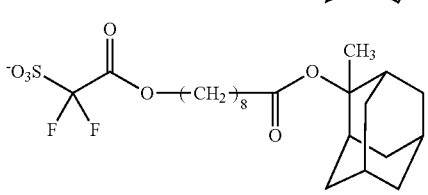
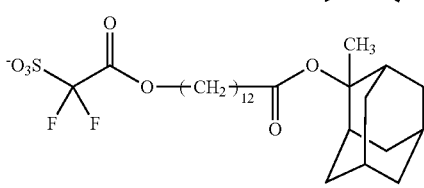
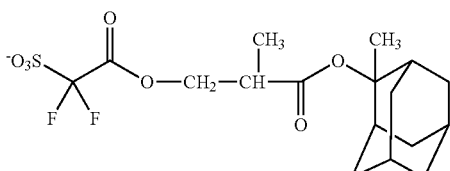
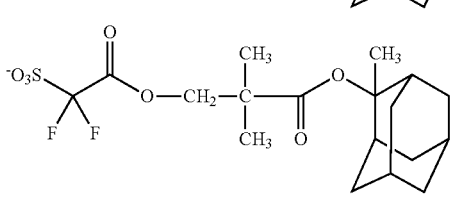
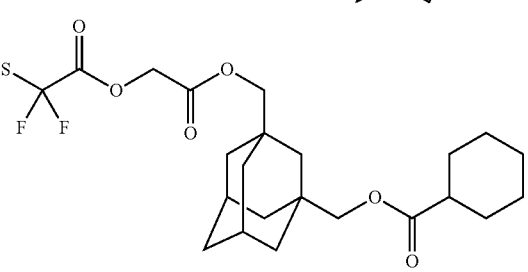
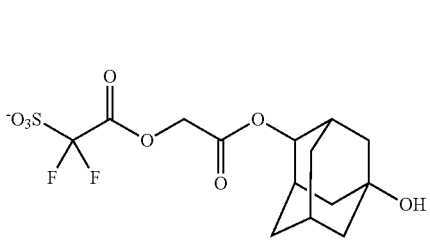
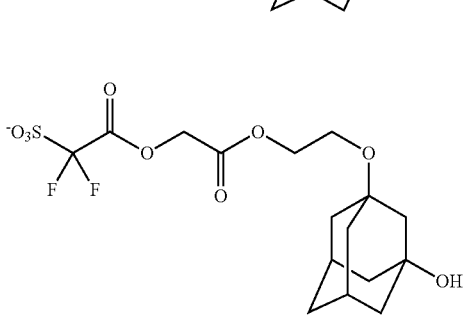

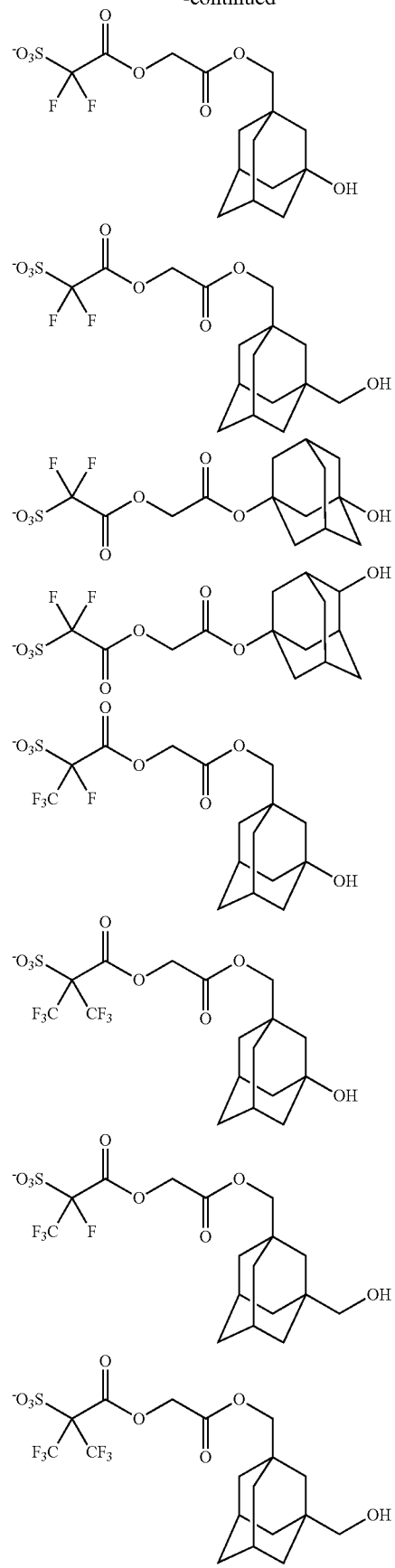
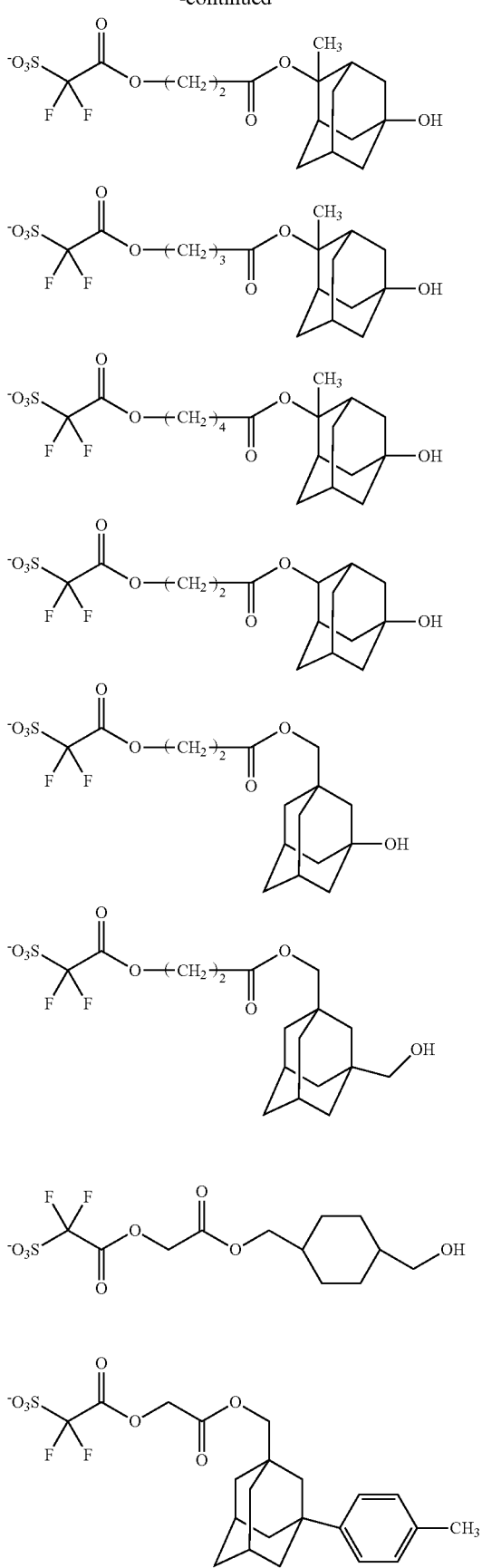

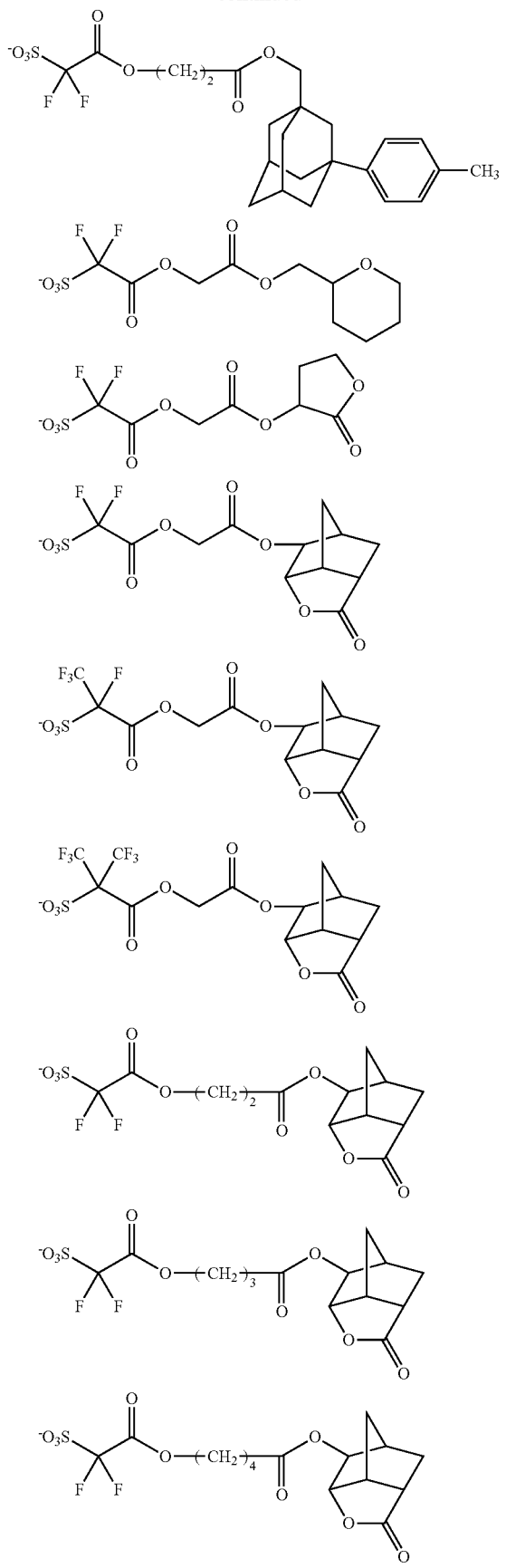
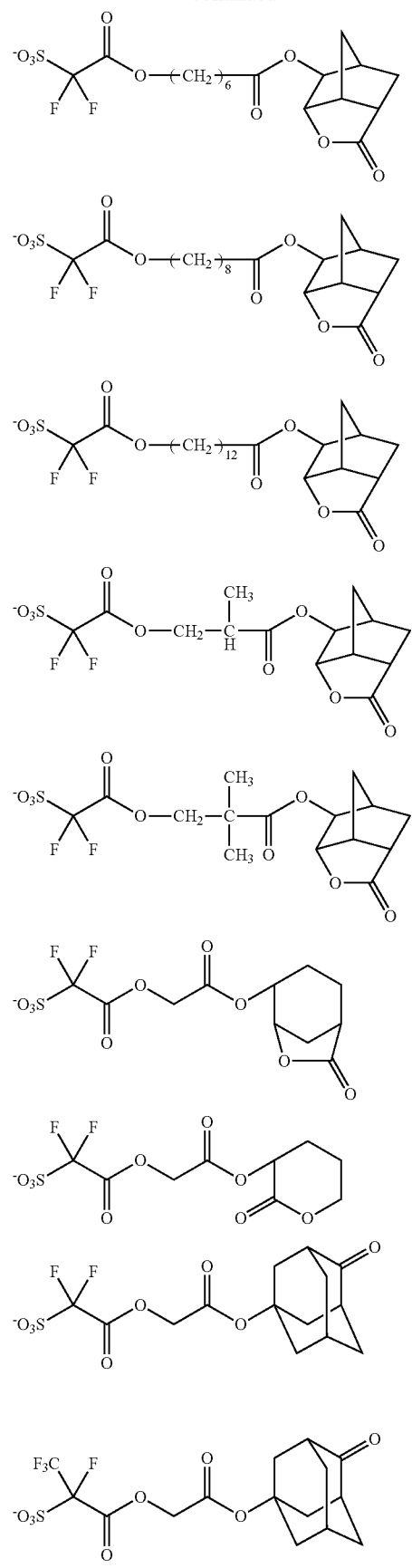

97
-continued
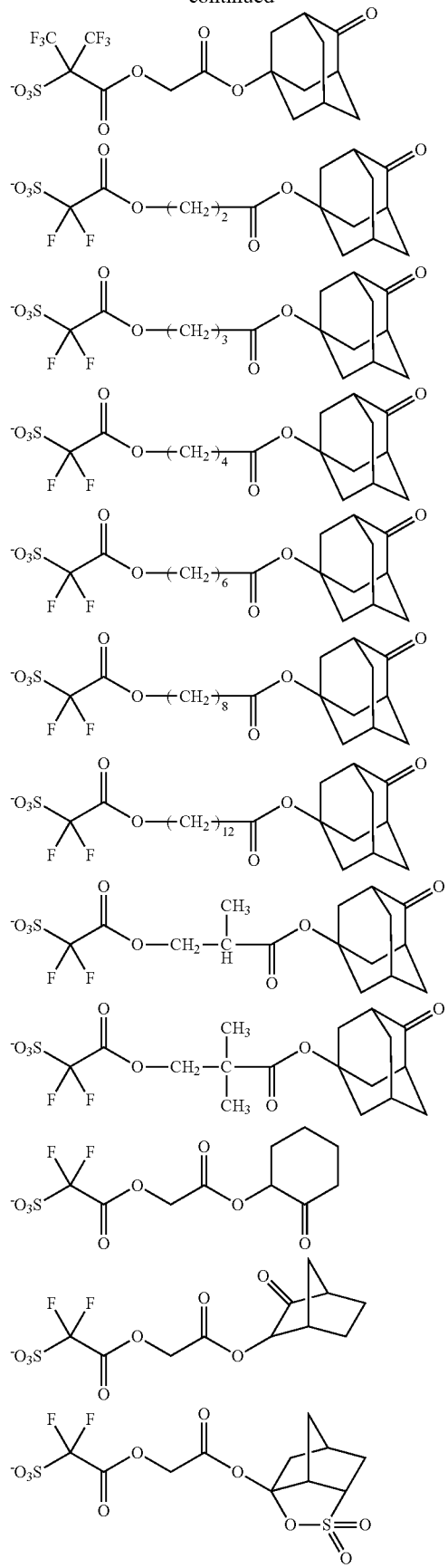
98
-continued
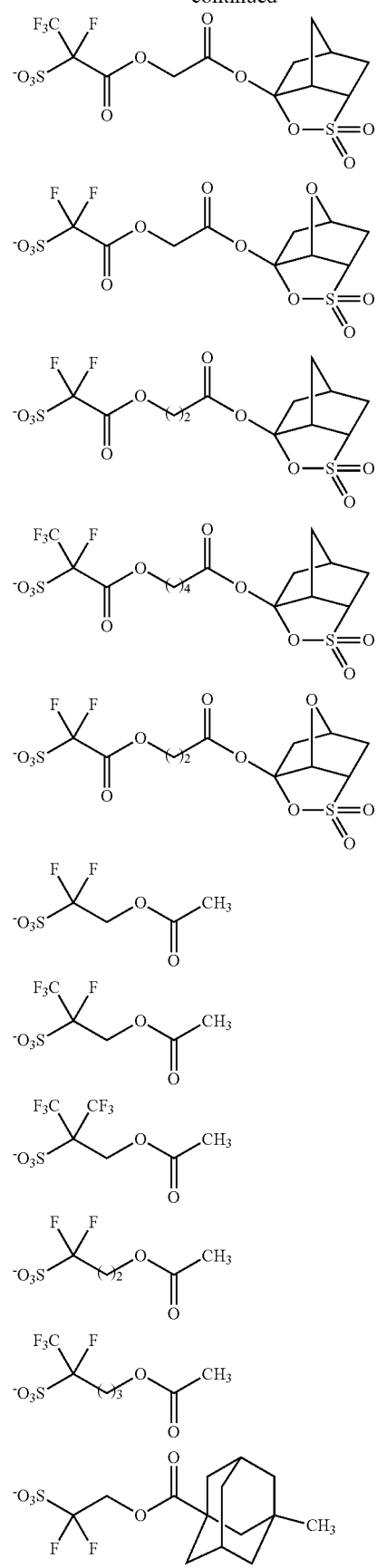

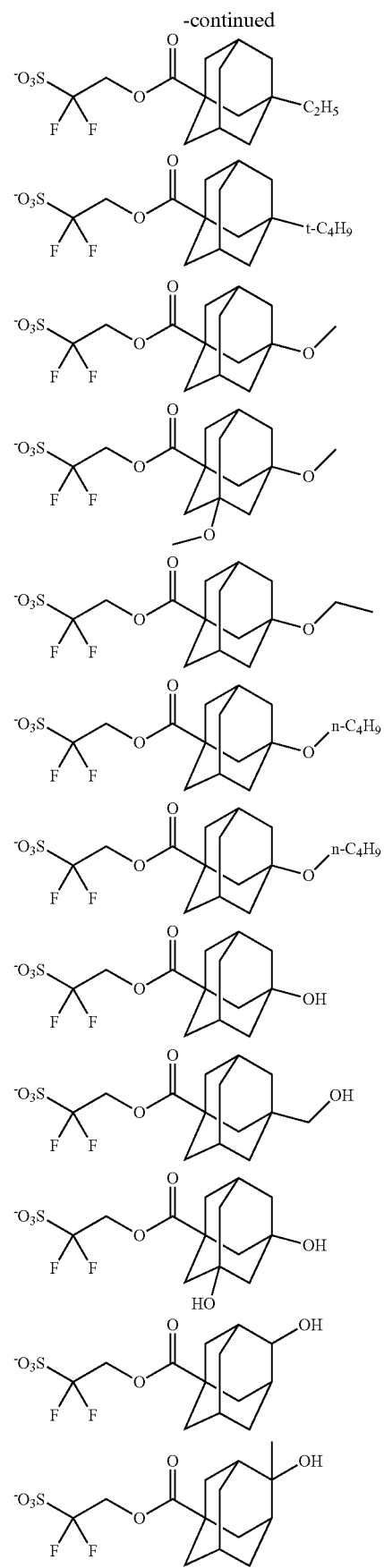
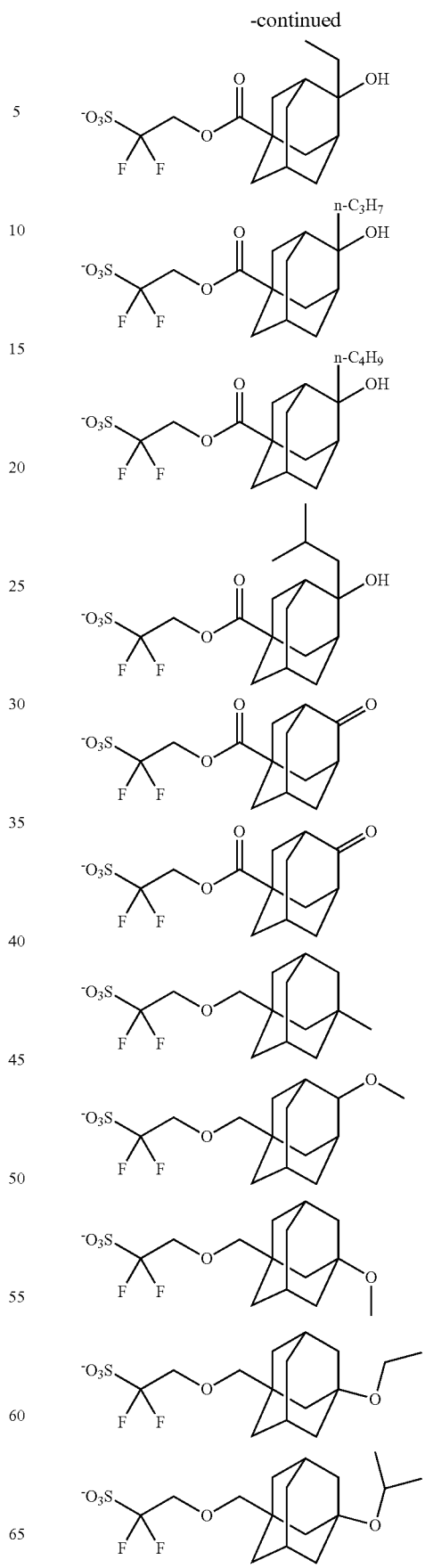

101
-continued
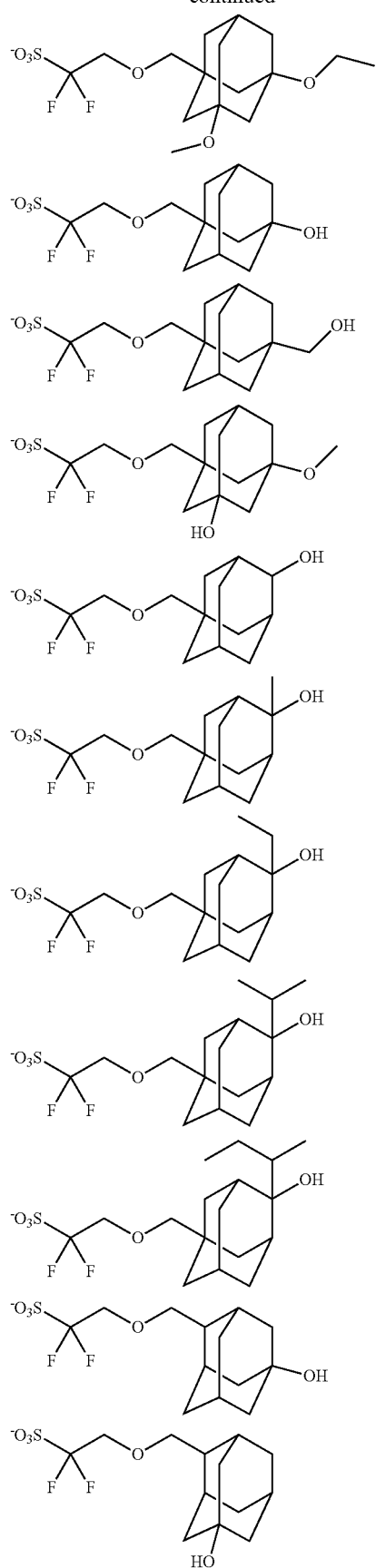
102
-continued
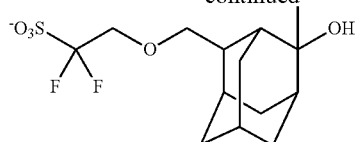
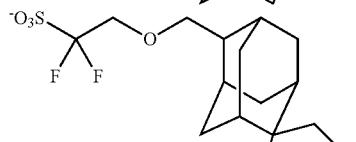
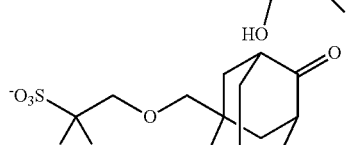
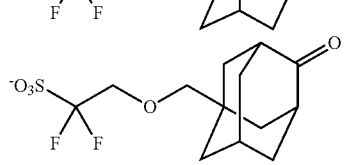
Among them, preferred are the following sulfonic anions.
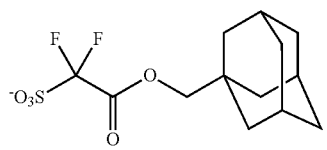
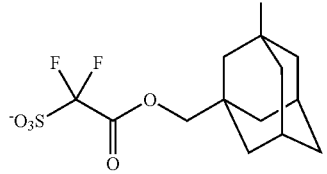
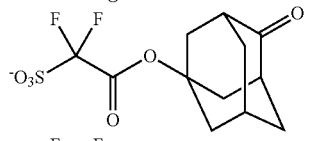
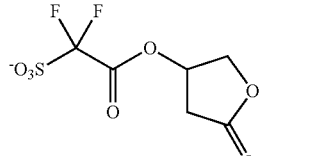
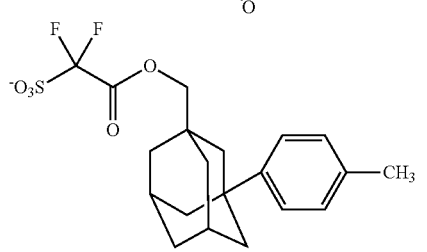
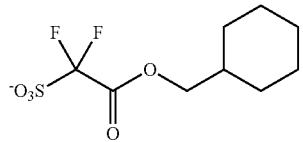

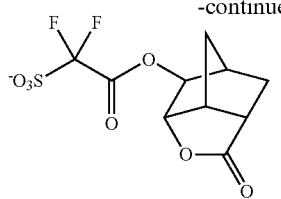

Examples of the cation part represented by $Z^+$ include an onium cation such as a sulfonium cation, an iodonium cation, an ammonium cation, a benzothiazolium cation and a phosphonium cation, and a sulfonium cation and an iodonium cation are preferable, and an arylsulfonium cation is more preferable.

Preferable examples of the cation part represented by $Z^+$ include the cations represented by the formulae (b2-1) to (b2-4):

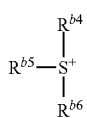
(b2-1)

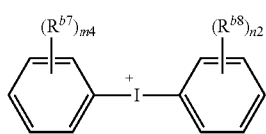
(b2-2)

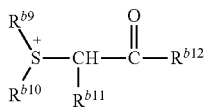
(b2-3)

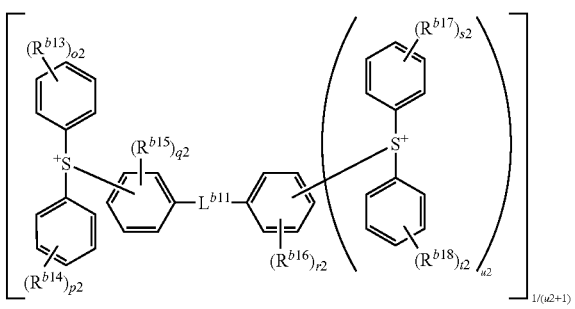
(b2-4)

wherein $R^{b4}$, $R^{b5}$ and $R^{b6}$ each independently represent a C1-C30 aliphatic hydrocarbon group which can have one or more substituents selected from the group consisting of a hydroxyl group, a C1-C12 alkoxy group and a C6-C18 aromatic hydrocarbon group, a C3-C36 saturated cyclic hydrocarbon group which can have one or more substituents selected from the group consisting of a halogen atom, a C2-C4 acyl group and a glycidyloxy group, or a C6-C18 aromatic hydrocarbon group which can have one or more substituents selected from the group consisting of a halogen atom, a hydroxyl group, a C1-C36 aliphatic hydrocarbon group, a C3-C36 saturated cyclic hydrocarbon group or a C1-C12 alkoxy group, $R^{b7}$ and $R^{b9}$ are independently in each occurrence a hydroxyl group, a C1-C12 aliphatic hydrocarbon group or a C1-C12 alkoxy group, m4 and n2 independently represents an integer of 0 to 5, $R^{b9}$ and $R^{b10}$ each independently represent a C1-C36 aliphatic hydrocarbon group or a C3-C36 saturated cyclic hydrocarbon group, or $R^{b9}$ and $R^{b10}$ are bonded to form a C2-C11 divalent acyclic hydrocarbon group which forms a ring together with the adjacent $S^+$, and one or more —$CH_2$— in the divalent acyclic hydrocarbon group may be replaced by —CO—, —O— or —S—,
and $R^{b11}$ represents a hydrogen atom, a C1-C36 aliphatic hydrocarbon group, a C3-C36 saturated cyclic hydrocarbon group or a C6-C18 aromatic hydrocarbon group, $R^{b12}$ represents a C1-C12 aliphatic hydrocarbon group, a C6-C18 saturated cyclic hydrocarbon group or a C6-C18 aromatic hydrocarbon group and the aromatic hydrocarbon group can have one or more substituents selected from the group consisting of a C1-C12 aliphatic hydrocarbon group, a C1-C12 alkoxy group, a C3-C18 saturated cyclic hydrocarbon group and an C2-C13 acyloxy group, or $R^{b11}$ and $R^{b12}$ are bonded each other to form a C1-C10 divalent acyclic hydrocarbon group which forms a 2-oxocycloalkyl group together with the adjacent —CHCO—, and one or more —$CH_2$— in the divalent acyclic hydrocarbon group may be replaced by —CO—, —O— or —S—, and $R^{b13}$, $R^{b14}$, $R^{b15}$, $R^{b17}$ and $R^{b18}$ each independently represent a hydroxyl group, a C1-C12 aliphatic hydrocarbon group or a C1-C12 alkoxy group, $L^{b11}$ represents —S— or —O— and o2, p2, s2 and t2 each independently represents an integer of 0 to 5, q2 and r2 each independently represents an integer of 0 to 4, and u2 represents 0 or 1.

The aliphatic hydrocarbon group represented by $R^{b9}$ to $R^{b11}$ has preferably 1 to 12 carbon atoms. The saturated cyclic hydrocarbon group represented by $R^{b9}$ to $R^{b11}$ has preferably 3 to 18 carbon atoms and more preferably 4 to 12 carbon atoms.

Examples of the aliphatic hydrocarbon group, the saturated cyclic hydrocarbon group and the aromatic hydrocarbon group include the same as described above. Preferable examples of the aliphatic hydrocarbon group include a methyl group, an ethyl group, a propyl group, an isopropyl group, a butyl group, a sec-butyl group, a tert-butyl group, a pentyl group, a hexyl group, an octyl group and a 2-ethylhexyl group. Preferable examples of the saturated cyclic hydrocarbon group include a cyclopropyl group, a cyclobutyl group, a cyclopentyl group, a cyclohexyl group, a cycloheptyl group, a cyclodecyl group, a 2-alkyl-2-adamantyl group, a 1-(1-adamantyl)-1-alkyl group and an isobornyl group. Preferable examples of the aromatic group include a phenyl group, a 4-methylphenyl group, a 4-ethylphenyl group, a 4-tert-butylphenyl group, a 4-cyclohexylphenyl group, a 4-methoxyphenyl group, a biphenyl group and a naphthyl group. Examples of the aliphatic hydrocarbon group having an aromatic hydrocarbon group include a benzyl group. Examples of the alkoxy group include a methoxy group, an ethoxy group, a propoxy group, an isopropoxy group, a butoxy group, a sec-butoxy group, a tert-butoxy group, a pentyloxy group, a hexyloxy group, a heptyloxy group, an octyloxy group, a 2-ethylhexyloxy group, a nonyloxy group, a decyloxy group, an undecyloxy group and a dodecyloxy group.

Examples of the C3-C12 divalent acyclic hydrocarbon group formed by bonding $R^{b9}$ and $R^{b10}$ include a trimethylene group, a tetramethylene group and a pentamethylene group. Examples of the ring group formed together with the adjacent $S^+$ and the divalent acyclic hydrocarbon group include a thiolan-1-ium ring (tetrahydrothiphenium ring), a thian-1-ium ring and a 1,4-oxathian-4-ium ring. A C3-C7 divalent acyclic hydrocarbon group is preferable.

Examples of the C1-C10 divalent acyclic hydrocarbon group formed by bonding $R^{b11}$ and $R^{b12}$ include a methylene group, an ethylene group, a trimethylene group, a tetramethylene group and a pentamethylene group and examples of the ring group include the followings.

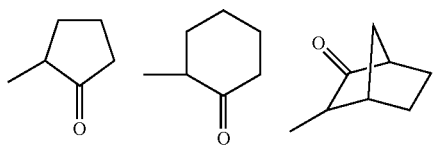

Among the above-mentioned cations, the cation represented by the formula (b2-1) is preferable, and the cation represented by the formula (b2-1-1) is more preferable and a triphenylsulfonium cation is especially preferable.

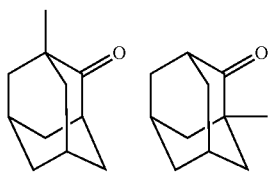
(b2-1-1)

wherein $R^{b19}$, $R^{b20}$ and $R^{b21}$ are independently in each occurrence a hydroxyl group, a C1-C36 aliphatic hydrocarbon group, a C3-C36 saturated cyclic hydrocarbon group or a C1-C12 alkoxy group, and one or more hydrogen atoms in the aliphatic hydrocarbon group can be replaced by a hydroxyl group, a C1-C12 alkoxy group or a C6-C18 aromatic hydrocarbon group, one or more hydrogen atoms of the saturated cyclic hydrocarbon group can be replaced by a halogen atom, a C2-C4 acyl group or a glycidyloxy group, and v2, w2 and x2 independently each represent an integer of 0 to 5. The aliphatic hydrocarbon group preferably has 1 to 12 carbon atoms, and the saturated cyclic hydrocarbon group preferably has 4 to 36 carbon atoms, and it is preferred that v2, w2 and x2 independently each represent 0 or 1. It is preferred that $R^{b19}$, $R^{b20}$ and $R^{b21}$ are independently halogen atom (preferably a fluorine atom), a hydroxyl group, a C1-C12 alkyl group or a C1-C12 alkoxy group.

Examples of the cation represented by the formula (b2-1) include the followings.

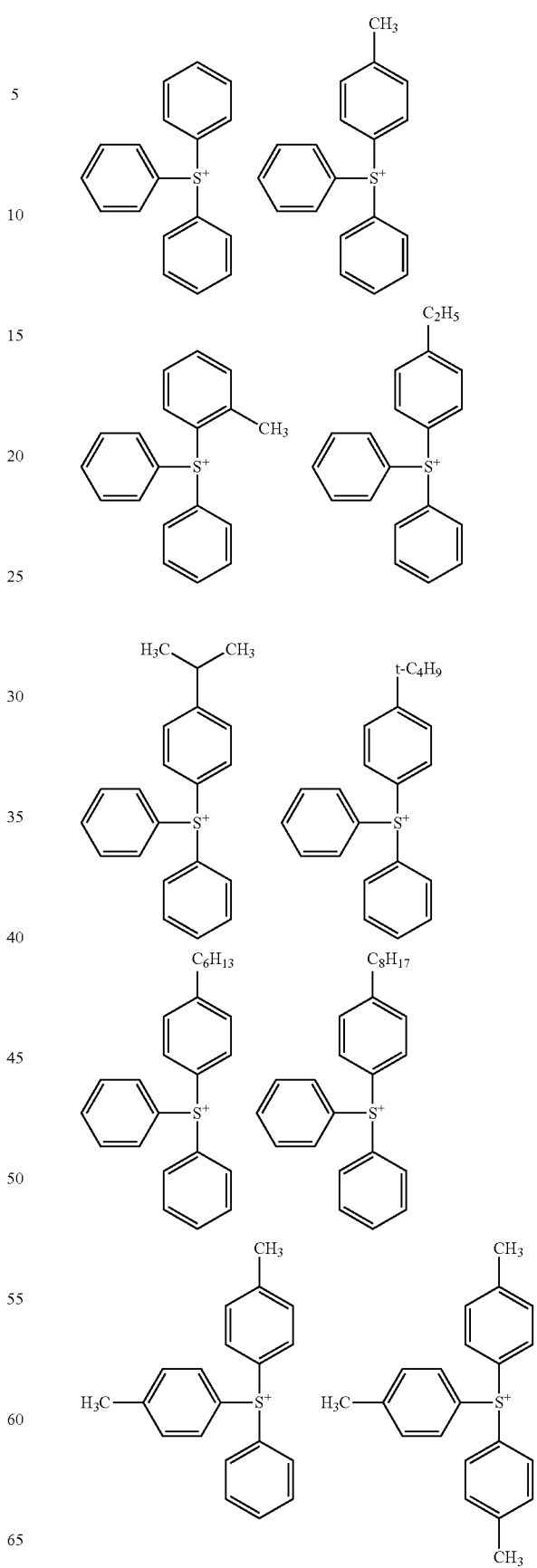

-continued
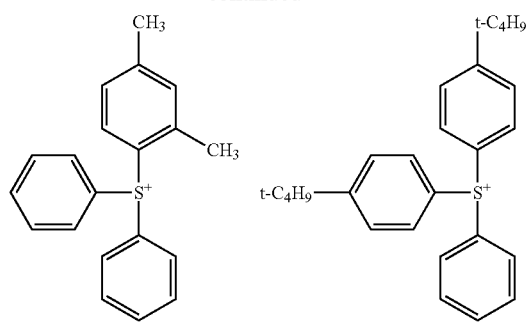
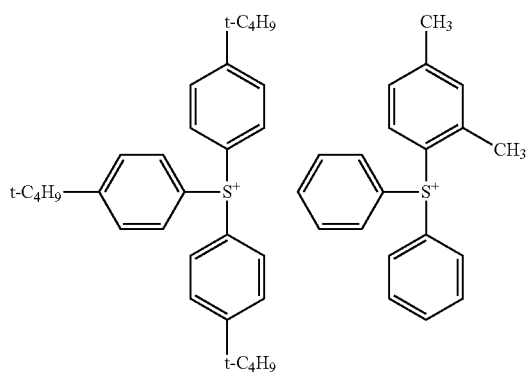
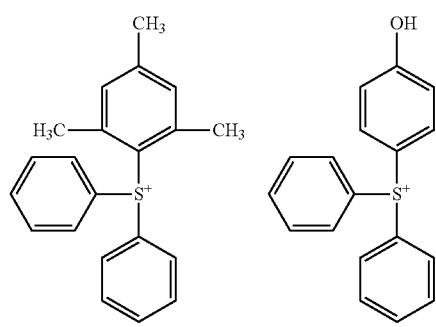
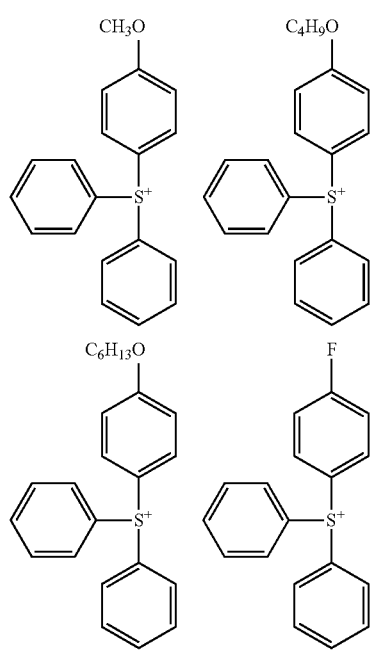
-continued
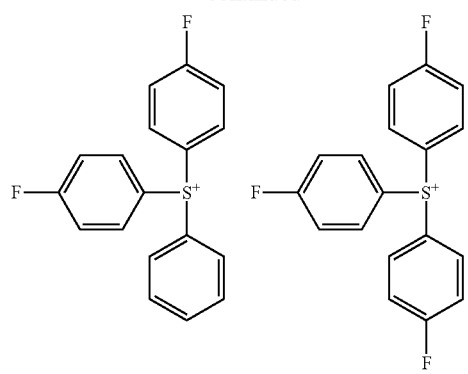 [SMILES: Fc1ccc([S+](c2ccccc2)c2ccc(F)cc2)cc1 ; Fc1ccc([S+](c2ccc(F)cc2)c2ccc(F)cc2)cc1]
Examples of the cation represented by the formula (b2-2) include the followings.
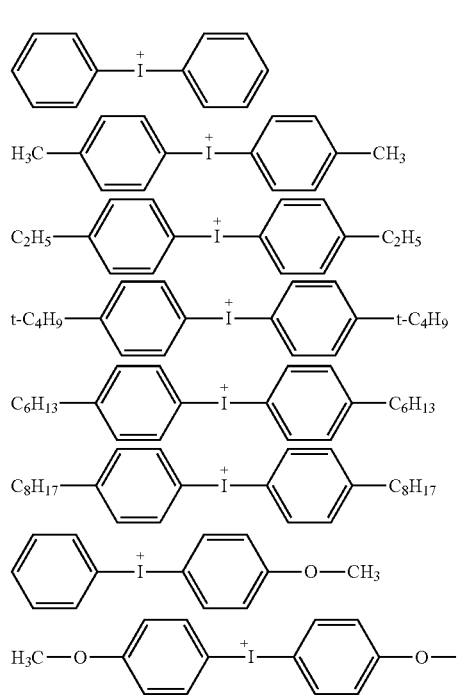
Examples of the cation represented by the formula (b2-3) include the followings.
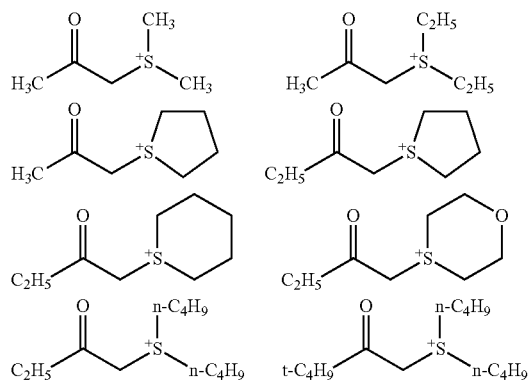

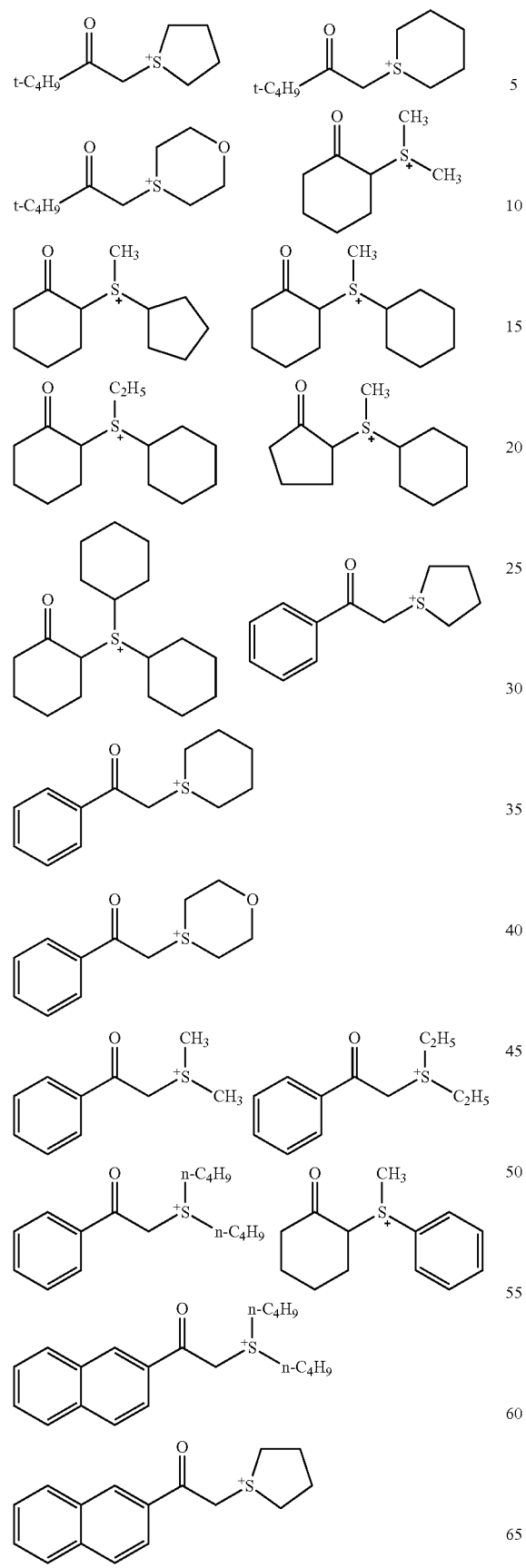
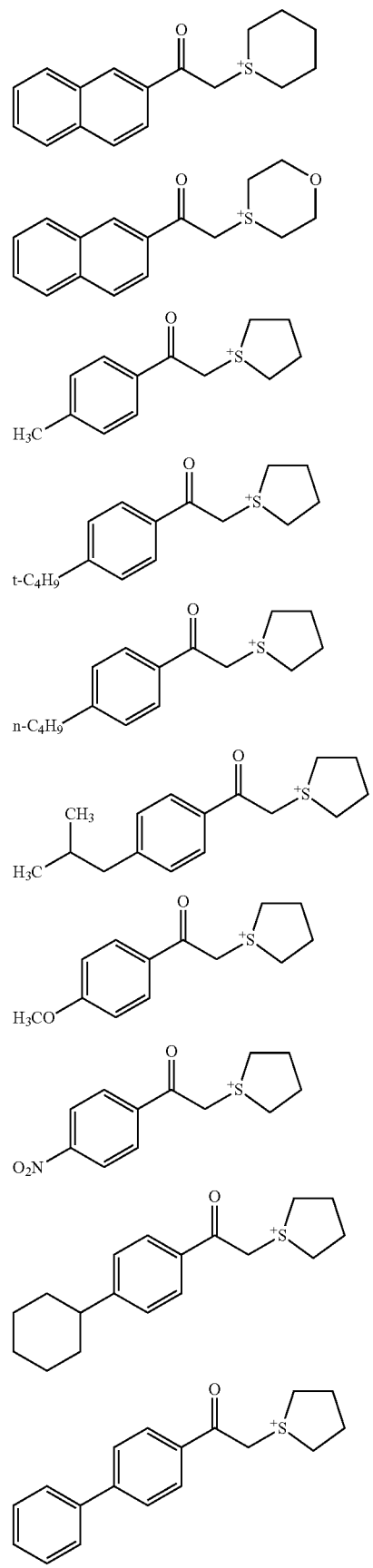

111
-continued
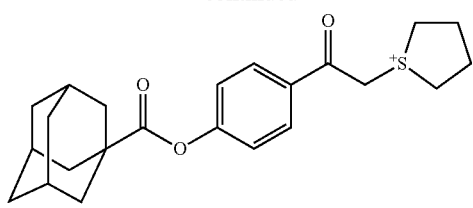
Examples of the cation represented by the formula (b2-4) include the followings.
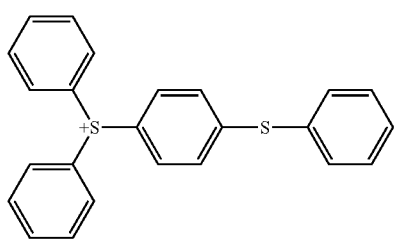
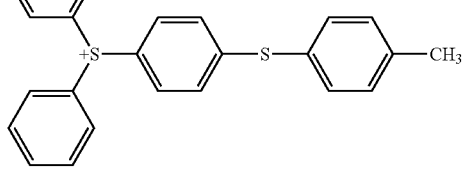
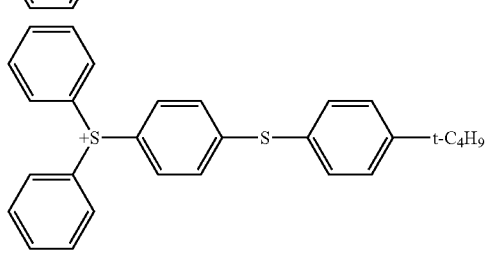
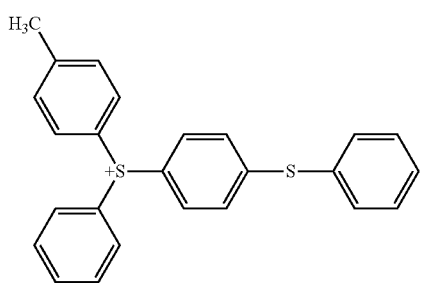
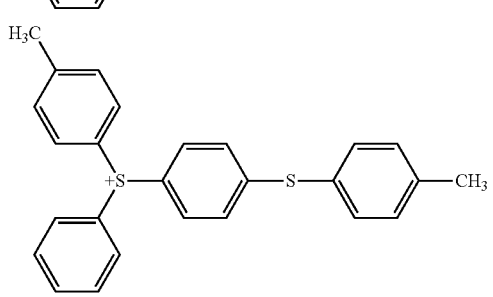
112
-continued
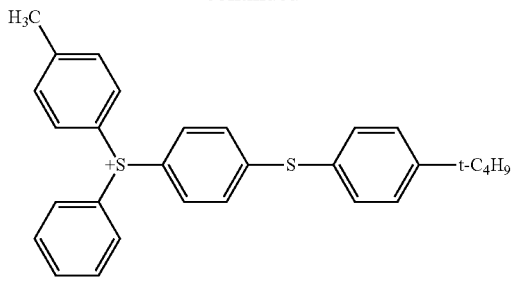
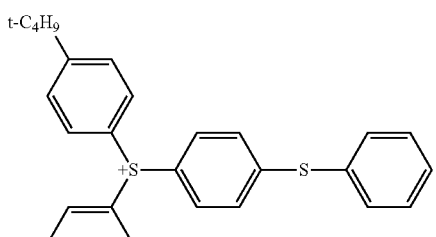
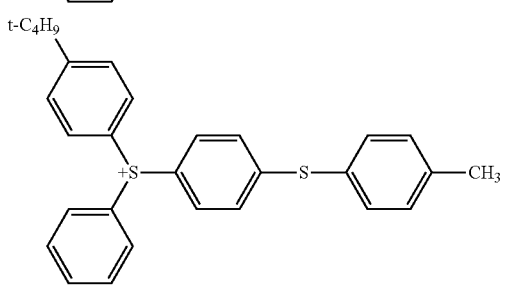

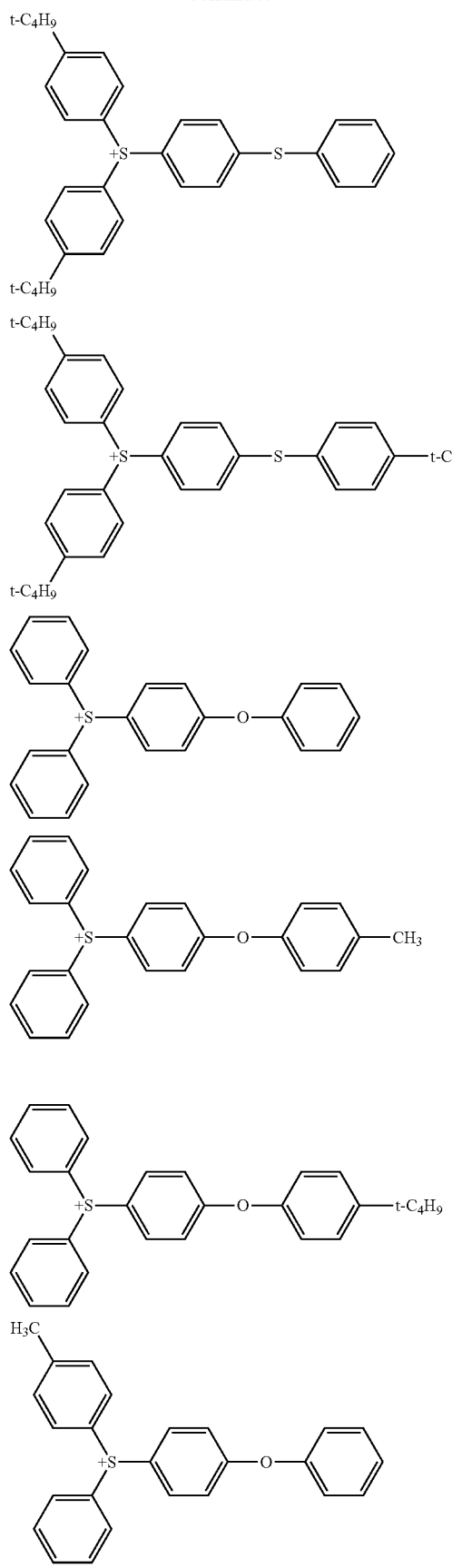
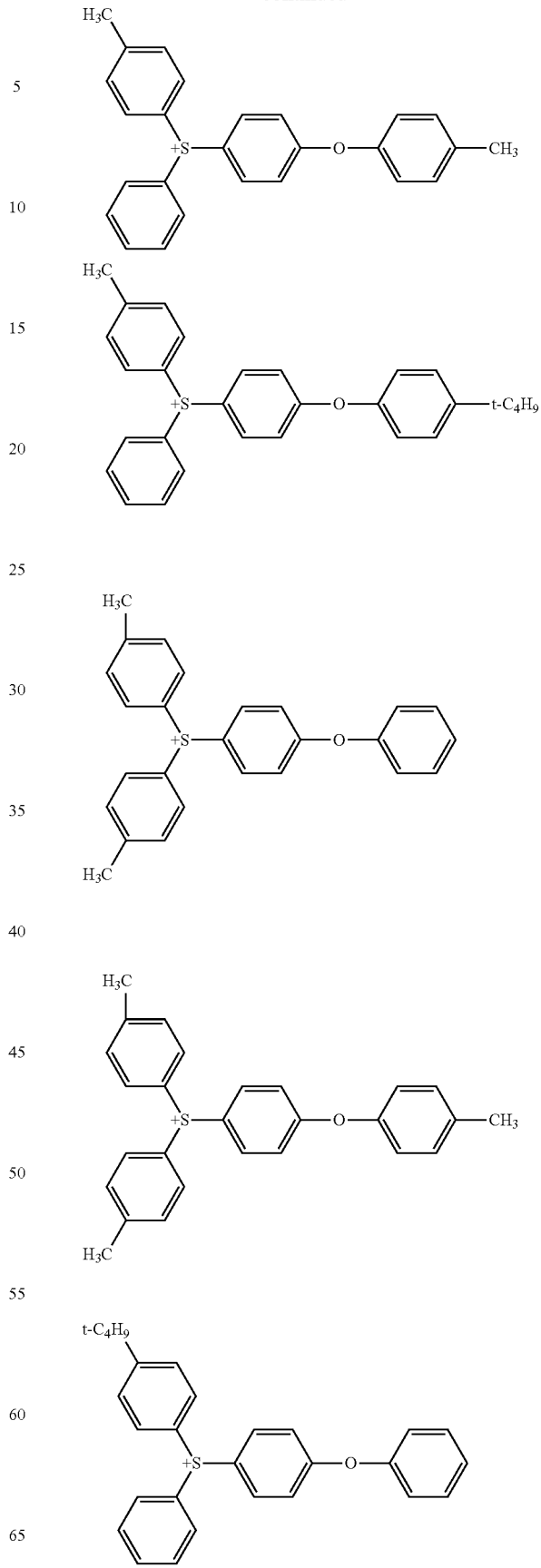

115
-continued
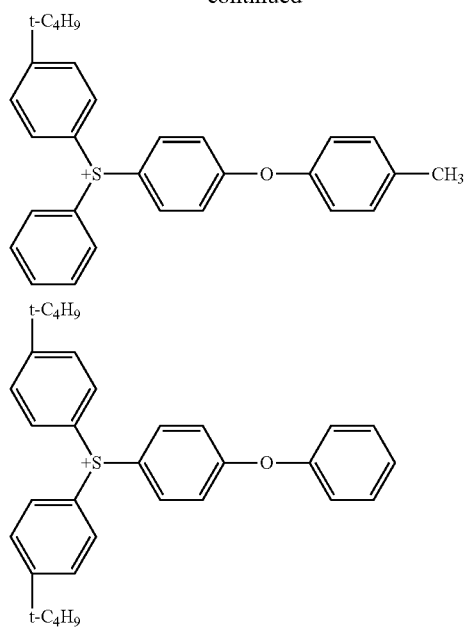
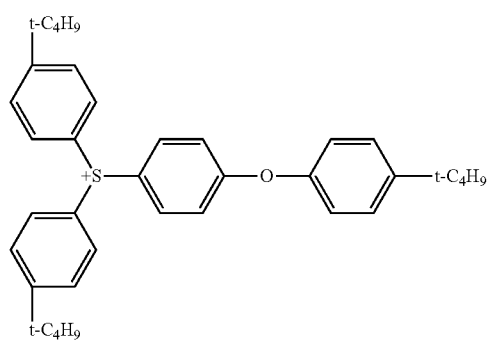
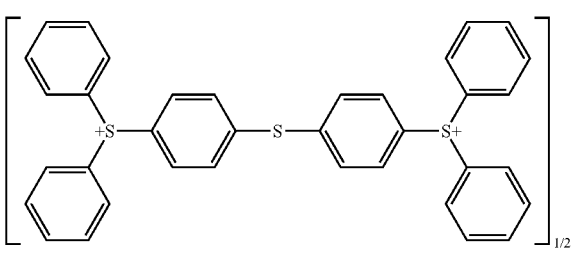
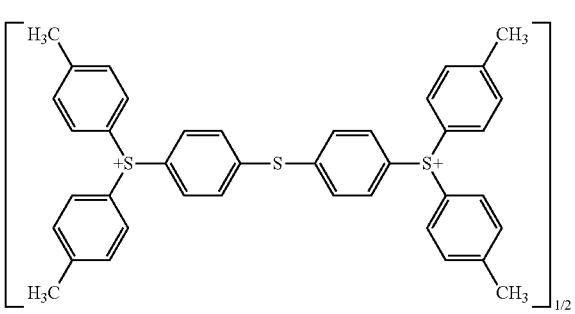
116
-continued
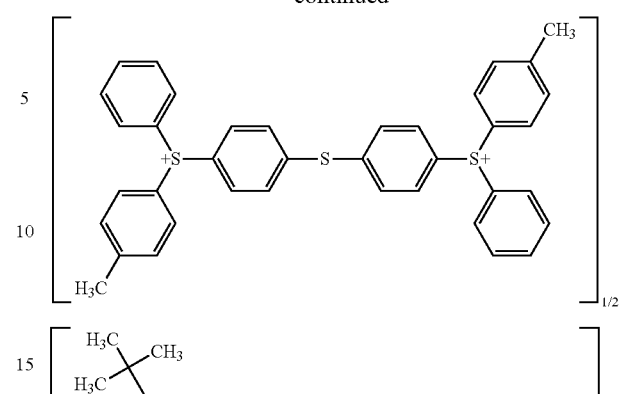
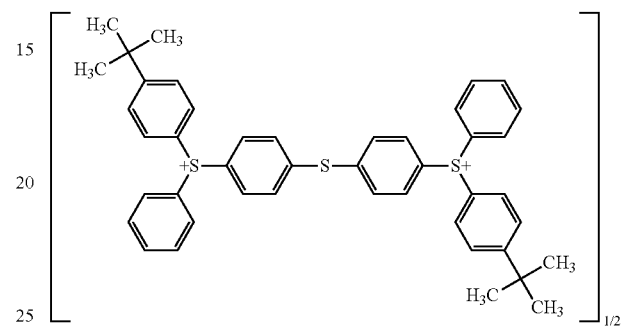
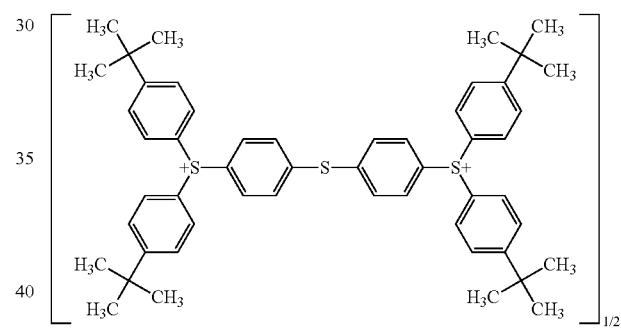
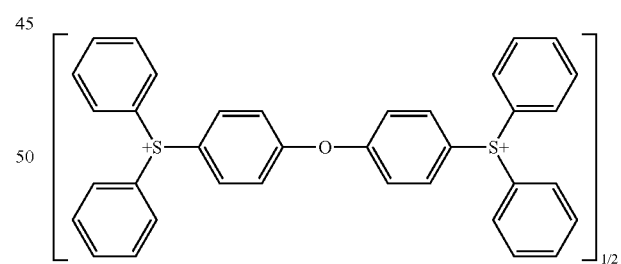
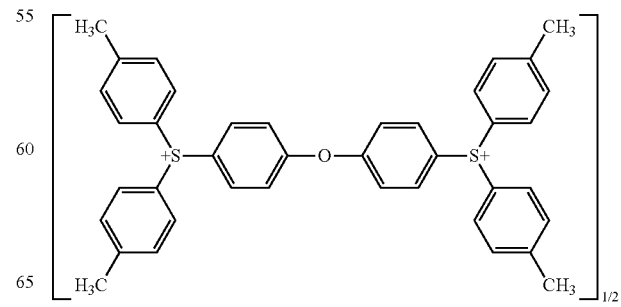

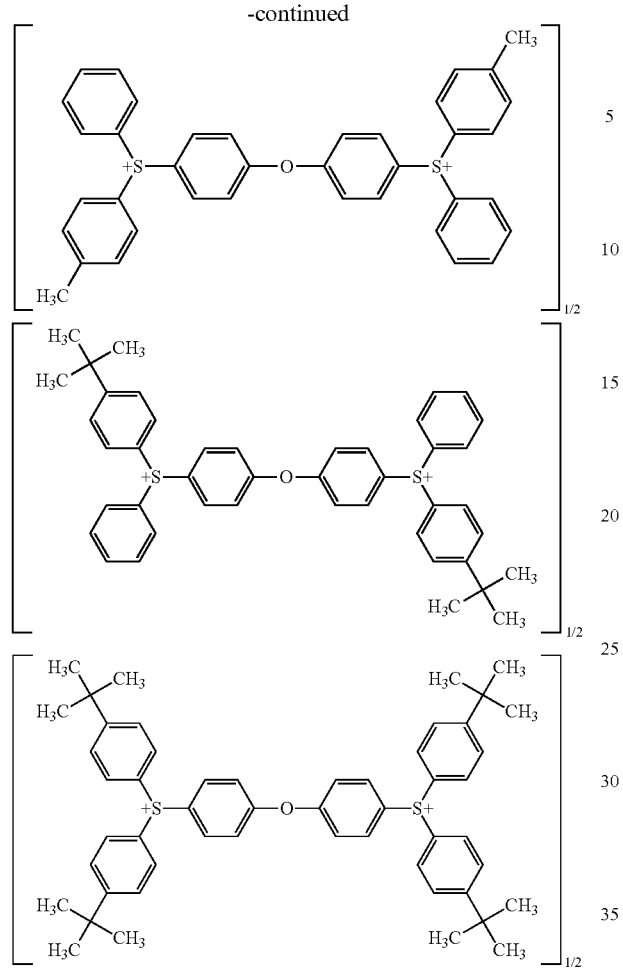

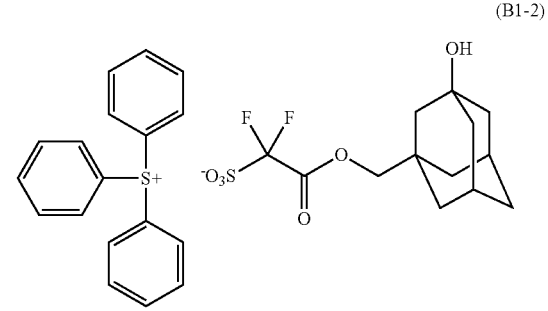

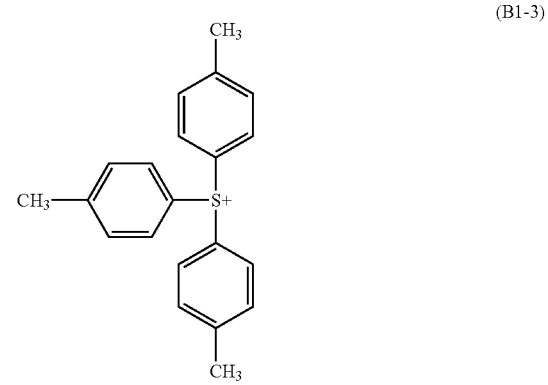

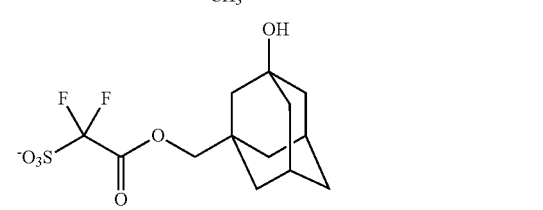

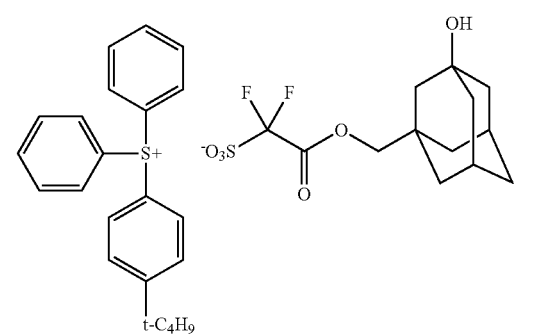

Examples of the salt represented by the formula (B1) include a salt wherein the anion part is any one of the above-mentioned anion part and the cation part is any one of the above-mentioned cation part. Preferable examples of the salt include a combination of any one of anions represented by the formulae (b1-1-1) to (b1-1-9) and the cation represented by the formulae (b2-1-1), and a combination of any one of anions represented by the formulae (b1-1-3) to (b1-1-5) and the cation represented by the formulae (b2-3).

The salt represented by the formulae (B1-1) to (B1-17) are preferable, and the salt represented by the formulae (B1-1), (B1-2), (B1-6), (B1-11), (B1-12), (B1-13) and (B1-14) are more preferable.

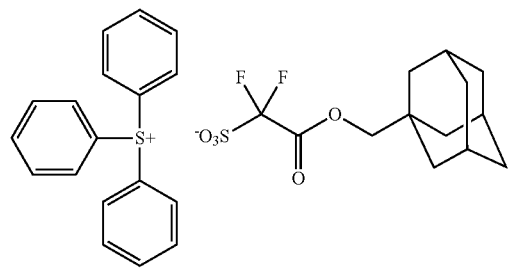

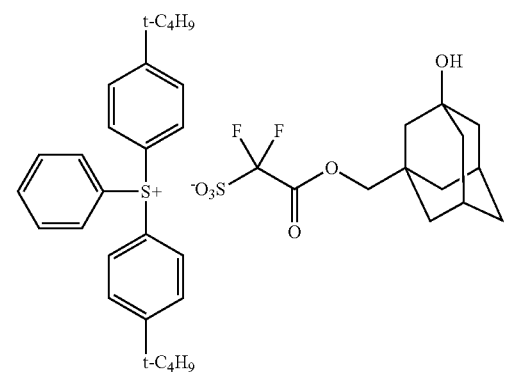

(B1-6)
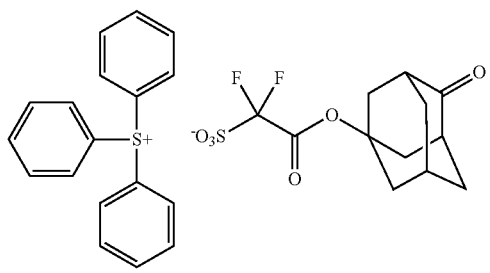
(B1-7)
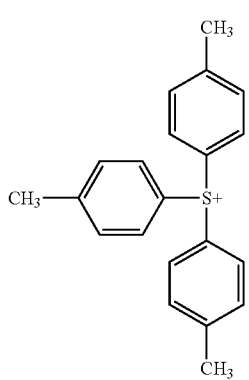
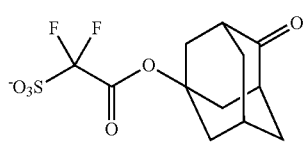
(B1-8)
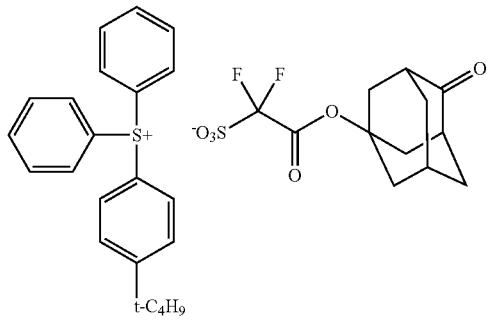
(B1-9)
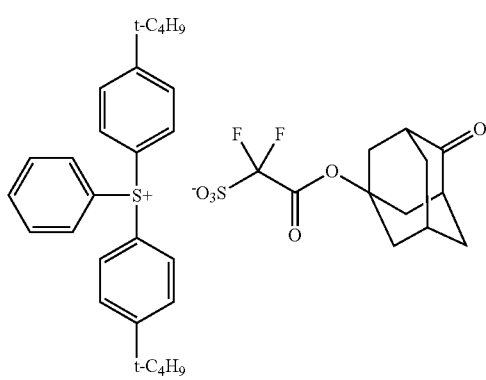
(B1-10)
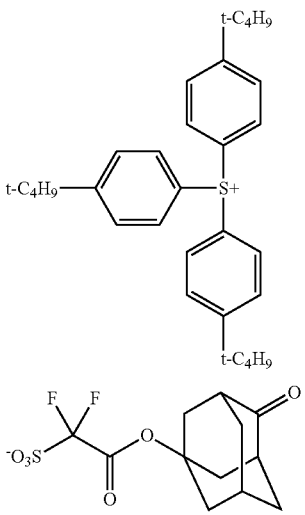
(B1-11)
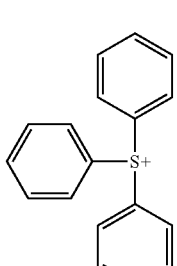
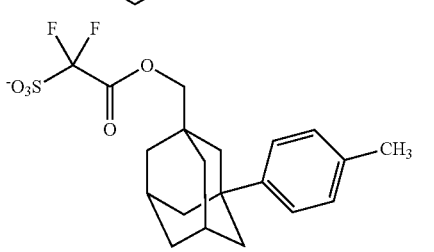
(B1-12)
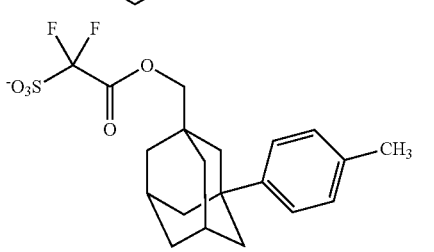
(B1-13)
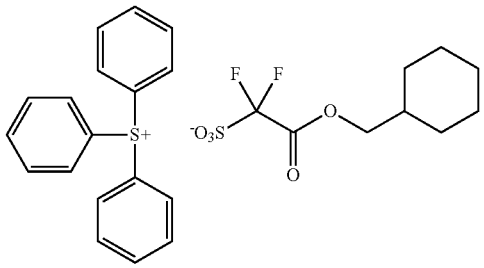

(B1-14)

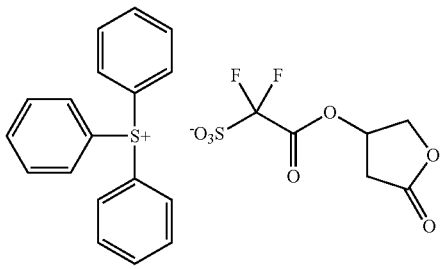

(B1-15)

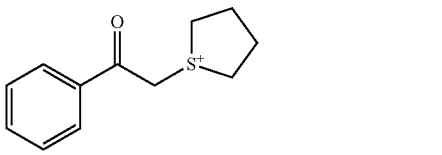

(B1-16)

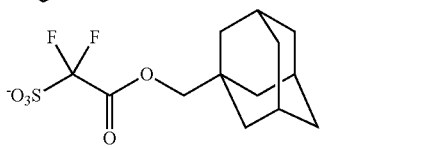

(B1-17)

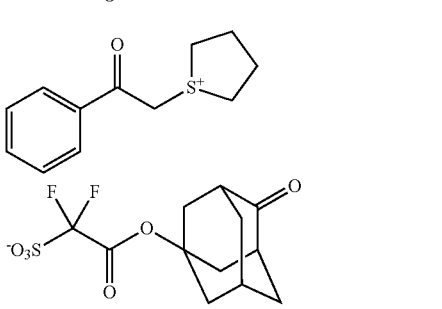

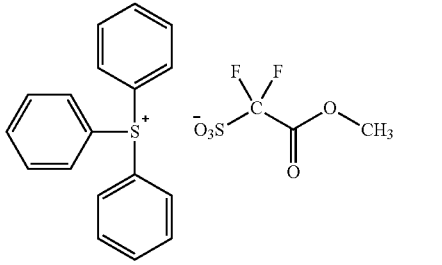

Two or more kinds of the acid generator can be used in combination.

The content of the acid generator is preferably 1 part by weight or more and more preferably 3 parts by weight or more per 100 parts by weight of the resin. The content of the acid generator is preferably 30 parts by weight or less and more preferably 25 parts by weight or less per 100 parts by weight of the resin.

Next, Compound (C1) will be illustrated.

The photoresist composition containing Compound (C1) gives a photoresist pattern of which a cross-section is nearly a rectangle. Compound (C1) is used as a quencher.

In the formula (C1), $R^{c1}$ represents an aromatic group which can have one or more substituents, $R^{c2}$ and $R^{c3}$ independently each represent a hydrogen atom, an aliphatic hydrocarbon group which can have one or more substituents or an aromatic group which can have one or more substituents, $R^{c4}$ and $R^{c6}$ independently each represent a hydrogen atom or an aliphatic hydrocarbon group which can have one or more substituents, or $R^{c4}$ and $R^{c6}$ are bonded each other to form an alkanediyl group, $R^{c5}$ represents an aliphatic hydrocarbon group which can have one or more substituents or an amino group which can have one or two substituents, $R^{c7}$ represents a hydrogen atom or an aliphatic hydrocarbon group which can have one or more substituents, or $R^{c5}$ and $R^{c7}$ are bonded each other to form an alkanediyl group.

The aromatic group represented by $R^{c1}$ may be an aromatic hydrocarbon group, and may be a heteroaromatic group. Examples of the aromatic hydrocarbon group include a non-condensed aromatic hydrocarbon group such as a phenyl group, a biphenyl group, a terphenyl group and a stilbenzyl group, a condensed aromatic hydrocarbon group such as a naphthyl group, a phenathryl group, an anthryl group and a pyrenyl group, a group formed by the condensation of an aromatic group and a non-aromatic cyclic group such as a 5,6,7,8-tetrahydro-1-naphthyl group, a 5,6,7,8-tetrahydro-2-naphthyl group, a 9,10-dihydro-1-anthryl group, a 9,10-dihydro-2-anthryl group and a 1-fluorenyl group. The heteroaromatic group may be a condensed heteroaromatic group and a non-condensed heteroaromatic group. Examples thereof include a sulfur-containing heteroaromatic group such as thienyl group, a benzo[b]thienyl group, a naphtho[2,3-b]thienyl group, a thianthrenyl group and a thioxanthenyl group; a oxygen-containing heteroaromatic group such as a furyl group, a benzofuryl group, a dibenzofuryl group, a chromenyl group and a xanthenyl group; a nitrogen-containing heteroaromatic group such as a pyrrolyl group, an imidazolyl group, a pyrazolyl group, a pyridyl group, a pyrazinyl group, a pyrimidinyl group, a pyridazinyl group, an indolizinyl group, an isoindolyl group, an indolyl group, an indazolyl group, a purinyl group, a quinolizinyl group, an isoquinolinyl group, a quinolinyl group, a phthalazinyl group, a naphthyridinyl group, a quinoxalinyl group, a quinazolinyl group, a cinnolinyl group, a pteridinyl group, a carbazolyl group, a β-carbolinyl group, a phenanthridinyl group, an acridinyl group, a perimidinyl group, a phenanthryl group and a phenazinyl group; a heteroaromatic group having two or more kinds of heteroatoms in the ring such as a phenoxathiinyl group, an isothiazolyl group, a phenothiazinyl group, an isoxazolyl group, a furazanyl group and a phenoxazinyl group.

Examples of the substituent of the aromatic group include a hydroxyl group, a C1-C4 alkyl group such as a methyl group, an ethyl group and a propyl group, a C1-C4 alkoxy group such as a methoxy group, a nitro group, a cyano group, a halogen atom such as a chlorine atom and a bromine atom, an amino group, an amino group substituted with one or two groups selected from the group consisting of an alkyl group and an aryl group such as a dimethylamino group, a diethylamino group and a phenylamino group, an oxo group, a methylthio group, a group represented by the following formula (C1a):

(C1a)

wherein $R^{c2}$, $R^{c3}$, $R^{c4}$, $R^{c5}$, $R^{c6}$ and $R^{c7}$ are the same as defined above.

Specific examples of the aromatic group include a 3-methoxyphenyl group, a 4-methoxyphenyl group, a 2,4-dimethoxyphenyl group, a 2,4,6-trimethoxyphenyl group, a 3,4,5-trimethoxyphenyl group, a 2-bromophenyl group, a 2-chlorophenyl group, a 2,6-dichlorophenyl group, a 3-cyanophenyl group, a 4-cyanophenyl group, a 4-hydroxyphenyl group, a 2-hydroxyphenyl group, a tolyl group, a xylyl group, a mesityl group, a nitrophenyl group, a dimethylaminophenyl group, a diethylaminophenyl group, an aminophenyl group, a diaminophenyl group, a methylthiophenyl group, a 1-naphthyl group, a 2-naphthyl group, a 1-phenylamino-4-naphthyl group, 1-methylnaphthyl group, 2-methylnaphthyl group, 1-methoxy-2-naphthyl group, a 2-methoxy-1-naphthyl group, a 1-dimethylamino-2-naphthyl group, a 1,2-dimethyl-4-naphthyl group, a 1,2-dimethyl-6-naphthyl group, a 1,2-dimethyl-7-naphthyl group, a 1,3-dimethyl-6-naphthyl group, a 1,4-dimethyl-6-naphthyl group, a 1,5-dimethyl-2-naphthyl group, a 1,6-dimethyl-2-naphthyl group, a 1-hydroxy-2-naphthyl group, a 2-hydroxy-1-naphthyl group, a 1,4-dihydroxy-2-naphthyl group, a 7-phenathryl group, a 1-anthryl group, a 2-anthryl group, a 9-anthryl group, a 9,10-dioxo-9,10-dihydroanthracen-2-yl group, a 3-benzo[b]thienyl group, a 5-benzo[b]thienyl group, a 2-benzo[b]thienyl group, a 4-dibenzofuryl group, a 4-methyl-7-dibenzofuryl group, a 2-xanthenyl group, a 3-xanthenyl group, a 8-methyl-2-xanthenyl group, a 2-phenoxathiinyl group, a 7-phenoxathiinyl group, a 2-pyrrolyl group, a 3-pyrrolyl group, a 5-methyl-3-pyrrolyl group, a 2-imidazolyl group, a 4-imidazolyl group, a 5-imidazolyl group, a 2-methyl-4-imidazolyl group, a 2-ethyl-4-imidazolyl group, a 2-ethyl-5-imidazolyl group, a 3-pyrazolyl group, a 1-methyl-3-pyrazolyl group, a 1-propyl-4-pyrazolyl group, a 2-pyrazinyl group, a 5,6-dimethyl-2-pyrazinyl group, a 2-indolizinyl group, a 2-methyl-3-isoindolyl group, a 2-methyl-1-isoindolyl group, a 1-methyl-2-indolyl group, a 1-methyl-3-indolyl group, a 1,5-dimethyl-2-indolyl group, a 1-methyl-3-indazolyl group, a 2,7-dimethyl-8-purinyl group, a 2-methoxy-7-methyl-8-purinyl group, a 2-quinolizinyl group, a 3-isoquinolynyl group, a 6-isoquinolinyl group, a 7-isoquinolinyl group, a 3-methoxy-6-isoquinolynyl group, a 2-quinolyl group, a 6-quinolyl group, a 7-quinolyl group, a 2-methoxy-3-quinolyl group, a 2-methoxy-6-quinolyl group, a 6-phthalazinyl group, a 7-phthalazinyl group, a 1-methoxy-6-phthalazinyl group, a 1,4-dimethoxy-6-phthalazinyl group, a 1,8-naphthyridin-2-yl group, a 2-quinoxalinyl group, a 6-quinoxalinyl group, a 2,3-dimethyl-6-quinoxalinyl group, a 2,3-dimethoxy-6-quinoxalinyl group, a 2-quinazolinyl group, a 7-quinazolinyl group, a 2-dimethylamino-6-quinazolinyl group, a 3-cinnolinyl group, a 6-cinnolinyl group, a 7-cinnolinyl group, a 3-methoxy-7-cinnolinyl group, a 2-pteridinyl group, a 6-pteridinyl group, a 7-pteridinyl group, a 6,7-dimethoxypteridinyl group, a 2-carbazolyl group, a 3-carbazolyl group, a 9-methyl-2-carbazolyl group, a 9-methyl-3-carbazolyl group, a β-carbolin-3-yl group, a 1-methyl-β-carbolin-3-yl group, a 1-methyl-β-carbolin-6-yl group, a 3-phenanthridinyl group, a 2-acridinyl group, a 3-acridinyl group, a 2-perimidinyl group, a 1-methyl-5-perimidinyl group, a 5-phenanthryl group, a 6-phenanthryl group, a 1-phenazinyl group, a 2-phenazinyl group, a 3-isothiazolyl group, a 4-isothiazolyl group, a 5-isothiazolyl group, a 2-phenothiazinyl group, a 3-phenothiazinyl group, a 10-methyl-3-phenothiazinyl group, a 3-isoxazolyl group, a 4-isoxazolyl group, a 5-isoxazolyl group, a 4-methyl-furazanyl group, a 2-phenoxazinyl group and a 10-methyl-2-phenoxazinyl group.

The aromatic hydrocarbon group is preferable and the non-condensed aromatic hydrocarbon group is more preferable.

The alkyl group and the halogen atom are preferable as the substituent, and the C1-C4 alkyl group and the halogen atom are more preferable.

Examples of the aliphatic hydrocarbon group represented by $R^{c2}$, $R^{c3}$, $R^{c4}$, $R^{c5}$, $R^{c6}$ and $R^{c7}$ include a C1-C18 saturated hydrocarbon group and a C2-C18 unsaturated hydrocarbon group, and a C1-C6 saturated hydrocarbon group and a C2-C6 unsaturated hydrocarbon group are preferable. Examples of the C1-C18 saturated hydrocarbon group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, an isopropyl group, an isobutyl group, a sec-butyl group, a tert-butyl group, an isopentyl group, a 1-methylpentyl group, a 2-ethylbutyl group, a 1,3-dimethylbutyl group, an isoheptyl group, a 1-methylhexyl group, a 1-methylheptyl group, a 3-methylheptyl group, a2-ethylhexyl group, a 1,1,3,3-tetramethylbutyl group, a 1,1,3-trimethylhezyl group, a 1,1,3,3-tetramethylpentyl group, a 1-methylundecyl group and a 1,1,3,3,5,5-hexamethylhexyl group. The C2-C18 unsaturated hydrocarbon group may have one or more double bonds, a triple bond or both thereof. Examples thereof include an ethenyl group, a propenyl group, a 2-butenyl group, a 3-butenyl group, an isobutenyl group, a 3-methyl-2-butenyl group, a 2,4-pentadienyl group, a 2-octenyl group, a 2-dodecenyl group, an isododecenyl group, an oleyl group, a 2-octadecenyl group, a 4-octadecenyl group, an ethynyl group, a propynyl group, a 2-butynyl group, a 3-butynyl group, a 2-octynyl group and a 2-octadecynyl group.

$R^{c4}$ and $R^{c6}$ can be bonded each other to form an alkanediyl group, and the ring formed by bonding the alkanediyl group, the nitrogen atoms to which $R^{c4}$ and $R^{c6}$ are bonded respectively and —CH— is preferably 4- to 21-membered ring, more preferably 5- to 15-membered ring, and especially preferably 5- to 9-membered ring. Examples of the ring include a 1,3-diazacyclobutane ring, a 1,3-diazacyclopentane ring, a 1,3-diazacyclohexane ring, a 1,3-diazacycloheptane ring, a 1,3-diazacyclooctane ring, a 1,3-diazacyclononane ring, a 1,3-diazacyclodecane ring, a 1,3-diazacycloundecane ring, a 1,3-diazacyclododecane ring, a 1,3-diazacyclotridecane ring, a 1,3-diazacyclotetradecane ring and a 1,3-diazacyclopentadecane ring. These rings may have a hydrocarbon group such as a C1-C4 alkyl group such as a methyl group, an ethyl group, a propyl group, an isopropyl group, a butyl group, an isobutyl group, a sec-butyl group and a tert-butyl group.

$R^{c5}$ and $R^{c7}$ can be bonded each other to form an alkanediyl group, and the ring formed by bonding the alkanediyl group, the nitrogen atom to which $R^{c7}$ is bonded and —CH— to which $R^{c5}$ is bonded is preferably 3- to 20-membered ring, more preferably 4- to 14-membered ring, and especially preferably 4- to 8-membered ring. Examples of the ring include an azacyclopropane ring, an azacyclobutane ring, an azacyclopentane ring, an azacyclohexane ring, an azacycloheptane ring, an azacyclooctane ring, an azacyclononane ring, an azacyclodecane ring, an azacycloundecane ring, an azacyclododecane ring, an azacyclotridecane ring and an azacyclotetradecane ring. These rings may have a hydrocarbon group such as a C1-C4 alkyl group such as a methyl group, an ethyl group, a propyl group, an isopropyl group, a butyl group, an isobutyl group, a sec-butyl group and a tert-butyl group.

Examples of the substituents of the aliphatic hydrocarbon group include the same as those of the aromatic group represented by $R^{c1}$ to $R^{c3}$ other than an alkyl group, and a halogen atom is preferable as the substituent.

Examples of the amino group which can have one or two substituents represented by $R^{c5}$ include an amino group, an amino group substituted with a C1-C18 alkyl group such as a methylamino group, an ethylamino group, a propylamino group, a butylamino group, a pentylamino group, a hexylamino group, an octadecylamino group, and an amino group substituted with two C1-C18 alkyl groups such as a dimethylamino group, a diethylamino group, a dipropylamino group, a dibutylamino group, a dipentylamino group, a dihexylamino group, a dioctadecylamino group, a methylethylamino group, a methylpropylamino group, a methylisopropylamino group, a methylbutylamino group, a methylisobutylamino group, an ethylisopropylamino group, a diisopropylamino group, an ethylbutylamino group, an ethylisobutylamino group, an ethyl-tert-butylamino group, an isopropylbutylamino group, an isopropylisobutylamino group and a diisobutylamino group.

Compound (C1) preferably satisfys the following formula (1):

$$0.2 \leq (\Delta D^a - \Delta D^b)/(\Delta D^c - \Delta D^d) \leq 0.9 \quad (I)$$

wherein $\Delta D^a$ represents an absolute value of the difference between $d^1$ and $d^a$, $\Delta D^b$ represents an absolute value of the difference between $d^1$ and $d^b$, $\Delta D^c$ represents an absolute value of the difference between $d^1$ and $d^c$, $\Delta D^d$ represents an absolute value of the difference between $d^1$ and $d^d$, and $d^1$, $d^a$, $d^b$, $d^c$ and $d^d$ are measured according to the following steps (1) to (6):

(1) a step of forming the first film consisting of Compound (I) and a resin having an acid-labile group, being insoluble or poorly soluble in an alkali aqueous solution but becoming soluble in an alkali aqueous solution by the action of an acid, followed by measuring the film thickness $d^1$ of the first film formed, (2) a step of forming the second film consisting of an alkali-soluble resin and an acid having a group represented by $-C(Q^3)(Q^4)-SO_3H$ wherein $Q^3$ and $Q^4$ independently each represent a fluorine atom or a C1-C6 perfluoroalkyl group, on the first film, (3) a step of exposing the first and second films formed in the steps (1) and (2) at the exposure amount of 40 mJ/cm$^2$, followed by heating them and developing them with an aqueous alkaline solution and then, measuring the film thickness $d^a$ of the first film after development, (4) a step of exposing the first and second films formed in the steps (1) and (2) at the exposure amount of 40 mJ/cm$^2$, followed by developing them with an aqueous alkaline solution and then, measuring the film thickness $d^b$ of the first film after development, (5) a step of heating the first and second films formed in the steps (1) and (2), followed by developing them with an aqueous alkaline solution and then, measuring the film thickness $d^c$ of the first film after development, and (6) a step of developing the first and second films formed in the steps (1) and (2) with an aqueous alkaline solution and then, measuring the film thickness $d^d$ of the first film after development.

The film thickness $d^1$, $d^a$, $d^b$, $d^c$ and $d^d$ can be measured, for example, with a contactless film thickness measurement such as Lambda Ace manufactured by DAINIPPON SCREEN MFG. CO. LTD., The resin having an acid-labile group, being insoluble or poorly soluble in an alkali aqueous solution but becoming soluble in an alkali aqueous solution by the action of an acid means a resin capable of decomposing with the action of an acid to increase the solubility in an alkaline developer, and the resin has a group decomposing with the action of an acid thereby giving an alkali-soluble group by the action of an acid. Examples of the alkali-soluble group include —COOH, —OH and —SO$_3$H, and examples of the group decomposing with the action of an acid include the above-mentioned acid-labile group. Examples of the resin include the above-mentioned resins and specific examples thereof include the resin described in JP 2006-257078 A such as the resin having the structural units derived from the following monomers.

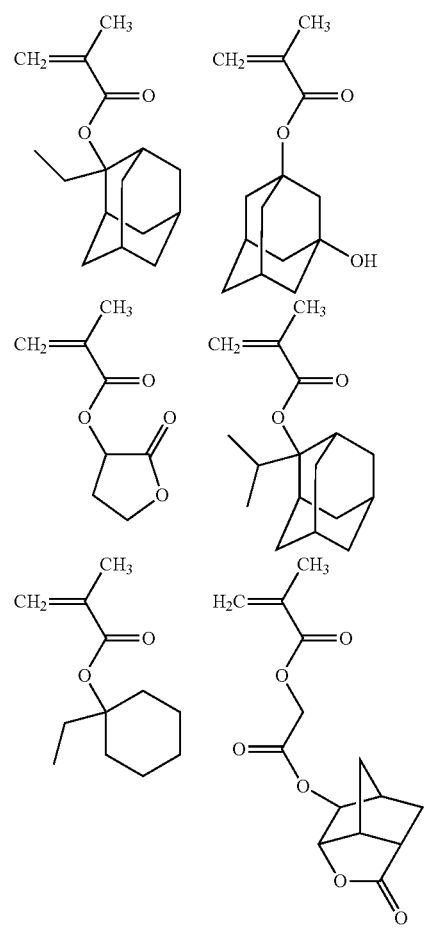

In the step (1), a composition consisting of Compound (1), a resin having an acid-labile group, being insoluble or poorly soluble in an alkali aqueous solution but becoming soluble in an alkali aqueous solution by the action of an acid, a quencher and a solvent is spin-coated over the silicon wafer to prepare a composition layer followed by drying the layer to give the first film. The drying is usually conducted with a heating apparatus such as a hot plate, and can be carried out with a decompressor. The drying temperature is usually 50 to 200° C., and the drying pressure is usually 1 to 1.0*10$^5$ Pa. Examples of the solvent include known solvents used in the photoresist field such as the solvents described in JP 2006-257078 A. Specific examples thereof include propylene glycol monomethyl ether acetate, propylene glycol monomethyl ether, 2-heptanone and γ-butyrolactone. Two or more kinds of the solvents can be used in combination.

The alkali-soluble resin in the step (2) means a resin having an acidic group and having a property of dissolving in an aqueous alkaline developer by contacting the developer. Examples of the alkali-soluble resin include the known alkali-soluble resins in the photoresist field and specific examples thereof include the resin consisting of the structural unit represented by the formula (III):

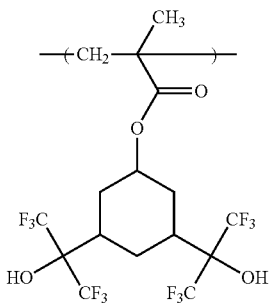

Examples of the C1-C6 perfluoroalkyl group represented by $Q^3$ and $Q^4$ include the same as described above, and it is preferred that $Q^3$ and $Q^4$ are independently a fluorine atom or a trifluoromethyl group, and it is more preferred that $Q^3$ and $Q^4$ are fluorine atoms. Examples of the acid having a group represented by —C($Q^3$)($Q^4$)-SO$_3$H include the acids generated from the acid generators described in JP 2006-257078 A, and specific examples thereof include the following.

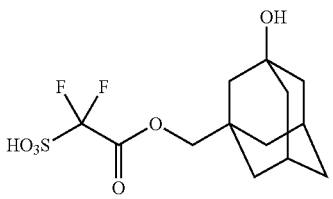 [SMILES: O=C(OCC12CC3CC(CC(O)(C3)C1)C2)C(F)(F)S(=O)(=O)O]

In the step (2), a composition consisting of an alkali-soluble resin, an acid having a group represented by —C($Q^3$)($Q^4$)-SO$_3$H and a solvent is spin-coated over the first film formed in the step (1) to prepare a composition layer followed by drying the layer to give the second film on the first film. The drying is usually conducted with a heating apparatus such as a hot plate, and can be carried out with a decompressor. The drying temperature is usually 50 to 200° C., and the drying pressure is usually 1 to $1.0*10^5$ Pa. Examples of the solvent include known solvents used in the photoresist field such as the solvents described in JP 2006-257078 A. Specific examples thereof include isobutyl alcohol.

In the step (3), the exposure is usually conducted with an exposure system. An immersion exposure system can be used. Examples of the exposure source include alight source radiating laser light in a UV-region such as a KrF excimer laser (wavelength: 248 nm), an ArF excimer laser (wavelength: 193 nm) and a F$_2$ laser (wavelength: 157 nm), and a light source radiating harmonic laser light in a far UV region or a vacuum UV region by wavelength conversion of laser light from a solid laser light source (such as YAG or semiconductor laser).

The temperature of heating of the exposed films is usually 50 to 200° C., and preferably 70 to 150° C.

The development of the heated films is usually carried out using a development apparatus. The alkaline developer used may be any one of various alkaline aqueous solution used in the art. An aqueous solution of tetramethylammonium hydroxide or (2-hydroxyethyl)trimethylammonium hydroxide (commonly known as "choline") is often used.

In the step (3), the acid having a group represented by —C($Q^3$)($Q^4$)-SO$_3$H contained in the second film is moved in the first and the second films by exposure, and the acid having a group represented by —C($Q^3$) ($Q^4$)-SO$_3$H contained in the second film is also moved in the first and the second films by heating. By moving the acid having a group represented by —C($Q^3$)($Q^4$)-SO$_3$H by exposure and heating, the resin in the first film is contacted with the acid and a part of the resin in the first film becomes an alkali-soluble and it is dissolved in an alkaline developer on the development. Therefore, the film thickness d' becomes smaller than the film thickness $d^1$. On the development, the second film is dissolved in an alkaline developer.

$\Delta D^a$ represents an absolute value of the difference between $d^1$ and $d^a$, and $\Delta D^a$ means the amount of film thickness loss of the first film by exposure at the exposure amount of 40 mJ/cm$^2$ and heating.

In the step (4), the exposure is conducted under the same condition as that of the exposure in the step (3). The development is also conducted under the same condition as that of the development in the step (3).

In the step (4), the acid having a group represented by —C($Q^3$)($Q^4$)-SO$_3$H contained in the second film is also moved in the first and the second films by exposure. By moving the acid having a group represented by —C($Q^3$)($Q^4$)-SO$_3$H by exposure, the resin in the first film is contacted with the acid and a part of the resin in the first film becomes an alkali-soluble and it is dissolved in an alkaline developer on the development. Therefore, the film thickness $d^b$ becomes smaller than the film thickness $d^1$. On the development, the second film is dissolved in an alkaline developer.

$\Delta D^b$ represents an absolute value of the difference between $d^1$ and $d^b$, and $\Delta D^b$ means the amount of film thickness loss of the first film by exposure at the exposure amount of 40 mJ/cm$^2$.

($\Delta D^a - \Delta D^b$) means the amount of film thickness loss of the first film by heating when the exposure to the first and second films at the exposure amount of 40 mJ/cm$^2$ is conducted.

In the step (5), the heating is conducted under the same condition as that of the heating in the step (3). The development is also conducted under the same condition as that of the development in the step (3).

In the step (5), the acid having a group represented by —C($Q^3$)($Q^4$)-SO$_3$H contained in the second film is also moved in the first and the second films by heating. By moving the acid having a group represented by —C($Q^3$)($Q^4$)-SO$_3$H by heating, the resin in the first film is contacted with the acid and a part of the resin in the first film becomes an alkali-soluble and it is dissolved in an alkaline developer on the development. Therefore, the film thickness $d^c$ becomes smaller than the film thickness $d^1$. On the development, the second film is dissolved in an alkaline developer.

$\Delta D^c$ represents an absolute value of the difference between $d^1$ and d', and $\Delta D^c$ means the amount of film thickness loss of the first film by heating without conducting the exposure.

In the step (6), the development is conducted under the same condition as that of the development in the step (3).

In the step (6), the acid having a group represented by —C($Q^3$)($Q^4$)-SO$_3$H contained in the second film is contacted with the first film thereby contacting the resin in the first film with the acid, and a part of the resin in the first film becomes an alkali-soluble and it is dissolved in an alkaline developer on the development. Therefore, the film thickness $d^d$ becomes smaller than the film thickness $d^1$. On the development, the second film is dissolved in an alkaline developer.

ΔD$^d$ represents an absolute value of the difference between d$^1$ and d$^d$, and ΔD$^d$ means the amount of film thickness loss of the first film by development.

(ΔD$^c$-ΔD$^d$) means the amount of film thickness loss of the first film by heating when the exposure to the first and second films is not conducted.

Compound (C1) preferably satisfys that the ratio of the amount of film thickness loss of the first film by heating when the exposure to the first and second films at the exposure amount of 40 mJ/cm$^2$ is conducted to the amount of film thickness loss of the first film by heating when the exposure to the first and second films is not conducted ((ΔD$^a$-ΔD$^b$)/(ΔD$^c$-ΔD$^d$)) is 0.2 or more and 0.9 or less. When (ΔD$^a$-ΔD$^b$)/(ΔD$^c$-ΔD$^d$) is 0.2 or more and 0.9 or less, the function of trapping the acid by Compound (C1) is improved by exposure and the acid in the films becomes more difficult to move in the films. Therefore, the photoresist pattern having better resolution and better line edge roughness can be obtained. When (ΔD$^a$-ΔD$^b$)/(ΔD$^c$-ΔD$^d$) is less than 0.2, the function of trapping the acid by Compound (C1) is improved too much in the exposed part by exposure and the acid in the films becomes not to move in the films. Therefore, the photoresist pattern can not be developed. When (ΔD$^a$-ΔD$^b$)/(ΔD$^c$-ΔD$^d$) is more than 0.9, the function of trapping the acid by Compound (C1) in the exposed part is almost the same as that in the unexposed part, and therefore, the resolution and the line edge roughness of the photoresist pattern are not enough to be satisfied.

Preferable Compound (C1) include Compound (C1) wherein R$^{c2}$ and R$^{c3}$ are hydrogen atoms or C1-C6 saturated hydrocarbon groups and R$^{c4}$ and R$^{c6}$ and/or R$^{c5}$ and R$^{c7}$ are bonded each other to form an alkanediyl group, and a compound represented by the formula (C1-1):

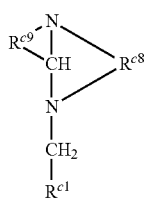

(C1-1)

wherein R$^{c1}$ is the same as defined above, and R$^{c8}$ and R$^{c9}$ independently each represent a C1-C18 alkanediyl group which can have one or more substituents is more preferable. R$^{c8}$ and R$^{c9}$ are preferably unsubstituted C1-C18 alkanediyl groups, and more preferably C2-C12 alkanediyl groups, and especially preferably C2-C6 alkanediyl groups.

R$^{c8}$ is preferably a propane-1,3-diyl group. A compound represented by the formula (C1-1-1) or (C1-1-2):

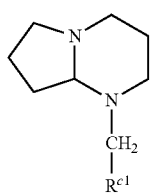

(C1-1-1)

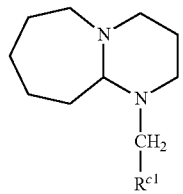

(C1-1-2)

wherein R$^{c1}$ is the same as defined above, is especially preferable.

Examples of Compound (C1) include 5-benzyl-1,5-diazabicyclo[4.3.0]nonane, 5-(2-chlorobenzyl)-1,5-diazabicyclo[4.3.0]nonane, 5-(4-methylbenzyl)-1,5-diazabicyclo[4.3.0]nonane, 8-benzyl-1,8-diazabicyclo[5.4.0]undecane, 8-(2-chlorobenzyl)-1,8-diazabicyclo[5.4.0]undecane, 5-(2-nitrobenzyl)-1,8-diazabicyclo[5.4.0]undecane and 5-(4-methoxycarbonylbenzyl)-1,8-diazabicyclo[5.4.0]undecane.

The content of Compound (I) is usually 0.01 part by weight or more per 100 parts of the resin and preferably 0.05 part by weight or more. The content of Compound (I) is usually 5 parts by weight or less per 100 parts of the resin and preferably 3 parts by weight or less.

The photoresist compositions of the present invention can contain a basic compound other than Compound (I) as a quencher.

The basic compound is preferably a basic nitrogen-containing organic compound, and examples thereof include an amine compound such as an aliphatic amine and an aromatic amine and an ammonium salt. Examples of the aliphatic amine include a primary amine, a secondary amine and a tertiary amine. Examples of the aromatic amine include an aromatic amine in which aromatic ring has one or more amino groups such as aniline and a heteroaromatic amine such as pyridine. Preferable examples thereof include an aromatic amine represented by the formula (Q1) and the aromatic amine represented by the formula (Q1-1) is preferable.

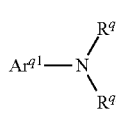

(Q1)

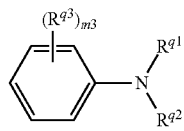

(Q1-1)

wherein Ar$^{q1}$ represents a C6-C20 aromatic hydrocarbon group, and R$^{q1}$ and R$^{q2}$ each independently represent a hydrogen atom, a C1-C6 aliphatic hydrocarbon group, a C5-C10 alicyclic hydrocarbon group or a C6-C20 aromatic hydrocarbon group, and the aliphatic hydrocarbon group and the aromatic hydrocarbon group can have one or more substituents selected from the group consisting of a hydroxyl group, an amino group, an amino group having one or two C1-C4 aliphatic hydrocarbon groups and a C1-C6 alkoxy group, and the aliphatic hydrocarbon group can have one or more C6-C20 aromatic hydrocarbon groups and the aromatic hydrocarbon group can have one or more C1-C6 aliphatic hydrocarbon groups or C5-C10 alicyclic hydrocarbon groups, and the alkoxy group can have one or more substituents selected from the group consisting of a hydroxyl group, an amino group, an amino group having one or two C1-C4 aliphatic hydrocarbon groups and a C1-C6 alkoxy group, $R^{q3}$ is independently in each occurrence a C1-C6 aliphatic hydrocarbon group, a C1-C6 alkoxy group, a C5-C10 alicyclic hydrocarbon group or a C6-C20 aromatic hydrocarbon group, and the aliphatic hydrocarbon group, the alkoxy group, the alicyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, and the aliphatic hydrocarbon group can have one or more C6-C20 aromatic hydrocarbon groups and the aromatic hydrocarbon group can have one or more C1-C6 aliphatic hydrocarbon groups or C5-C10 alicyclic hydrocarbon groups, and the alkoxy group can have one or more substituents selected from the group consisting of a hydroxyl group, an amino group, an amino group having one or two C1-C4 aliphatic hydrocarbon groups and a C1-C6 alkoxy group, and m3 represents an integer of 0 to 3.

Examples of the aromatic amine represented by the formula (Q1) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, and diphenylamine, and among them, preferred is diisopropylaniline and more preferred is 2,6-diisopropylaniline.

An quaternary ammonium hydroxide represented by the formula (Q2):

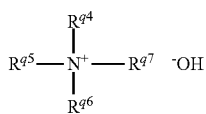

(Q2)

wherein $R^{q4}$, $R^{q5}$ and $R^{q6}$ independently each represent a hydrogen atom, a C1-C6 aliphatic hydrocarbon group, a C5-C10 alicyclic hydrocarbon group or a C6-C20 aromatic hydrocarbon group, and $R^7$ represents a C1-C6 aliphatic hydrocarbon group or a C5-C10 alicyclic hydrocarbon group, is also preferable. Examples of the aliphatic hydrocarbon group, the alicyclic hydrocarbon group and the aromatic hydrocarbon group include the same as described in $R^{q1}$ and $R^{q2}$, respectively.

Examples of the quaternary ammonium hydroxide represented by the formula (Q2) include tetramethylammonium hydroxide, tetraisopropylammonium hydroxide, tetrabutylammonium hydroxide, tetrahexylammonium hydroxide, tetraoctylammonium hydroxide, phenyltrimethylammonium hydroxide, 3-(trifluoromethyl)phenyltrimethylammonium hydroxide, tetrabutylammonium salicylate and (2-hydroxyethyl)trimethylammonium hydroxide (commonly known as "choline"). Among them, preferred are tetramethylammonium hydroxide, tetrabutylammonium hydroxide, tetrahexylammonium hydroxide, tetraoctylammonium hydroxide, phenyltrimethylammonium hydroxide and 3-(trifluoromethyl)phenyltrimethylammonium hydroxide.

Other examples of the basic compound include amines represented by the formulae (Q3) to (Q11):

(Q3)

(Q4)

(Q5)

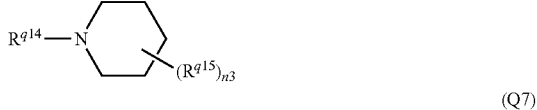

(Q6)

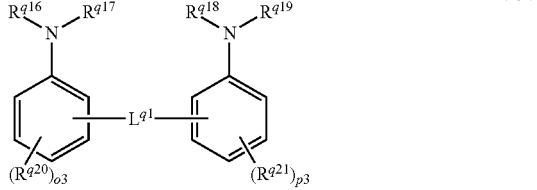

(Q7)

(Q8)

(Q9)

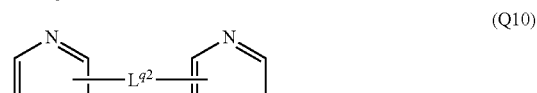

(Q10)

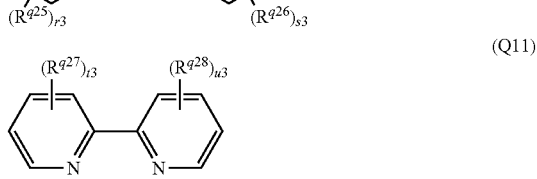

(Q11)

wherein $R^{q8}$ represents a C1-C6 aliphatic hydrocarbon group or a C5-C10 alicyclic hydrocarbon group, $R^{q9}$ and $R^{q10}$ independently each represent a hydrogen atom, a C1-C6 aliphatic hydrocarbon group or a C5-C10 alicyclic hydrocarbon group, $R^{q11}$ to $R^{q14}$, $R^{q16}$ to $R^{q19}$, and $R^{q22}$ each independently represents a hydrogen atom, a C1-C6 aliphatic hydrocarbon group, a C5-C10 alicyclic hydrocarbon group or a C6-C20 aromatic hydrocarbon group, $R^{q15}$ is independently in each occurrence a C1-C6 aliphatic hydrocarbon group, a C3-C6 alicyclic hydrocarbon group or a C2-C6 alkanoyl group, $R^{q23}$ represents a hydrogen atom, a C1-C6 aliphatic hydrocarbon group, a C1-C6 alkoxy group or a C5-C10 alicyclic hydrocarbon group, $R^{q20}$ to $R^{q21}$ and $R^{q24}$ to $R^{q48}$ each independently represent a C1-C16 aliphatic hydrocarbon group, a C5-C10 alicyclic hydrocarbon group, a C1-C6 alkoxy group or a C6-C20 aromatic hydrocarbon group, and o3 to u3 independently each represents an integer of 0 to 3, $L^{q1}$ and $L^{q2}$ each independently represents a C2-C6 alkanediyl group, —CO—, —N($R^{a29}$)—, —S—, —S—S— or a combination thereof and $R^{q29}$ represents a hydrogen atom or a C1-C6 aliphatic hydrocarbon group and n3 represents an integer of 0 to 8.

Examples of the aliphatic hydrocarbon group, the alicyclic hydrocarbon group and the aromatic hydrocarbon group include the same as described above.

Examples of the amine represented by the formula (Q3) include hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane.

Examples of the amine represented by the formula (Q4) include piperazine. Examples of the amine represented by the formula (Q5) include morpholine. Examples of the amine represented by the formula (Q6) include piperidine and hindered amine compounds having a piperidine skeleton as disclosed in JP 11-52575 A. Examples of the amine represented by the formula (Q7) include 2,2'-methylenebisaniline. Examples of the amine represented by the formula (Q8) include imidazole and 4-methylimidazole. Examples of the amine represented by the formula (Q9) include pyridine and 4-methylpyridine. Examples of the amine represented by the formula (Q10) include di-2-pyridyl ketone, 1,2-di(2-pyridyl)ethane, 1,2-di(4-pyridyl)ethane, 1,3-di(4-pyridyl)propane, 1,2-bis(2-pyridyl)ethene, 1,2-bis(4-pyridyl)ethene, 1,2-di(4-pyridyloxy)ethane, 4,4'-dipyridyl sulfide, 4,4'-dipyridyl disulfide, 2,2'-dipyridylamine and 2,2'-dipicolylamine. Examples of the amine represented by the formula (Q11) include bipyridine.

When the basic compound is used, the total content of Compound (C1) and the basic compound is preferably 5 parts by weight or less per 100 parts by weight of the resin, and preferably 3 parts by weight or less. The total content of Compound (C1) and the basic compound is preferably 0.01 part by weight or more per 100 parts by weight of the resin, and preferably 0.05 parts by weight or more.

The photoresist compositions of the present invention usually contain one or more solvents. Examples of the solvent include a glycol ether ester such as ethyl cellosolve acetate, methyl cellosolve acetate and propylene glycol monomethyl ether acetate; a glycol ether such as propylene glycol monomethyl ether; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The amount of the solvent is usually 50% by weight or more, preferably 70% by weight or more, and especially preferably 90% by weight or more based on total amount of the photoresist composition of the present invention. The amount of the solvent is usually 99% by weight or less and preferably 97% by weight or less based on total amount of the photoresist composition of the present invention.

The photoresist compositions of the present invention can contain, if necessary, a small amount of various additives such as a sensitizer, a dissolution inhibitor, other polymers, a surfactant, a stabilizer and a dye as long as the effect of the present invention is not prevented.

The photoresist compositions of the present invention are useful for a chemically amplified photoresist composition.

A photoresist pattern can be produced by the following steps (1) to (5):

(1) a step of applying the photoresist composition of the present invention on a substrate, (2) a step of forming a photoresist film by conducting drying, (3) a step of exposing the photoresist film to radiation, (4) a step of baking the exposed photoresist film, and (5) a step of developing the baked photoresist film with an alkaline developer, thereby forming a photoresist pattern.

The applying of the photoresist composition on a substrate is usually conducted using a conventional apparatus such as spin coater. The photoresist composition is preferably filtrated with filter having 0.2 μm of a pore size before applying. Examples of the substrate include a silicon wafer or a quartz wafer on which a sensor, a circuit, a transistor or the like is formed.

The formation of the photoresist film is usually conducted using a heating apparatus such as hot plate or a decompressor, and the heating temperature is usually 50 to 200° C., and the operation pressure is usually 1 to $1.0*10^5$ Pa.

The photoresist film obtained is exposed to radiation using an exposure system. The exposure is usually conducted through a mask having a pattern corresponding to the desired photoresist pattern. Examples of the exposure source include a light source radiating laser light in a UV-region such as a KrF excimer laser (wavelength: 248 nm), an ArF excimer laser (wavelength: 193 nm) and a $F_2$ laser (wavelength: 157 nm), and a light source radiating harmonic laser light in a far UV region or a vacuum UV region by wavelength conversion of laser light from a solid laser light source (such as YAG or semiconductor laser).

The temperature of baking of the exposed photoresist film is usually 50 to 200° C., and preferably 70 to 150° C.

The development of the baked photoresist film is usually carried out using a development apparatus. The alkaline developer used may be any one of various alkaline aqueous solution used in the art. Generally, an aqueous solution of tetramethylammonium hydroxide or (2-hydroxyethyl)trimethylammoniumhydroxide (commonly known as "choline") is often used. After development, the photoresist pattern formed is preferably washed with ultrapure water, and the remained water on the photoresist pattern and the substrate is preferably removed.

The photoresist composition of the present invention provides a photoresist pattern showing good properties such as Line Width Roughness (LWR), and therefore, the photoresist composition of the present invention is suitable for ArF excimer laser lithography, KrF excimer laser lithography, ArF immersion lithography, EUV (extreme ultraviolet) lithography, EUV immersion lithography and EB (electron beam) lithography. Further, the photoresist composition of the present invention can especially be used for ArF immersion lithography, EUV lithography and EB lithography.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted. The weight-average molecular weight of any material used in the following examples is a value found by gel permeation chromatography [HLC-8120GPC Type, Column (Three Columns): TSKgel Multipore HXL-M, manufactured by TOSOH CORPORATION, Solvent: tetrahydrofuran] using standard polystyrene as a standard reference material. Structures of compounds were determined by NMR (GX-270 Type or EX-270 Type, manufactured by JEOL LTD.) and mass spectrometry (Liquid Chromatography: 1100 Type, manufactured by AGILENT TECHNOLOGIES LTD., Mass Spectrometry: LC/MSD Type or LC/MSD TOF Type, manufactured by AGILENT TECHNOLOGIES LTD.).

In Resin Synthesis Examples, Monomer (a1-1-1), Monomer (a1-1-2), Monomer (a1-2-1), Monomer (a2-1-1), Monomer (a2-1-2), Monomer (a3-1-1), Monomer (a3-2-1) and Monomer (S) represented by the followings were used.

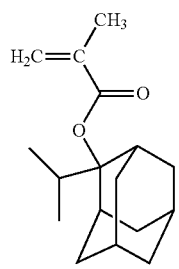

(a1-1-1)

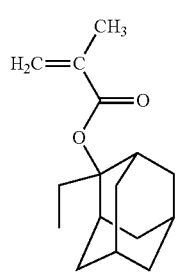

(a1-1-2)

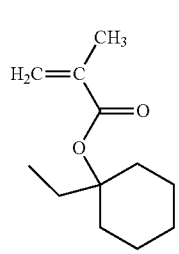

(a1-2-1)

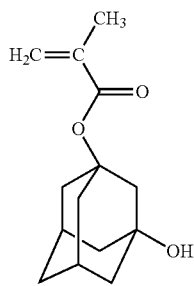

(a2-1-1)

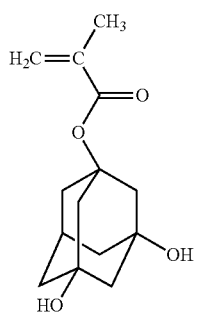

(a2-1-2)

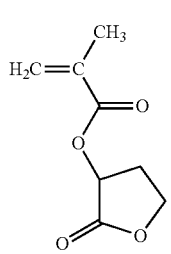

(a3-1-1)

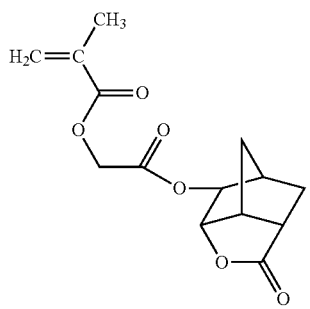

(a3-2-1)

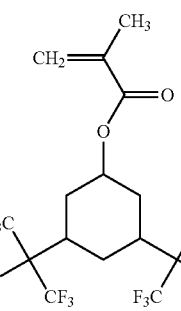

(s)

Resin Synthesis Example 1

Monomer (a1-1-1), Monomer (a1-2-1), Monomer (a2-1-2) and Monomer (a3-2-1) were mixed at a molar ratio of 40:10:10:40 (Monomer (a1-1-1):Monomer (a1-2-1):Monomer (a2-1-2):Monomer (a3-2-1)), and 1,4-dioxane in 1.2 times weight based on all monomers was added thereto, to prepare solution. To the solution, azobisisobutyronitrile as an initiator in a ratio of 1 mol % based on all monomer molar amount, and azobis (2,4-dimethylvaleronitrile) as an initiator in a ratio of 3 mol % based on all monomer molar amount were added. The obtained mixture was heated at 75° C. for about 5 hours. Then, the reaction solution was poured into large amount of a mixture of methanol and water to cause precipitation. The precipitate was isolated, and was poured into large amount of a mixture of methanol and water to purify the precipitation, and this operation was repeated three times for purification. As a result, a resin having a weight-average molecular weight of 7402 was obtained in a yield of 74%. This is called as Resin A1. Resin A1 had the structural units derived from Monomer (a1-1-1), Monomer (a1-2-1), Monomer (a2-1-2) and Monomer (a3-2-1).

Resin Synthesis Example 2

Monomer (a1-1-2), Monomer (a2-1-1) and Monomer (a3-1-1) were mixed at a molar ratio of 50:25:25 (Monomer (a1-1-2):Monomer (a2-1-1):Monomer (a3-1-1)), and 1,4-dioxane in 1.5 times weight based on all monomers was added thereto, to prepare solution. To the solution, azobisisobutyronitrile as an initiator in a ratio of 1 mol % based on all monomer molar amount, and azobis(2,4-dimethylvaleronitrile) as an initiator in a ratio of 3 mol % based on all monomer molar amount were added. The obtained mixture was heated at 77° C. for about 5 hours. Then, the reaction solution was poured into large amount of a mixture of methanol and water to cause precipitation. The precipitate was isolated, and was poured into large amount of a mixture of methanol and water to purify the precipitation, and this operation was repeated three times for purification. As a result, a resin having a weight-average molecular weight of 8112 was obtained in a yield of 55%. This is called as Resin A2. Resin A2 had the structural units derived from Monomer (a1-1-2), Monomer (a2-1-1) and Monomer (a3-1-1).

Resin Synthesis Example 3

Monomer (a1-1-2) and Monomer (a3-1-1) were mixed at a molar ratio of 55:45 (Monomer (a1-1-2):Monomer (a3-1-1)), and the polymerization reaction was conducted according to the method described in US 2003/0017415 A1 to obtain a resin having a weight-average molecular weight of 11000. This is called as Resin A3. Resin A3 had the structural units derived from Monomer (a1-1-2) and Monomer (a3-1-1).

Resin Synthesis Example 4

Monomer (a1-1-1), Monomer (a1-2-1), Monomer (a2-1-1), Monomer (a3-1-1) and Monomer (a3-2-1) were mixed at a molar ratio of 30:14:6:30:20 (Monomer (a1-1-1):Monomer (a1-2-1):Monomer (a2-1-1):Monomer (a3-1-1):Monomer (a3-2-1)), and 1,4-dioxane in 1.5 times weight based on all monomers was added thereto, to prepare solution. To the solution, azobisisobutyronitrile as an initiator in a ratio of 1 mol % based on all monomer molar amount, and azobis(2,4-dimethylvaleronitrile) as an initiator in a ratio of 3 mol % based on all monomer molar amount were added. The obtained mixture was heated at 73° C. for about 5 hours. Then, the reaction solution was poured into large amount of a mixture of methanol and water to cause precipitation. The precipitate was isolated, and was poured into large amount of a mixture of methanol and water to purify the precipitation, and this operation was repeated three times for purification. As a result, a resin having a weight-average molecular weight of 8100 was obtained in a yield of 65%. This is called as Resin A4. Resin A4 had the structural units derived from Monomer (a1-1-1), Monomer (a1-2-1), Monomer (a2-1-1), Monomer (a3-1-1) and Monomer (a3-2-1).

Resin Synthesis Example 5

Monomer (S) was mixed with 1,4-dioxane of which amount was twice weight based on the monomer. To the mixture, azobisisobutyronitrile as an initiator in a ratio of 1 mol % based on all monomer molar amount, and azobis (2,4-dimethylvaleronitrile) as an initiator in a ratio of 3 mol % based on all monomer molar amount were added. The obtained mixture was heated at 73° C. for about 5 hours. Then, the reaction solution was poured into a large amount of heptane to cause precipitation. The precipitate was isolated, and was poured into large amount of methanol to purify the precipitation, and this operation was repeated three times for purification. As a result, a resin having a weight-average molecular weight of about $2.2 \times 10^4$ was obtained in a yield of 95%. This is called as Resin S1. Resin S1 had the structural units derived from Monomer (S).

Reference Example 1

The following components were mixed to prepare a solution, and the solution was filtrated through a fluorine resin filter having pore diameter of 0.2 μm, to prepare Composition (1).

| | |
|---|---|
| Resin A4 | 10 parts |
| Compound C6 | 0.05 part |
| propylene glycol monomethyl ether acetate | 42 parts |
| propylene glycol monomethyl ether | 30 parts |
| 2-heptanone | 10 parts |
| γ-butyrolactone | 1.5 parts |

Herein, "Compound C6" is 5-(2-nitrobenzyl)-1,8-diazabicyclo[5.4.0]undecane, which is described in JP 2005-511536 A.

The following components were mixed to prepare a solution, and the solution was filtrated through a fluorine resin filter having pore diameter of 0.2 μm, to prepare Composition (2).

| | |
|---|---|
| Resin S1 | 10 parts |
| Acid (1) | 0.5 part |
| Isobutyl alcohol | 200 parts |

Acid (1) is represented by the following formula:

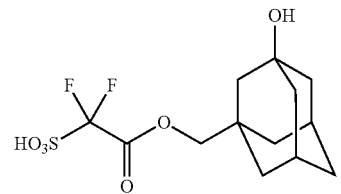 [SMILES: O=C(OCC12CC3CC(CC(O)(C3)C1)C2)C(F)(F)S(=O)(=O)O]

[1] Silicon wafer having a diameter of 12 inches was coated with Composition (1) so that the thickness of the resulting film became 300 nm after drying. The silicon wafer thus coated with Composition (1) was heated on a direct hotplate at 85° C. for 60 seconds to prepare the first film. The film thickness $d^1$ of the first film was measured with a contactless film thickness measurement "Lambda Ace" manufactured by DAINIPPON SCREEN MFG. CO. LTD.

[2] Composition (2) was spin-coated on the first film. The silicon wafer was heated on a direct hotplate at 85° C. for 60 seconds to prepare the second film on the first film.

[3] The first and second films on the silicon wafer obtained [2] was exposed with an ArF immersion excimer stepper ("XT-1900Gi" manufactured by ASML, NA=1.35, 3/4 Annular, X-Y deflection) at the exposure amount of 40 mJ/cm². The obtained wafer was subjected to the heating on a hotplate at 85° C. for 60 seconds and then to paddle development for 60 seconds with an aqueous solution of 2.38% tetramethylammonium hydroxide. The film thickness $d^a$ of the first film was measured with a contactless film thickness measurement "Lambda Ace" manufactured by DAINIPPON SCREEN MFG. CO. LTD.

[4] The first and second films on the silicon wafer obtained [2] was exposed with an ArF immersion excimer stepper ("XT-1900Gi" manufactured by ASML, NA=1.35, 3/4 Annular, X-Y deflection) at the exposure amount of 40 mJ/cm². The obtained wafer was subjected to paddle development for 60 seconds with an aqueous solution of 2.38% tetramethylammonium hydroxide. The film thickness $d^b$ of the first film was measured with a contactless film thickness measurement "Lambda Ace" manufactured by DAINIPPON SCREEN MFG. CO. LTD.

[5] The first and second films on the silicon wafer obtained [2] was heated on a hotplate at 85° C. for 60 seconds and then, was subjected to paddle development for 60 seconds with an aqueous solution of 2.38% tetramethylammonium hydroxide. The film thickness $d^c$ of the first film was measured with a contactless film thickness measurement "Lambda Ace" manufactured by DAINIPPON SCREEN MFG. CO. LTD.

[6] The first and second films on the silicon wafer obtained [2] was subjected to paddle development for 60 seconds with an aqueous solution of 2.38% tetramethylammonium hydroxide. The film thickness $d^d$ of the first film was measured with a contactless film thickness measurement "Lambda Ace" manufactured by DAINIPPON SCREEN MFG. CO. LTD.

$\Delta D^a$, $\Delta D^b$, $\Delta D^c$ and $\Delta D^d$ were calculated based on the film thickness $d^a$, $d^b$, $d^c$ and $d^d$, and the results are shown in Tables 1 to 3.

Reference Example 2

Composition (3) was prepared according to the same manner of Example 1 except that Compound C7 (5-(4-methoxycarbonylbenzyl)-1,8-diazabicyclo[5.4.0]undecane, which is described in WO 2008/119688 A) was used in place of Compound C6, and $\Delta D^a$, $\Delta D^b$, $\Delta D^c$ and $\Delta D^d$ were calculated based on the film thickness $d^1$, $d^a$, $d^c$ and $d^d$, and the results are shown in Tables 1 to 3.

Reference Example 3

Composition (4) was prepared according to the same manner of Example 1 except that Q1 (2,6-diisopropylaniline) was used in place of Compound C6, and $\Delta D^a$, $\Delta D^b$, $\Delta D^c$ and $\Delta D^d$ were calculated based on the film thickness $d^1$, $d^a$, $d^b$, $d^c$ and $d^d$, and the results are shown in Tables 1 to 3.

TABLE 1

| Ex. No. | Compound | $d^1$ | $d^a$ | $d^b$ | $d^c$ | $d^d$ |
|---|---|---|---|---|---|---|
| Ref. Ex. 1 | Compound C6 | 304.8 | 269.2 | 299.6 | 264.6 | 300.6 |
| Ref. Ex. 2 | Compound C7 | 304.6 | 268.1 | 297.3 | 262.5 | 299.8 |
| Ref. Ex. 3 | Q1 | 311.0 | 272.3 | 305.6 | 271.1 | 306.9 |

TABLE 2

| Ex. No. | Compound | $\Delta D^a$ | $\Delta D^b$ | $\Delta D^c$ | $\Delta D^d$ |
|---|---|---|---|---|---|
| Ref. Ex. 1 | Compound C6 | 35.6 | 5.2 | 40.2 | 4.2 |
| Ref. Ex. 2 | Compound C7 | 36.5 | 7.3 | 42.1 | 4.8 |
| Ref. Ex. 3 | Q1 | 38.7 | 5.4 | 39.9 | 4.1 |

TABLE 3

| Ex. No. | Compound | $\Delta D^a - \Delta D^b$ | $\Delta D^c - \Delta D^d$ |
|---|---|---|---|
| Ref. Ex. 1 | Compound C6 | 30.4 | 36.0 |
| Ref. Ex. 2 | Compound C7 | 29.2 | 37.3 |
| Ref. Ex. 3 | Q1 | 33.3 | 35.8 |

Examples 1 to 8, Comparative Examples 1 to 2 and Reference Examples 4 to 6

<Resin>

Resin A1, A2, A3, A4

<Acid Generator>

B1:

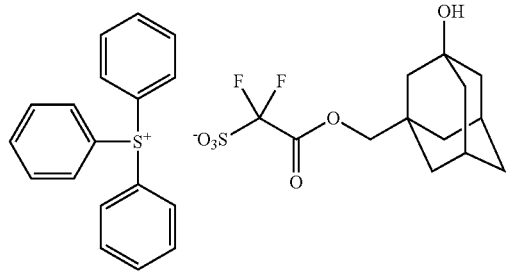

B2:

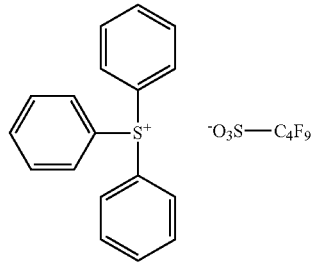

B3:

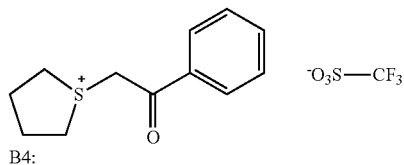

B4:

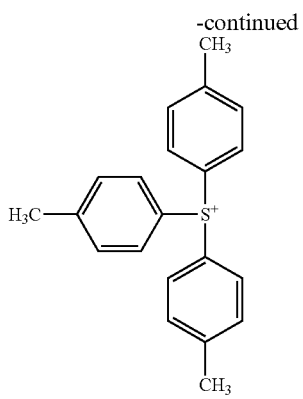

\<Compound (C1)\>

C1: 5-benzyl-1,5-diazabicyclo[4.3.0]nonane, which is described in JP 2005-511536 A C2: 5-(2-chlorobenzyl)-1,5-diazabicyclo[4.3.0]nonane, which is described in JP 2005-511536 A C3: 5-(4-methylbenzyl)-1,5-diazabicyclo[4.3.0]nonane, which is described in JP 2005-511536 A C4: 8-benzyl-1,8-diazabicyclo[5.4.0]undecane, which is described in JP 2005-511536 A C5: 8-(2-chlorobenzyl)-1,8-diazabicyclo[5.4.0]undecane, which is described in JP 2005-511536 A C6: 5-(2-nitrobenzyl)-1,8-diazabicyclo[5.4.0]undecane, which is described in JP 2005-511536 A C7: 5-(4-methoxycarbonylbenzyl)-1,8-diazabicyclo[5.4.0]undecane, which is described in WO 2008/119688 A \<Quencher\>

Q1: 2,6-diisopropylaniline
Q2: 1,5-diazabicyclo[4.3.0]non-5-ene
Q3: 1,8-diazabicyclo[5.4.0]undec-7-ene \<Solvent\>

| D1: | propylene glycol monomethyl ether acetate | 265 parts |
| | propylene glycol monomethyl ether | 20 parts |
| | 2-heptanone | 20 parts |
| | γ-butyrolactone | 3.5 parts |

The following components were mixed and dissolved, further, filtrated through a fluorine resin filter having pore diameter of 0.2 μm, to prepare photoresist compositions.

Resin (kind and amount are described in Table 4)
Acid generator (kind and amount are described in Table 4)
Compound (C1) (kind and amount are described in Table 4)
Quencher (kind and amount are described in Table 4)
Solvent D1

TABLE 4

| Ex. No. | Resin (kind/amount (part)) | Acid generator (kind/amount (part)) | Compound (Cl) (kind/amount (part)) | Quencher (kind/amount (part)) | PB (° C.) | PEB (° C.) |
| --- | --- | --- | --- | --- | --- | --- |
| Ex. 1 | A1/10 | B1/0.5 | C1/0.01 | — | 95 | 95 |
| Ex. 2 | A1/10 | B1/0.5 | C2/0.01 | — | 95 | 95 |
| Ex. 3 | A1/10 | B1/0.5 | C3/0.01 | — | 95 | 95 |
| Ex. 4 | A1/10 | B1/0.5 | C4/0.01 | — | 95 | 95 |
| Ex. 5 | A1/10 | B1/0.5 | C5/0.01 | — | 95 | 95 |
| Ex. 6 | A1/10 | B1/0.5 | C3/0.01 | Q1/0.06 | 95 | 95 |
| Ex. 7 | A4/10 | B4/1.5 | C6/0.05 | — | 85 | 85 |
| Ex. 8 | A4/10 | B4/1.5 | C7/0.05 | — | 85 | 85 |
| Comp. Ex. 1 | A2/10 | B1/0.27 | — | Q1/0.0325 | 130 | 130 |
| Comp. Ex. 2 | A3/10 | B2/0.1 B3/0.5 | — | Q2/0.02 | 140 | 140 |
| Ref. Ex. 4 | A1/10 | B1/0.5 | — | Q1/0.07 | 95 | 95 |
| Ref. Ex. 5 | A1/10 | B1/0.5 | — | Q3/0.01 | 95 | 95 |
| Ref. Ex. 6 | A1/10 | B1/0.5 | — | Q2/0.01 | 95 | 95 |

Silicon wafers having a diameter of 12 inches were each coated with "ARC-29", which is an organic anti-reflective coating composition available from Nissan Chemical Industries, Ltd., and then baked under the conditions of 205° C. and 60 seconds, to form a 780 Å-thick organic anti-reflective coating. Each of the photoresist compositions prepared as above was spin-coated over the anti-reflective coating so that the thickness of the resulting film became 85 nm after drying. The silicon wafers thus coated with the respective photoresist compositions were each prebaked on a direct hotplate at a temperature shown in column of "PB" of Table 4 for 60 seconds. Using an ArF immersion excimer stepper ("XT-1900Gi" manufactured by ASML, NA=1.35), each wafer thus formed with the respective photoresist film was subjected to contact hole pattern immersion exposure using photomasks for forming a contact hole pattern having a hole pitch of 100 nm and a hole diameters of 40 to 72 nm, with the exposure quantity being varied stepwise.

After the exposure, each wafer was subjected to post-exposure baking on a hotplate at a temperature shown in column of "PEB" of Table 4 for 60 seconds and then to paddle development for 60 seconds with an aqueous solution of 2.38% tetramethylammonium hydroxide.

Each of contact hole patterns developed on the organic anti-reflective coating substrate after the development was observed with a scanning electron microscope, the results of which are shown in Tables 5.

Effective Sensitivity (ES): It is expressed as the amount of exposure that the hole diameter of the contact hole pattern become 55 nm after exposure through a photomask for forming a contact hole pattern having a hole diameters of 70 nm and development.

CD uniformity (CDU): The photoresist patterns were obtained using a photomask for forming a hole pattern having a hole diameter of 70 nm at the exposure amount of ES. Each of patterns developed on the organic anti-reflective coating substrate after the development was observed with a scanning electron microscope. The hole diameter of the hole patterns was twenty four times measured and its average diameter was calculated. The average diameters of four hundred holes on the same wafer were respectively measured. When population was the average diameters of four hundred holes, the standard deviation was calculated. When the standard deviation is 1.80 nm or more and 2.00 nm or less, CDU is normal and its evaluation is marked by "Δ", when the standard deviation is less than 1.80 nm, CDU is good and its evaluation is marked by "○", and when the standard deviation is more than 2.00 nm, CDU is bad and its evaluation is marked by "X". The smaller the standard deviation is, the better CDU the photoresist pattern shows.

Focus margin (DOF): The photoresist patterns were obtained using a hole-patterned photomask at the exposure amount of ES, with the focal point distance being varied stepwise. Each of patterns developed on the organic anti-reflective coating substrate after the development were observed and the focal point distances when the patterns of which hole diameter was 52.2 nm or more and 57.7 nm or less were measured and the difference between the max value of the focal point distance and the minimum value of the focal point distance was calculated. When the difference is 0.16 μm or more and 0.20 μm or less, DOF is normal and its evaluation is marked by "Δ", when the difference is more than 0.20 μm, DOF is good and its evaluation is marked by "○", and when the difference is less than 0.16 μm, DOF is bad and its evaluation is marked by "X". The difference is bigger, the better focus margin the photoresist composition has.

Mask Error Enhancement Factor (MEEF): Hole diameters of each hole patterns exposed at ES using photomasks for forming a hole pattern having pitch of 100 nm and hole diameter of 67 to 72 nm with 1 nm increments in between and developed were measured. A graph wherein the hole diameter of used photomask is a vertical axis and the hole diameter of the obtained hole patterns is a horizontal axis was made and the straight line was drawn. MEEF was expressed as the value of the slope of the straight line. When the value of the slope was 2.8 or more and 3.1 or less, MEEF is normal and its evaluation is marked by "Δ", when the value of the slope was less than 2.8, MEEF is good and its evaluation is marked by "○", and when the value of the slope was more than 3.1, MEEF is bad and its evaluation is marked by "X". The closer the value of the slope is to 1, the better MEEF is.

Pattern Shape: The hole pattern obtained by using the photomask for forming a hole pattern of which hole diameter is 70 nm was observed with a scanning electron microscope, and when a cross-section of the pattern is as shown in the following (a), pattern profile is good and its evaluation is marked by "○", when a cross-section of the pattern is as shown in the following (b), (c) or (d), pattern profile is bad, and its evaluation is marked by "X".

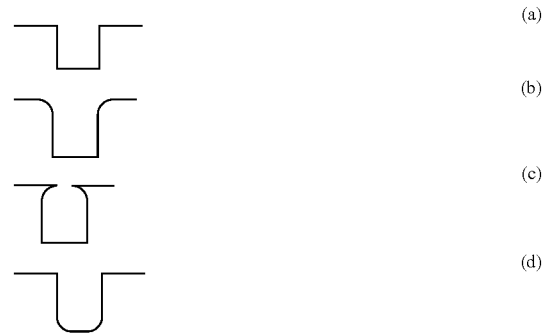

Silicon wafers having a diameter of 12 inches were each coated with "ARC-29", which is an organic anti-reflective coating composition available from Nissan Chemical Industries, Ltd., and then baked under the conditions of 205° C. and 60 seconds, to form a 780 Å-thick organic anti-reflective coating. Each of the photoresist compositions prepared as above was spin-coated over the anti-reflective coating so that the thickness of the resulting film became 85 nm after drying. The silicon wafers thus coated with the respective photoresist compositions were each prebaked on a direct hotplate at a temperature shown in column of "PB" of Table 4 for 60 seconds. Using an ArF immersion excimer stepper ("XT-1900Gi" manufactured by ASML, NA=1.35, 3/4 Annular, X-Y deflection), each wafer thus formed with the respective photoresist film was subjected to line and space pattern immersion exposure, with the exposure quantity being varied stepwise.

After the exposure, each wafer was subjected to post-exposure baking on a hotplate at a temperature shown in column of "PEB" of Table 4 for 60 seconds and then to paddle development for 60 seconds with an aqueous solution of 2.38% tetramethylammonium hydroxide.

Each of line and space patterns developed on the organic anti-reflective coating substrate after the development was observed with a scanning electron microscope, the results of which are shown in Tables 5.

Effective Sensitivity (ES): It was expressed as the amount of exposure that the line and space pattern of 50 nm became 1:1 after exposure through line and space pattern mask and development.

Resolution: The line and space patterns were obtained using a line and space photomask at the exposure amount of ES, and were observed with a scanning electron microscope. When 45 nm line and space pattern was resolved, resolution is good and its evaluation is marked by "○", and when 45 nm line and space pattern was not resolved, resolution is bad and its evaluation is marked by "X".

Line Edge Roughness (LER): The photoresist pattern at the exposure dose that the line pattern and the space pattern become 1:1 after exposure through 50 nm line and space pattern mask and development was observed with a scanning electron microscope. The difference between the height of the highest point and height of the lowest point of the scabrous wall surface of the photoresist pattern was measured. When the difference is 5 nm or less, LER is good and its evaluation is marked by "○", and when the difference is more than 5 nm, LER is bad and its evaluation is marked by "X". The smaller the difference is, the better the pattern is.

TABLE 5

| Ex. No. | ES (mJ/cm²) | CDU | DOF | MEEF | Shape | Resolution | LER |
|---|---|---|---|---|---|---|---|
| Ex. 1 | 34 | ○ | ○ | ○ | ○ | ○ | ○ |
| Ex. 2 | 30 | ○ | ○ | ○ | ○ | ○ | ○ |
| Ex. 3 | 32 | ○ | ○ | ○ | ○ | ○ | ○ |
| Ex. 4 | 35 | ○ | ○ | ○ | ○ | ○ | ○ |
| Ex. 5 | 32 | ○ | ○ | ○ | ○ | ○ | ○ |
| Ex. 6 | 39 | ○ | ○ | ○ | ○ | ○ | ○ |
| Ex. 7 | 39 | ○ | ○ | ○ | ○ | ○ | ○ |
| Ex. 8 | 37 | ○ | ○ | ○ | ○ | ○ | ○ |
| Comp. Ex. 1 | 42 | X | X | X | X | X | X |
| Comp. Ex. 2 | 34 | X | Δ | X | X | X | X |
| Ref. Ex. 4 | 33 | Δ | Δ | Δ | X | ○ | ○ |
| Ref. Ex. 5 | 38 | ○ | ○ | ○ | X | ○ | X |
| Ref. Ex. 6 | 36 | ○ | ○ | ○ | X | ○ | X |

The photoresist composition of the present invention provides a good photoresist pattern having good shape and good profiles such as CDU, DOF, MEEF and LER.

What is claimed is:

1. A photoresist composition comprising a resin, an acid generator and a compound represented by the formula (C1):

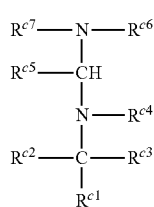

(C1)

wherein $R^{c1}$ represents an aromatic group which can have one or more substituents, $R^{c2}$ and $R^{c3}$ independently each represent a hydrogen atom, an aliphatic hydrocarbon group which can have one or more substituents or an aromatic group which can have one or more substituents, $R^{c4}$ and $R^{c6}$ independently each represent a hydrogen atom or an aliphatic hydrocarbon group which can have one or more substituents, or $R^{c4}$ and $R^{c6}$ are bonded to each other to form an alkanediyl group, $R^{c5}$ represents an aliphatic hydrocarbon group which can have one or more substituents or an amino group which can have one or two substituents, $R^{c7}$ represents a hydrogen atom or an aliphatic hydrocarbon group which can have one or more substituents, or $R^{c5}$ and $R^{c7}$ are bonded to each other to form an alkanediyl group, said resin becoming soluble in alkali aqueous solution by the action of an acid, and said acid generator containing one or more fluorine atoms.

2. The photoresist composition according to claim 1, wherein the compound (C1) is a compound represented by the formula (C1-1):

(C1-1)

wherein $R^{c1}$ is the same as defined in claim 1, and $R^{c8}$ and $R^{c9}$ independently each represent a C1-C18 alkanediyl group which can have one or more substituents.

3. The photoresist composition according to claim 2, wherein the compound represented by the formula (C1-1) is a compound represented by the formula (C1-1-1) or (C1-1-2):

(C1-1-1)

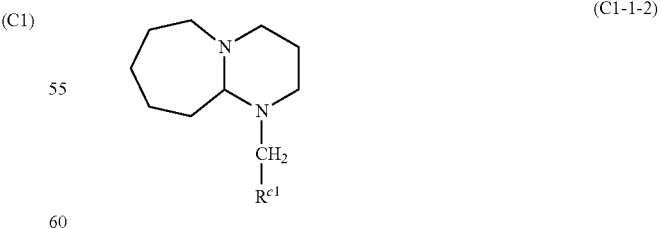

(C1-1-2)

wherein $R^{c1}$ represents an aromatic groups which can have one or more substituents.

4. The photoresist composition according to claim 1, wherein the content of the compound represented by the formula (C1) is 0.01 to 5 parts by weight per 100 parts by weight of the resin in the photoresist composition.

5. The photoresist composition according to claim 1, wherein the acid generator is a salt represented by the formula (B1):

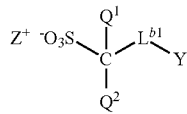
(B1)

wherein $Q^1$ and $Q^2$ each independently represent a fluorine atom or a C1-C6 perfluoroalkyl group, $L^{b1}$ represents a single bond or a C1-C17 divalent saturated hydrocarbon group in which one or more —$CH_2$— can be replaced by —O— or —CO—, Y represents a C1-C18 aliphatic hydrocarbon group which can have one or more substituents, or a C3-C18 saturated cyclic hydrocarbon group which can have one or more substituents, and one or more —$CH_2$— in the aliphatic hydrocarbon group and the saturated cyclic hydrocarbon group can be replaced by —O—, —CO— or —$SO_2$—, and $Z^+$ represents an organic cation.

6. The photoresist composition according to claim 5, wherein $Z^+$ is a triarylsulfonium cation.

7. The photoresist composition according to claim 5, wherein is an adamantyl group which can have one or more substituents or an oxoadamantyl group which can have one or more substituents.

8. The photoresist composition according to claim 1, wherein the content of the acid generator in the photoresist composition is 1 to 20 parts by weight per 100 parts by weight of the resin.

9. The photoresist composition according to claim 1 which further contains 2,6-diisopropylaniline.

10. A process for producing a photoresist pattern comprising the following steps (1) to (5):
(1) a step of applying the photoresist composition according to claim 1 on a substrate,
(2) a step of forming a photoresist film by conducting drying,
(3) a step of exposing the photoresist film to radiation,
(4) a step of baking the exposed photoresist film, and
(5) a step of developing the baked photoresist film with an alkaline developer, thereby forming a photoresist pattern.

* * * * *